(12) United States Patent
Inokuchi et al.

(10) Patent No.: US 11,017,827 B2
(45) Date of Patent: May 25, 2021

(54) MAGNETIC DEVICE STORING FIRST AND SECOND VALUES

(71) Applicant: Kabushiki Kaisha Toshiba, Tokyo (JP)

(72) Inventors: Tomoaki Inokuchi, Yokohama Kanagawa (JP); Naoharu Shimomura, Tokyo (JP); Katsuhiko Koui, Yokohama Kanagawa (JP); Yuuzo Kamiguchi, Yokohama Kanagawa (JP); Kazutaka Ikegami, Tokyo (JP); Shinobu Fujita, Tokyo (JP); Hiroaki Yoda, Kawasaki Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 16/132,991

(22) Filed: Sep. 17, 2018

(65) Prior Publication Data

US 2019/0295619 A1    Sep. 26, 2019

(30) Foreign Application Priority Data

Mar. 20, 2018    (JP) .............................. JP2018-053007

(51) Int. Cl.
*G11C 11/16*    (2006.01)
*H01L 43/06*    (2006.01)
(Continued)

(52) U.S. Cl.
CPC ........ *G11C 11/161* (2013.01); *G11C 11/1655* (2013.01); *G11C 11/1657* (2013.01);
(Continued)

(58) Field of Classification Search
CPC .............. G11C 11/161; G11C 11/1673; G11C 11/1657; G11C 11/1655; G11C 11/1675;
(Continued)

(56) References Cited

U.S. PATENT DOCUMENTS 9,230,627 B2 *    1/2016  Wu ........................ G11C 11/161
9,240,799 B1 *    1/2016  Wang .................... H03M 1/142
(Continued)

FOREIGN PATENT DOCUMENTS

JP         2014-45196 A     3/2014
JP         2017-510016 A    4/2017
(Continued)

OTHER PUBLICATIONS

L. Liu, et al., "Spin-Torque Switching with Giant Spin Hall Effect of Tantalum," Science, vol. 336(6081), pp. 555-558 (May 4, 2012).

*Primary Examiner* — Jerome Leboeuf
(74) *Attorney, Agent, or Firm* — Finnegan, Henderson, Farabow, Garrett & Dunner L.L.P.

(57) ABSTRACT

A magnetic device includes: a first conductive layer; a first magnetoresistive effect element disposed on the first conductive layer and including a first control terminal; and a first circuit configured to supply a first current in a first direction into the first conductive layer and apply a first control voltage to the first control terminal of the first magnetoresistive effect element, wherein in a case in which the first current is supplied to the first conductive layer, the first magnetoresistive effect element holds a value corresponding to a logical disjunction between a first value of first data in the first magnetoresistive effect element and a second value of the first control voltage corresponding to second data.

3 Claims, 47 Drawing Sheets

(51) Int. Cl.
  *H01L 43/08* (2006.01)
  *H01L 43/10* (2006.01)
  *H01L 27/22* (2006.01)

(52) U.S. Cl.
  CPC ...... *G11C 11/1673* (2013.01); *G11C 11/1675* (2013.01); *H01L 27/22* (2013.01); *H01L 43/06* (2013.01); *H01L 43/08* (2013.01); *H01L 43/10* (2013.01)

(58) Field of Classification Search
  CPC ......... H01L 27/22; H01L 43/10; H01L 43/08; H01L 43/06
  See application file for complete search history.

(56) References Cited

U.S. PATENT DOCUMENTS

| | | |
|---|---|---|
| 2014/0056060 A1 | 2/2014 | Khvalkovskiy et al. |
| 2015/0145576 A1 | 5/2015 | Wu et al. |
| 2015/0213868 A1 | 7/2015 | Wu et al. |
| 2017/0077392 A1 | 3/2017 | Han et al. |
| 2019/0051815 A1* | 2/2019 | Kakinuma ............ G11C 11/161 |
| 2019/0305216 A1* | 10/2019 | Gosavi .................. H01L 27/222 |
| 2019/0312086 A1* | 10/2019 | Manipatruni ....... H01F 10/3268 |

FOREIGN PATENT DOCUMENTS

| | | |
|---|---|---|
| JP | 2017-112351 A | 6/2017 |
| JP | 2018-107626 A | 7/2018 |

\* cited by examiner

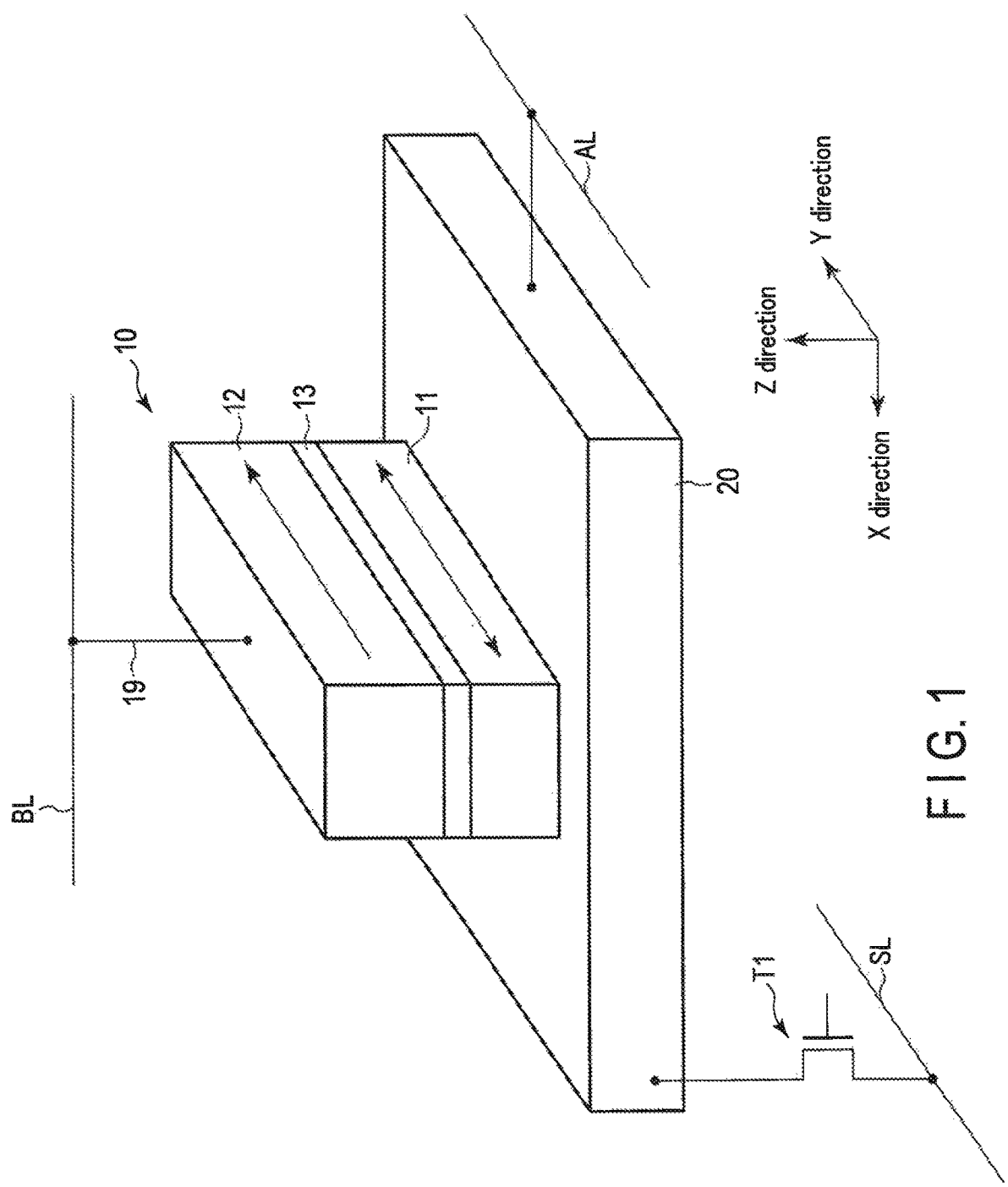
F I G. 1

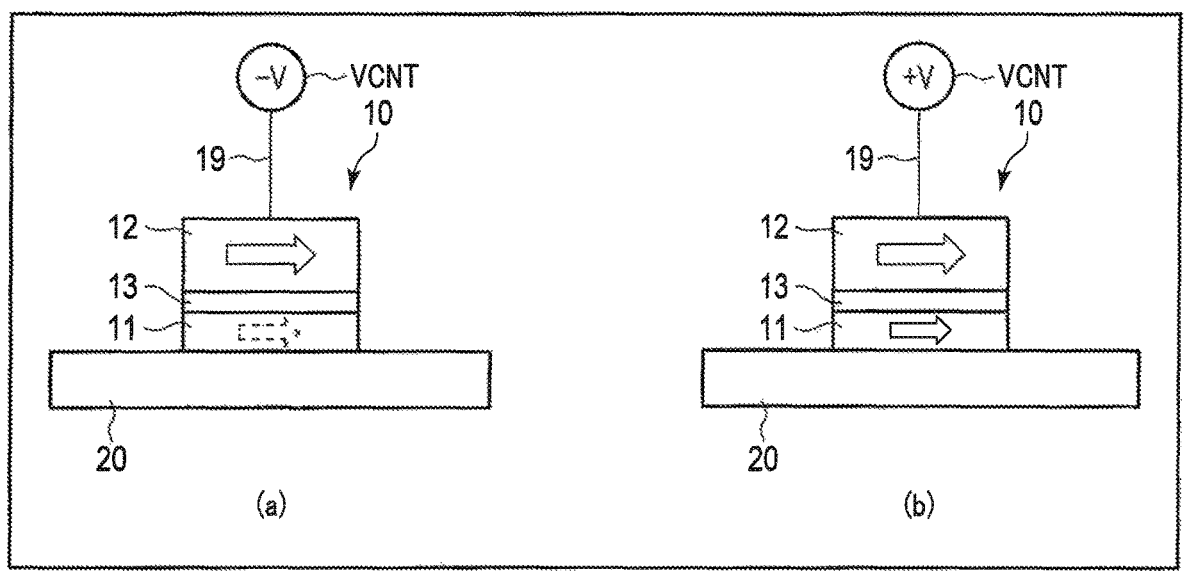
F I G. 4

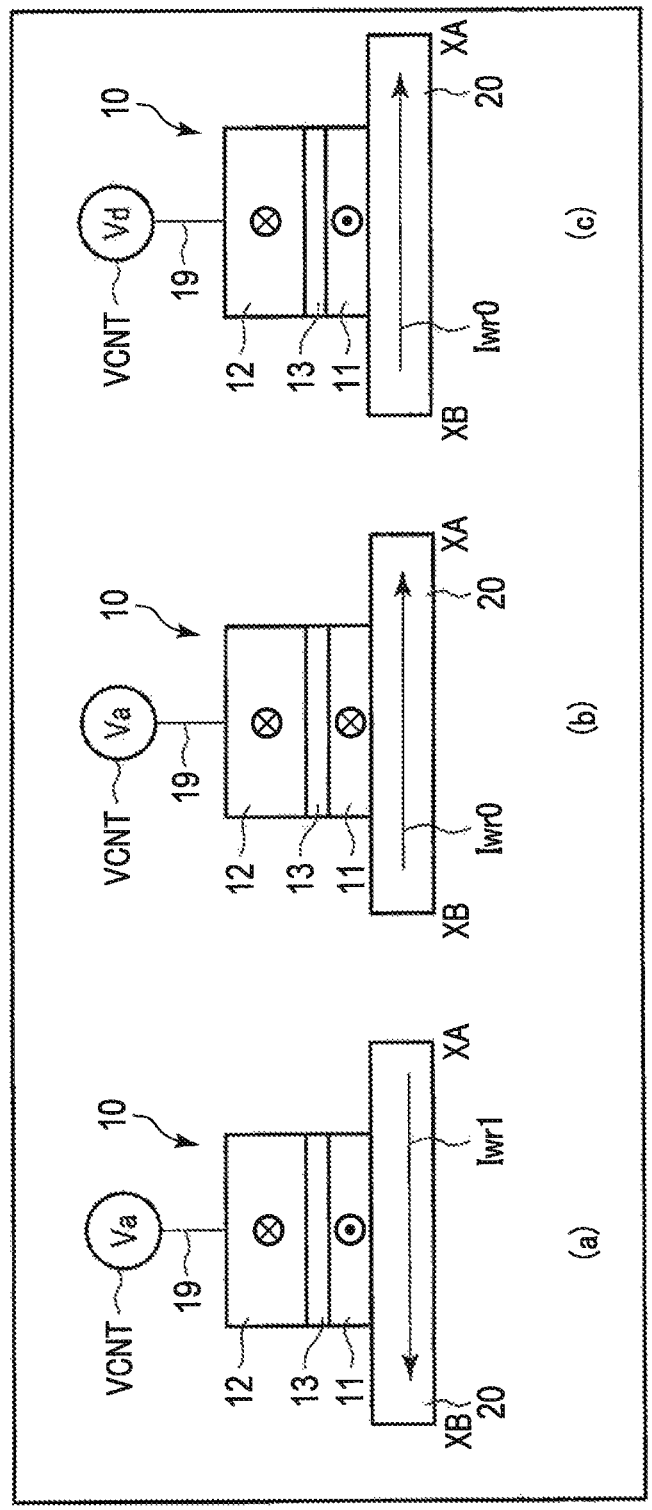
F I G. 5

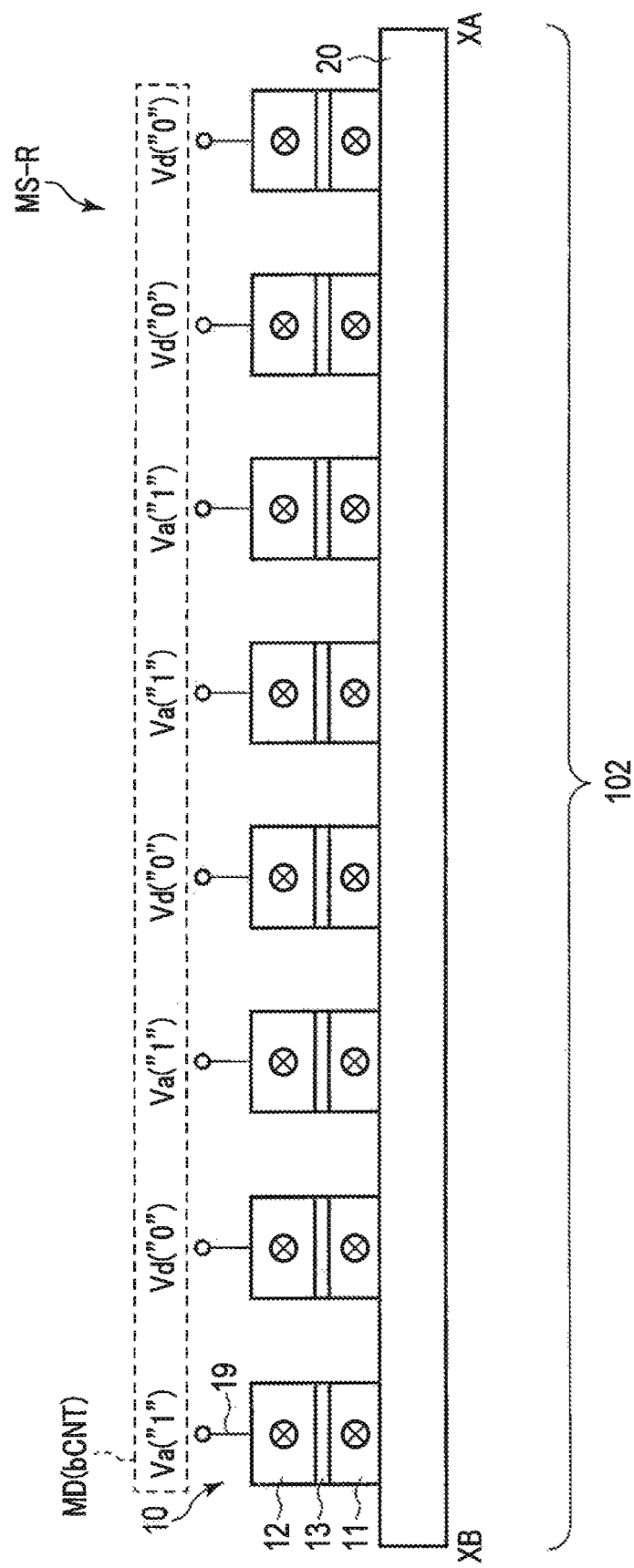
F I G. 15

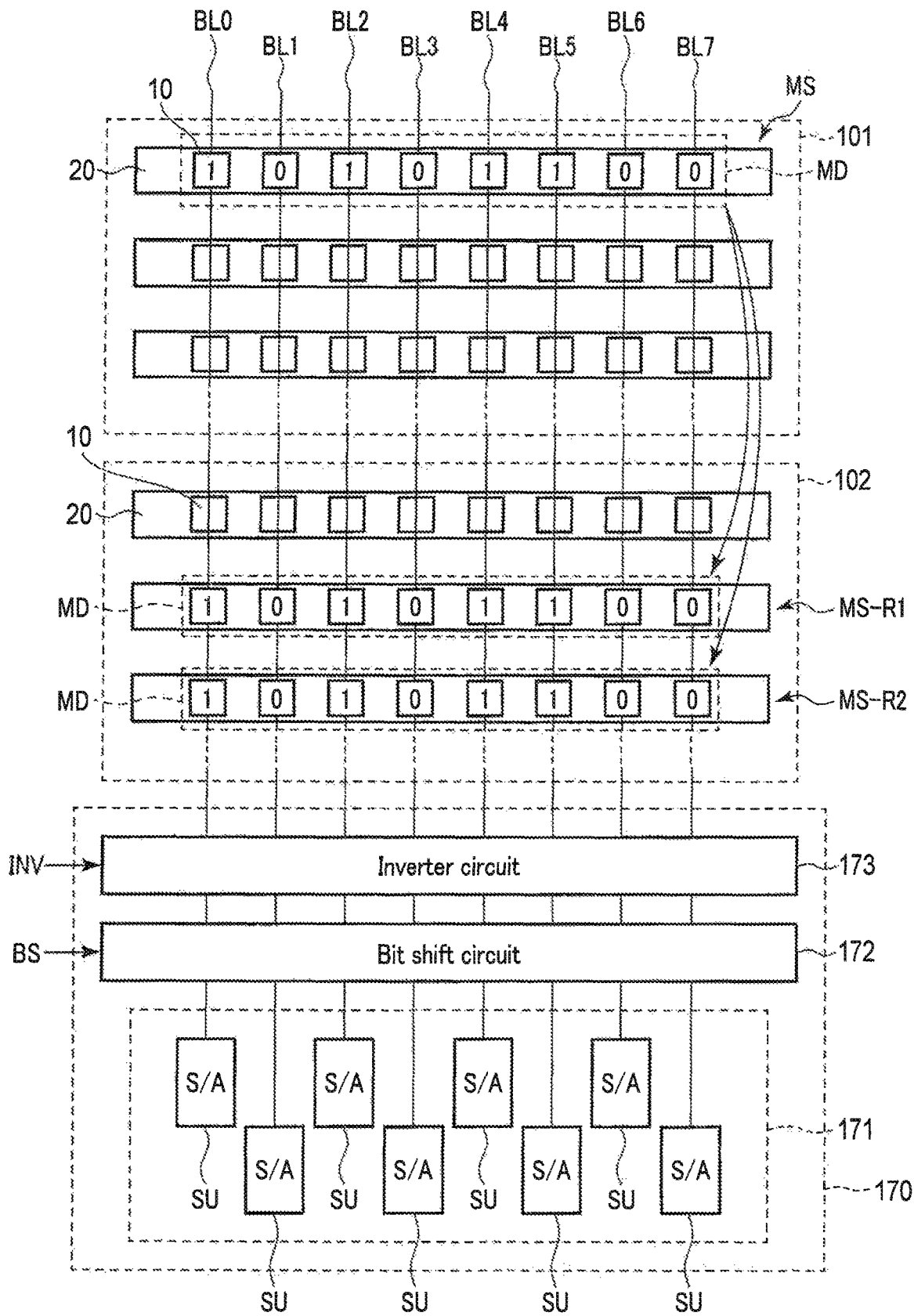
F I G. 22

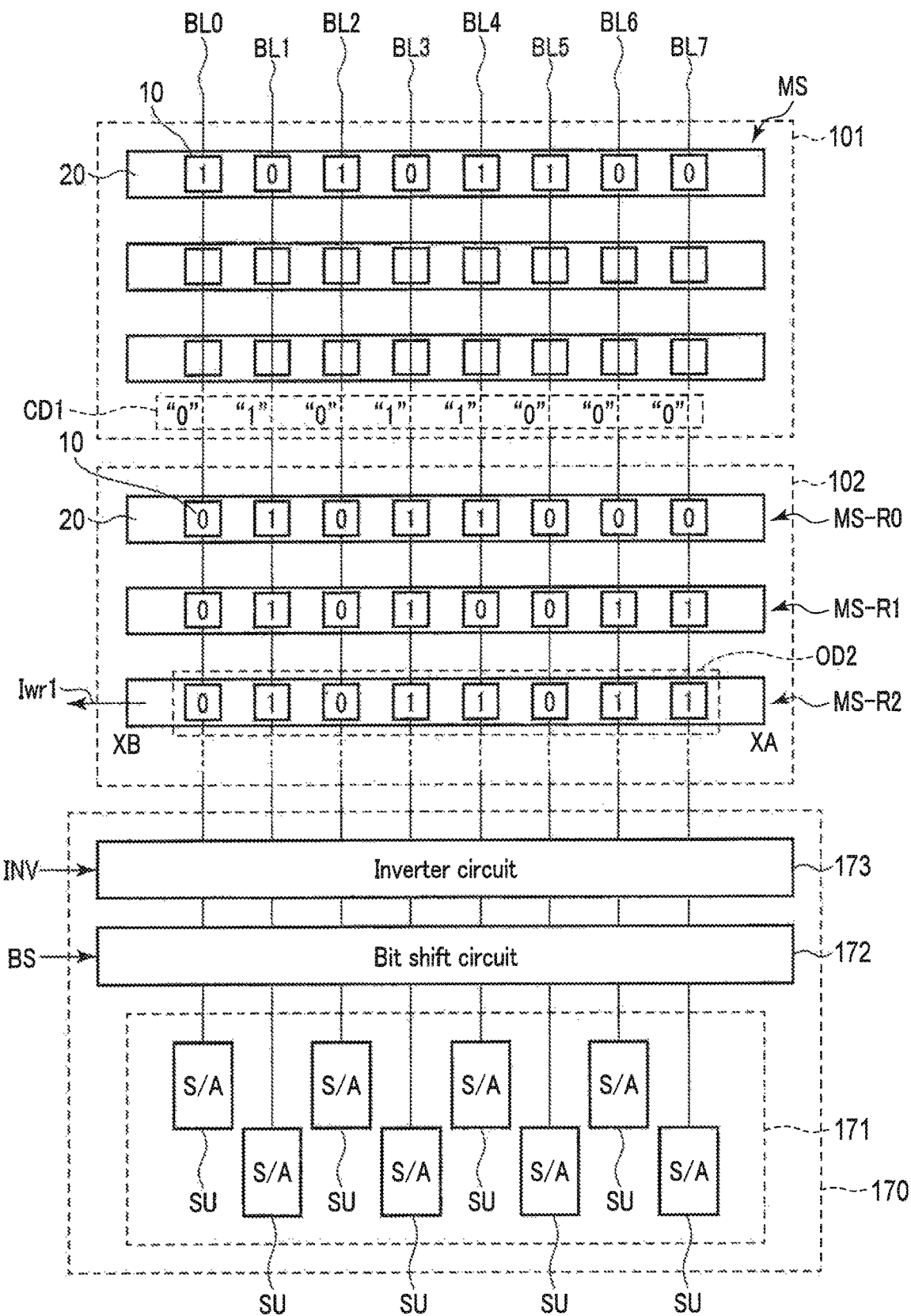
F I G. 32

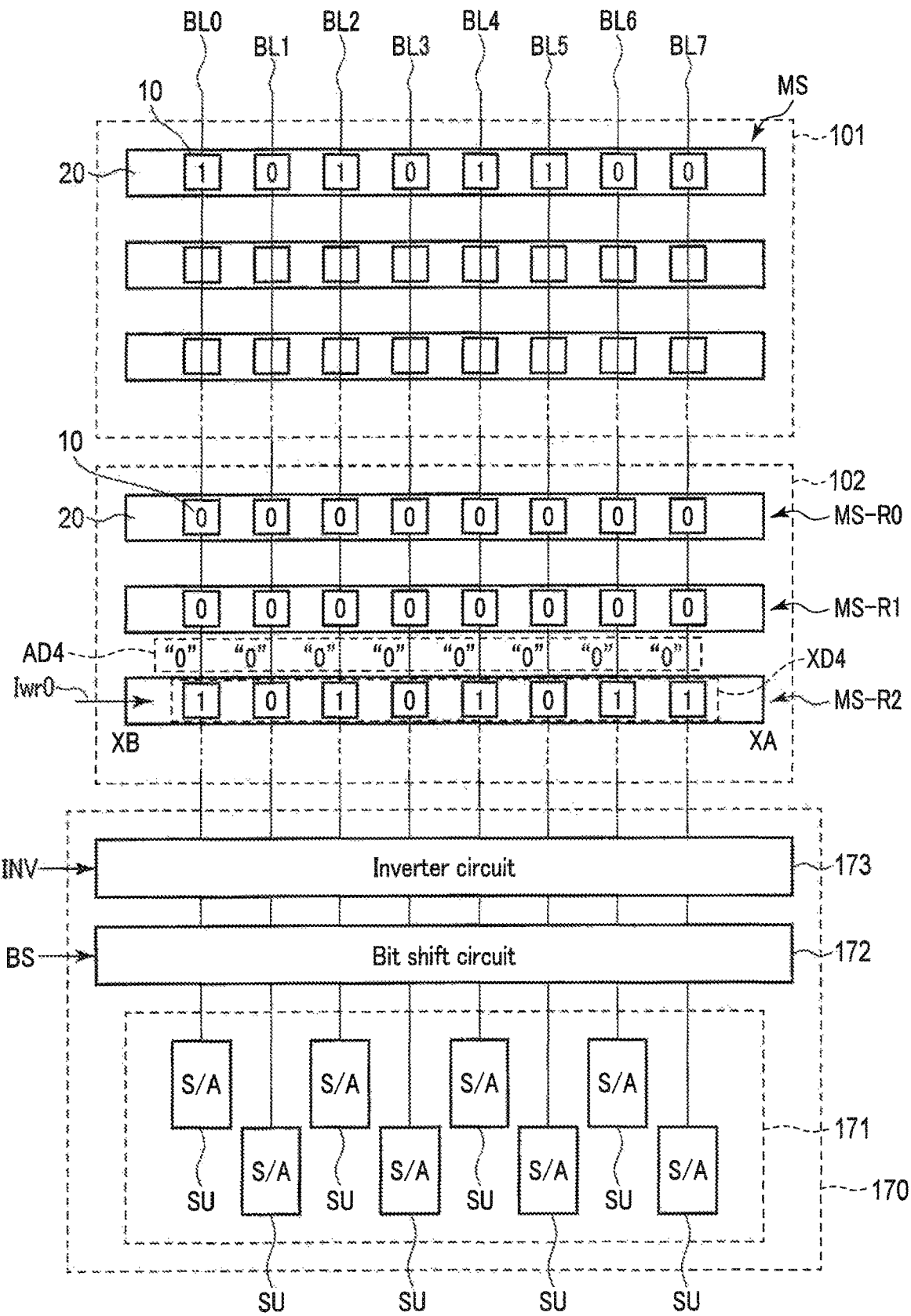
F I G. 44

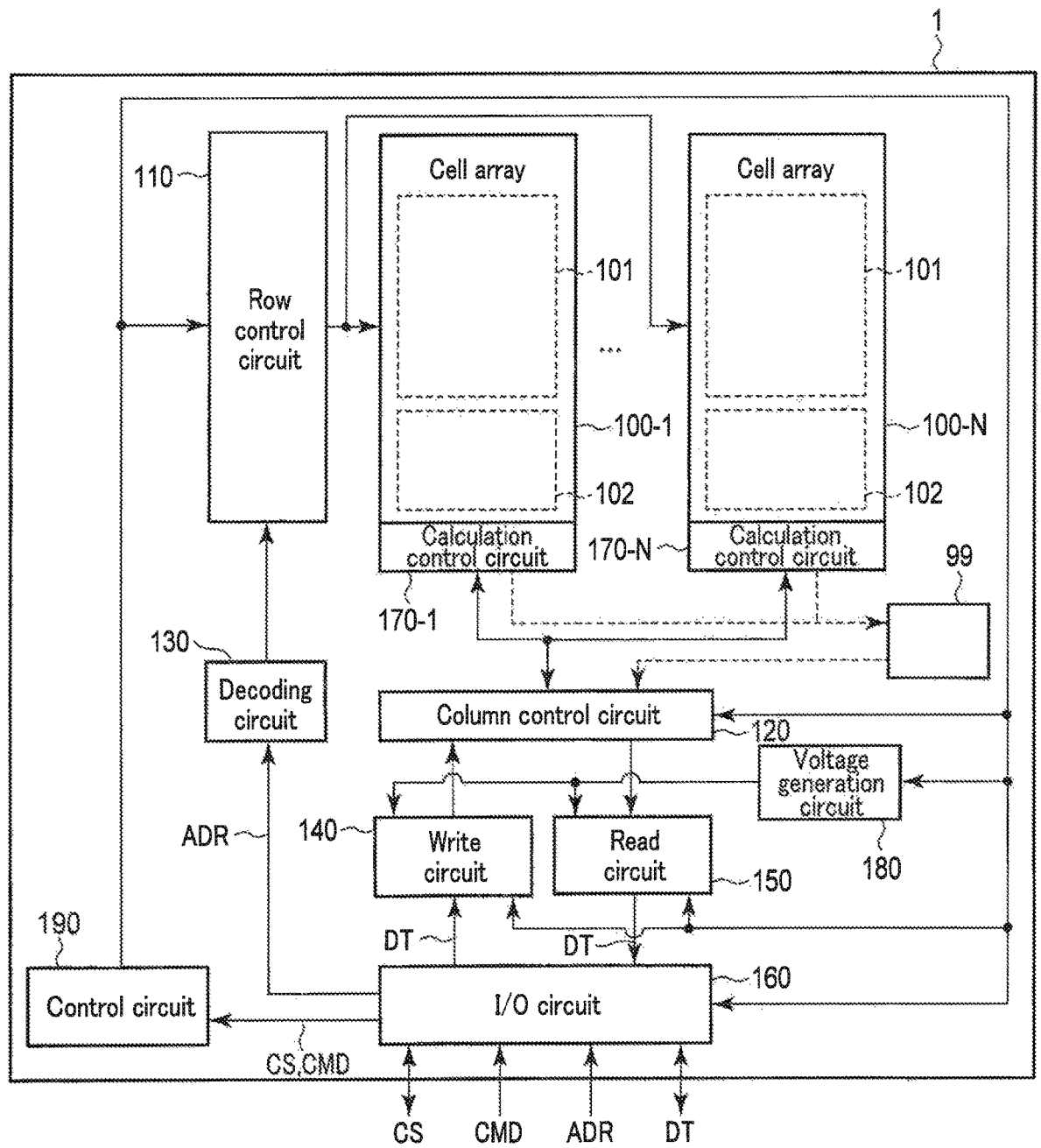
F I G. 45

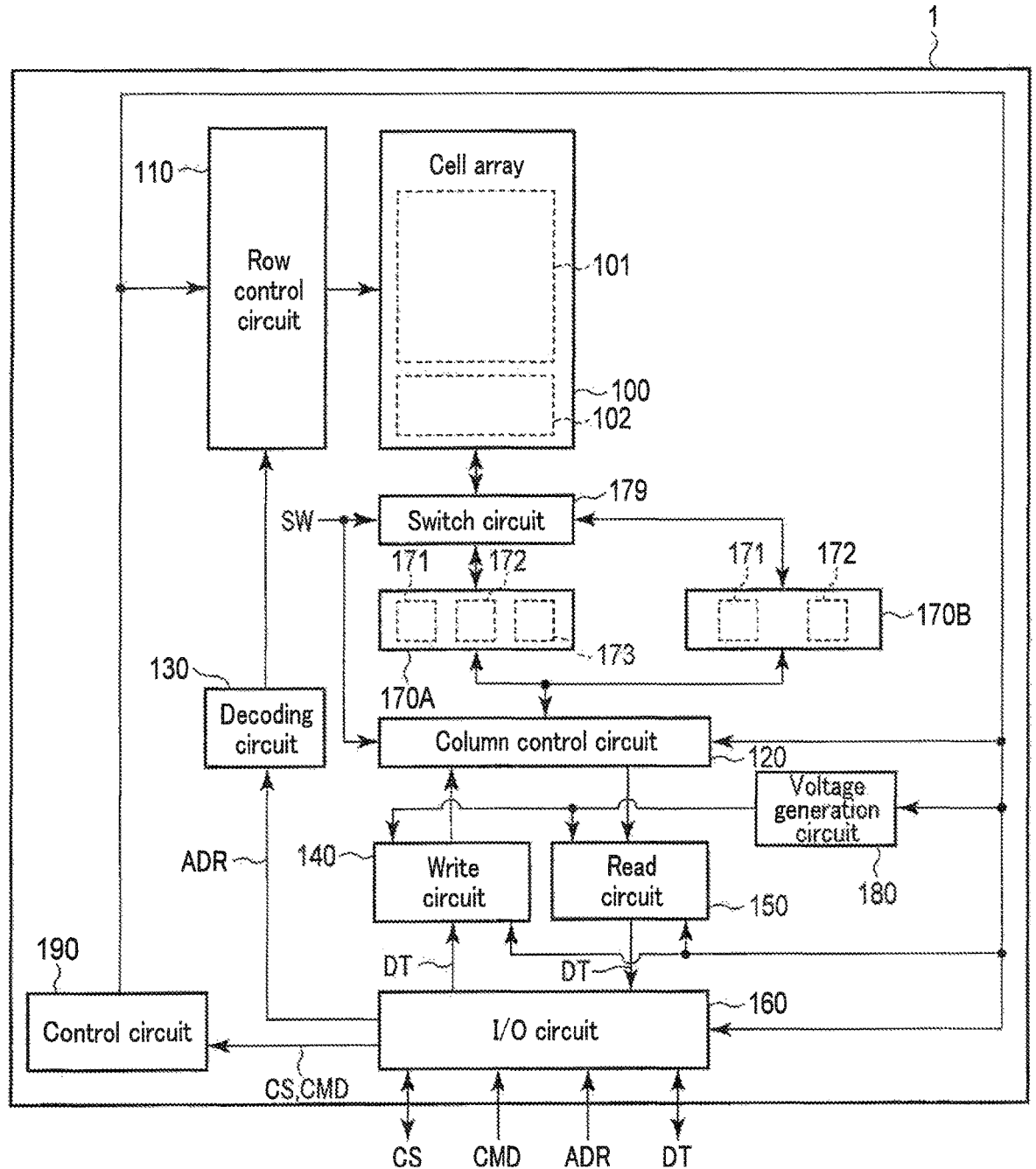
F I G. 47

MAGNETIC DEVICE STORING FIRST AND SECOND VALUES

CROSS-REFERENCE TO RELATED APPLICATIONS

This application is based upon and claims the benefit of priority from Japanese Patent Application No. 2018-053007, filed Mar. 20, 2018, the entire contents of which are incorporated herein by reference.

FIELD

Embodiments described herein relate generally to a magnetic device.

BACKGROUND

A magnetic device using a magnetoresistive effect element is under development and study.

BRIEF DESCRIPTION OF THE DRAWINGS

FIGS. 1 and 2 are block diagrams showing a configuration example of a magnetic device according to an embodiment;

FIG. 4 shows equivalent circuit diagrams showing a configuration example of the magnetic device according to the embodiment;

FIGS. 5, 6, 7, and 8 are views for explaining the operation principle of the magnetic device according to the embodiment; and FIGS. 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, and 48 are views for explaining modifications of the magnetic device according to the embodiment.

DETAILED DESCRIPTION

Figure 2:
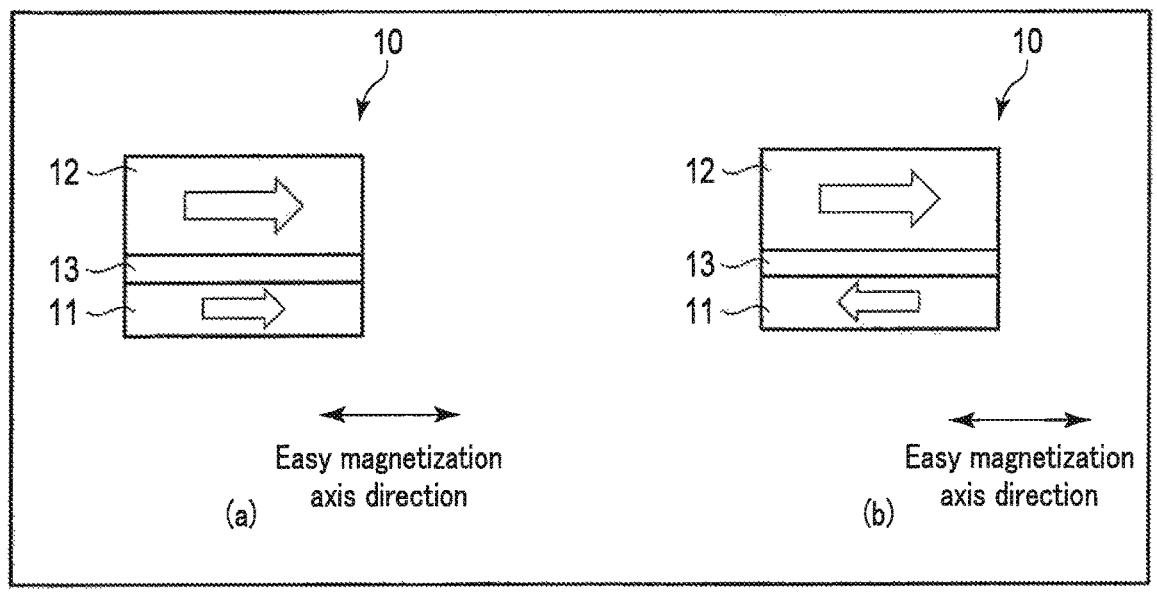

A magnetic device according to an embodiment will be described with reference to FIGS. 1, 2, 3, 4, 5, 6, 7, 8, 9, 10, 11, 12, 13, 14, 15, 16, 17, 18, 19, 20, 21, 22, 23, 24, 25, 26, 27, 28; 29, 30, 31, 32, 33, 34, 35, 36, 38, 39, 40, 41, 42, 43, 44, 45, 46, 47, and 48.

This embodiment will now be described with reference to the accompanying drawings. In the description below, the same reference numerals denote elements having the same functions and configurations.

Additionally, in the following embodiments, when constituents (such as word lines WL, bit lines BL, and various voltages and signals) having numerals/letters added at ends of reference numerals for differentiation are not distinguished from each other, an expression (reference numeral) in which the last number/letter is omitted is used.

In general, according to one embodiment, a magnetic device includes: a first conductive layer; a first magnetoresistive effect element disposed on the first conductive layer and including a first control terminal; and a first circuit configured to supply a first current in a first direction into the first conductive layer and apply a first control voltage to the first control terminal of the first magnetoresistive effect element, wherein in a case in which the first current is supplied to the first conductive layer, the first magnetoresistive effect element holds a value corresponding to a logical disjunction between a first value of first data in the first magnetoresistive effect element and a second value of the first control voltage corresponding to second data.

Embodiment

A magnetic device according to an embodiment will be described with reference to FIGS. 1 to 44.

(1) Basic Configuration

FIG. 1 is a schematic view for explaining the magnetic device according to this embodiment.

FIG. 1 shows a bird's-eye view of the basic elements of the magnetic device according to this embodiment.

As shown in FIG. 1, the basic elements (logic elements) of the magnetic device include at least a magnetoresistive effect element 10 and an interconnect (electrode) 20.

The magnetoresistive effect element 10 is provided on the interconnect 20.

The magnetoresistive effect element 10 includes at least two magnetic layers 11 and 12, and a nonmagnetic layer 13.

Each of the two magnetic layers 11 and 12 has magnetization. The direction of magnetization of the magnetic layer 11 is variable. The direction of magnetization of the magnetic layer 12 is invariable (fixed state). In this embodiment, the magnetic layer 11 having a variable direction of magnetization is called a storage layer 11, and the magnetic layer 12 having an invariable direction of magnetization is called a reference layer 12.

Note that in this embodiment, "the direction of magnetization of the reference layer is invariable" or "the direction of magnetization of the reference layer is in a fixed state (for example, fixed)" means that in a case in which a current, a voltage, or a spin current used to change the direction of magnetization of the storage layer is supplied to the magnetoresistive effect element, the direction of magnetization of the reference layer is not changed by the supplied current, voltage, or spin current.

For example, the magnetic layers 11 and 12 have in-plane magnetic anisotropy (parallel magnetic anisotropy).

The easy magnetization axis directions of the magnetic layers 11 and 12 are parallel to the layer surfaces. The easy magnetization axis directions of the magnetic layers 11 and 12 are perpendicular to the stacking direction (the Z direction in FIG. 1) of the magnetic layers 11 and 12. For example, the easy magnetization axis directions of the magnetic layers 11 and 12 are set in the longitudinal direction (the Y direction in FIG. 1) of the magnetic layers 11 and 12.

The nonmagnetic layer 13 is provided between the two magnetic layers 11 and 12. The nonmagnetic layer 13 functions as a tunnel barrier layer 13. The tunnel barrier layer 13 is a very thin insulating film through which a tunnel current flows. For example, the tunnel barrier layer 13 is an insulating layer containing magnesium oxide.

The storage layer 11 is provided on the interconnect 20. The reference layer 12 is stacked on the tunnel barrier layer 13 above the storage layer 11.

For example, a magnetic tunnel junction is formed by the two magnetic layers 11 and 12 and the tunnel barrier layer 13. In this embodiment, the magnetoresistive effect element 10 having a magnetic tunnel junction is called an MTJ element 10.

The resistance value (resistance state) of the MTJ element 10 changes in accordance with the relative relationship (magnetization alignment) between the direction of magnetization of the storage layer 11 and the direction of magnetization of the reference layer 12. For example, the MTJ element 10 can take a first resistance state or a second resistance state.

For example, the MTJ element 10 has a rectangular parallelepiped structure, and has a rectangular plane shape. Note that the MTJ element 10 may have a three-dimensional structure having an elliptical, circular, or rectangular (for example, square) plane shape. The plane shape of the MTJ element 10 may have truncated or round corners.

The interconnect 20 extends in the X direction.

As will be described later, in this embodiment, a spin hall effect is used for magnetization switching in the storage layer 11 of the MTJ element 10.

To generate the spin hall effect, a material having spin-orbit interaction is used for the interconnect 20. The interconnect 20 may be a layer made of at least one material selected from the group consisting of metals such as copper (Cu), rhodium (Rh), palladium (Pd), silver (Ag), hafnium (Hf), tantalum (Ta), tungsten (W), rhenium (Re), osmium (Os), iridium (Ir), platinum (Pt), gold (Au), and bismuth (Bi), oxides including at least one of the metals, and nitrides including at least one of the metals. However, the materials of the interconnect 20 are not limited to these if the material has a large spin-orbit interaction.

The interconnect 20 will also be referred to as a spin-orbit interaction layer 20 hereinafter.

One terminal (one end) of the interconnect 20 in the X direction is connected to an interconnect (to be referred to as a source line hereinafter) SL via a transistor T1. The other terminal (other end) of the interconnect 20 in the X direction is connected to an interconnect (to be referred to as an access line hereinafter) AL.

Note that a transistor may be connected between the access line AL and the other terminal of the interconnect 20 in the X direction.

The MTJ element 10 is arranged on the interconnect 20 between the two terminals of the interconnect 20 in the X direction. The interconnect 20 is, for example, in direct contact with the storage layer 11.

A current is flowed in the interconnect 20 by controlling the source line SL and the access line AL.

An interconnect (to be referred to as a bit line hereinafter) BL is connected to an upper electrode (control terminal) 19 of the MTJ element 10 via, for example, a transistor (not shown). A control voltage VCNT of a predetermined voltage value is applied to the reference layer 12 of the MTJ element 10 by controlling the potential of the bit line BL.

The magnetization switching of the storage layer 11 of the MTJ element 10 is controlled by controlling the interconnects AL, BL, and SL.

Accordingly, in the magnetic device of this embodiment, the MTJ element 10 on the interconnect 20 operates as a logic element and a memory element.

The configuration including the MTJ element 10 and the interconnect 20 will be referred to as a logic cell or a memory cell (or simply a cell) hereinafter.

(2) Principle

The operation principle of the magnetoresistive effect element (MTJ element) in the magnetic device according to this embodiment will be described with reference to FIGS. 2 to 7.

<Magnetoresistive Effect>

The magnetoresistive effect used in the magnetic device according to this embodiment will be described with reference to FIG. 2.

FIG. 2 shows views for explaining the magnetoresistive effect of the MTJ element in the magnetic device according to this embodiment.

In FIG. 2, (a) is a view schematically showing the magnetization alignment state of the MTJ element in a case in which the MTJ element has the first resistance state. In FIG. 2, (b) is a view schematically showing the magnetization alignment state of the MTJ element in a case in which the MTJ element has the second resistance state.

As described above, the magnetic layers 11 and 12 have in-plane magnetic anisotropy (parallel magnetic anisotropy). The magnetization directions (easy magnetization axis directions) of the magnetic layers 11 and 12 are substantially parallel to the layer surfaces of the magnetic layers. The magnetization directions of the magnetic layers 11 and 12 are substantially perpendicular to the stacking direction of the plurality of layers 11, 12, and 13. For example, the in-plane magnetic anisotropy of the magnetic layers 11 and 12 is generated by the shape magnetic anisotropy of the magnetic layers or the like. The MTJ element using the in-plane magnetic anisotropy of the magnetic layers will be referred to as an in-plane magnetization type MTJ element hereinafter.

The resistance state of the MTJ element 10 changes in accordance with the relative relationship between the direction of magnetization of the storage layer 11 and the direction of magnetization of the reference layer 12.

As shown in (a) of FIG. 2, when the direction of magnetization of the storage layer 11 is the same as the direction of magnetization of the reference layer 12, the MTJ element 10 has the first resistance state (first magnetization alignment state). The MTJ element 10 having the first resistance state has a resistance value Rp.

As shown in (b) of FIG. 2, when the direction of magnetization of the storage layer 11 is opposite to the direction of magnetization of the reference layer 12, the MTJ element 10 has the second resistance state (second magnetization alignment state). The MTJ element 10 having the second resistance state has a resistance value Rap. In general, the resistance value Rap is higher than the resistance value Rp. However, the resistance value Rap sometimes becomes low than the resistance value Rp in accordance with the combination of the materials of the magnetic layers used in the MTJ element.

In this way, the MTJ element 10 can have one of a low resistance state and a high resistance state in accordance with the magnetization alignment of the two magnetic layers 11 and 12.

The magnetoresistive effect is a phenomenon in which the resistance value (magnetic resistance) changes depending on the relative relationship of the directions of magnetization of the two magnetic layers 11 and 12.

For example, the MTJ element 10 can hold 1-bit data ("0" data and "1" data) by associating data and the resistance state of the MTJ element 10. In this case, when the resistance state of the MTJ element 10 is set to the first resistance state (low resistance state), the MTJ element 10 is set in a first data holding state (for example, "0" data holding state). When the resistance state of the MTJ element 10 is set to the second resistance state (high resistance state), the MTJ element 10 is set in a second data holding state (for example, "1" data holding state).

In this embodiment, a magnetization alignment state in which the direction of magnetization of the storage layer 11 and the direction of magnetization of the reference layer 12 in the MTJ element 10 are the same is called a parallel state (or P state). A magnetization alignment state in which the direction of magnetization of the storage layer 11 and the direction of magnetization of the reference layer 12 in the MTJ element 10 are opposite to each other is called an antiparallel state (or AP state). As described above, in the magnetic device according to this embodiment, the spin hall effect and the voltage effect are used to control the magnetization alignment (P/AP state) of the MTJ element 10.

<Spin Hall Effect>

The spin hall effect used in the according to this embodiment will be described with reference to FIG. 3.

Figure 3:
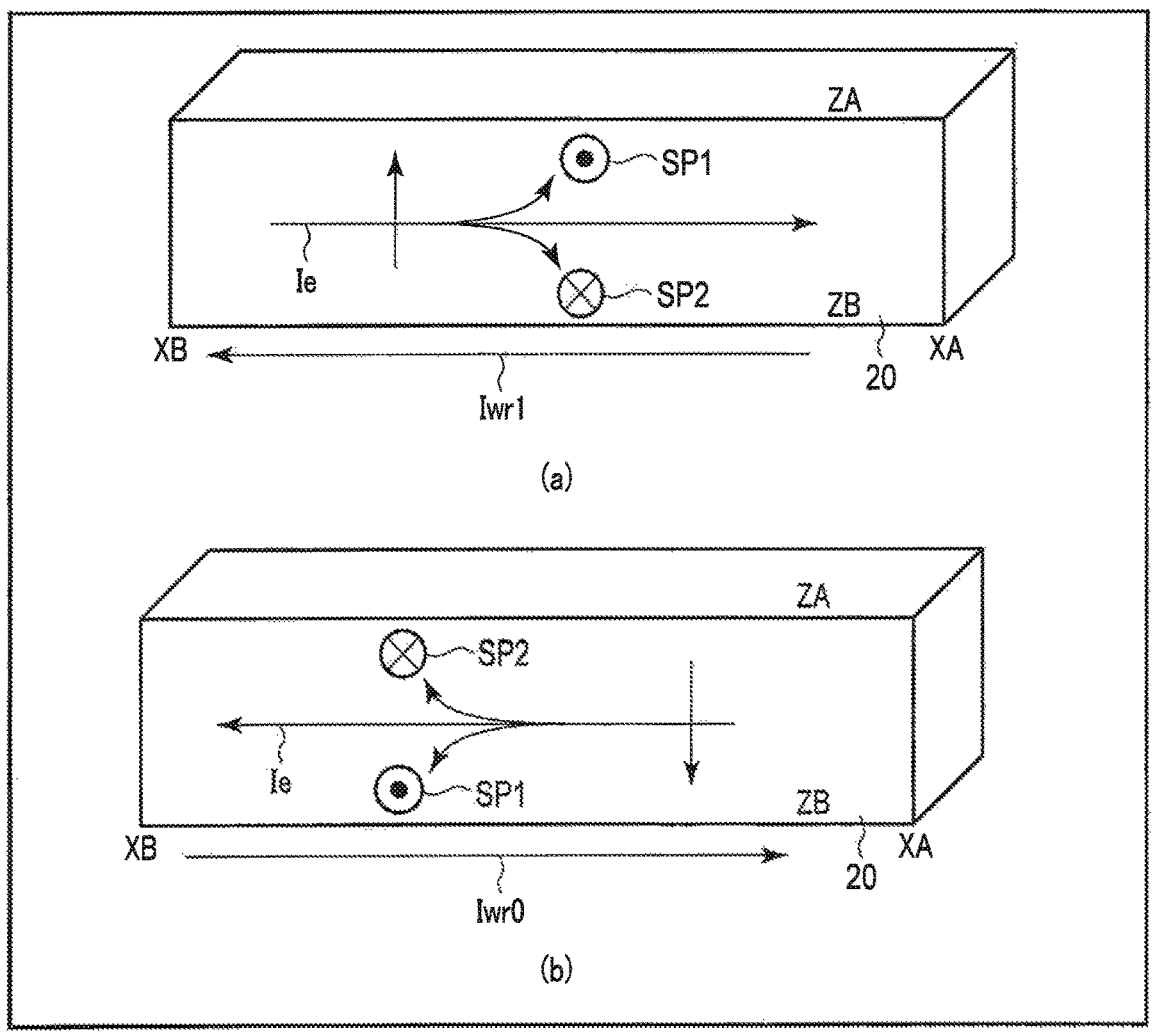
FIG. 3 shows bird's-eye views showing a configuration example of the magnetic device according to the embodiment.

In FIG. 3, (a) and (b) are schematic views for explaining the spin hall effect.

In the magnetic device according to this embodiment, the spin hall effect (also called SOT (Spin Orbit Torque)) is used for magnetization switching in the storage layer 11 of the MTJ element 10.

A write current Iwr (Iwr0, Iwr1) is supplied into the interconnect 20 having a large spin-orbit interaction. The write current Iwr includes charges (electrons) having an up-spin SP1 and charges having a down-spin SP2.

In a case in which the write current (also called a program current or a switching current) Iwr flows in the interconnect 20, the up-spin SP1 and the down-spin SP2 scatter in directions opposite to each other in accordance with the direction (the direction of the spin) in which the write current Iwr flows.

The relationship between a spin (represented by "S"), a spin current (represented by "Is"), and an electron flow (represented by "Ie") is expressed as $$Is \propto S \times Ie \quad \text{(Expression A)}$$

Note that the direction of the electron flow "Ie" is opposite to the direction in which the write current flows. "S" is a vector.

As indicated by (Expression A), the spin current "Is" is proportional to the outer product (vector product) of the spin "S" and the electron flow "e".

In this way, the spin current Is occurs in the interconnect 20 having the spin-orbit interaction. The phenomenon that causes the spin current Is is the spin hall effect.

For example, as shown in (a) of FIG. 3, in a case in which the current Iwr0 flows from the "XA" side (right side) of the interconnect 20 shown in FIG. 3 to the "XB" side (left side), the up-spin SP1 scatters to the "ZA" side of the interconnect 20 (the upper surface side of the interconnect 20), and the down-spin SP2 scatters to the "ZB" side of the interconnect 20 (the lower surface side of the interconnect 20).

As shown in (b) of FIG. 3, in a case in which the current Iwr1 flows from the "XB" side of the interconnect 20 shown in FIG. 3 to the "XA" side, the up-spin SP1 scatters to the "ZB" side of the interconnect 20, and the down-spin SP2 scatters to the "ZA" side of the interconnect 20.

For example, the MTJ element 10 is disposed on the surface of the interconnect 20 on the "ZA" side.

As shown in (a) and (b) of FIG. 3, the polarity (the direction to flow the current) of the current Iwr supplied to the interconnect 20 is switched. Accordingly, the direction of the spin acting on the storage layer 11 of the MTJ element 10 on the interconnect 20 is switched.

When the MTJ element 10 is arranged on the interconnect 20 shown in FIG. 3, the spin orbit torque (SOT) derived from the spin current generated by the spin hall effect is applied to the magnetization of the storage layer 11 of the MTJ element 10.

The direction of the spin acting on the storage layer 11 as the spin orbit torque changes in accordance with the direction of the current Iwr flowing in the interconnect 20.

Hence, when the direction of the current Iwr flowing in the interconnect 20 is controlled, the direction of magnetization of the storage layer 11 can be controlled to the direction parallel or antiparallel to the direction of magnetization of the reference layer 12.

In this embodiment, by the spin hall effect, the direction of magnetization of the storage layer 11 of the MTJ element 10 can be changed (switched) in accordance with the direction of the applied spin.

The magnetization switching of the MTJ element using the spin hall effect enables control of the magnetization alignment (data writing) of the MTJ element 10 without directly flowing a current to the tunnel barrier layer 13. For this reason, in the magnetization switching of the MTJ element using the spin hall effect, destruction of the tunnel barrier layer 13 can be suppressed.

In addition, in the magnetization switching of the MTJ element using the spin hall effect, the path of the current in the magnetization switching operation (write operation) is different from the path of the current in the resistance state determination operation (read operation) of the MTJ element. For this reason, in the magnetization switching of the MTJ element using the spin hall effect, magnetization switching at the time of determination of the resistance state of the MTJ element does not substantially occur.

<Voltage Effect>

The voltage effect used in the magnetic device according to this embodiment will be described with reference to FIG. 4.

In this embodiment, the switching/non-switching of magnetization (write/non-write of data) in the storage layer 11 of the MTJ element 10 on the interconnect 20 at the time of supply of the write current can be controlled by the voltage effect (VCMA: Voltage-Controlled Magnetic Anisotropy).

The voltage effect is a phenomenon in which the magnetic anisotropy (for example, perpendicular magnetic anisotropy) of the storage layer 11 changes upon applying a voltage between the storage layer 11 and the reference layer 12 of the MTJ element 10.

When the magnetic anisotropy of the storage layer 11 is changed, the energy barrier between the parallel state (P state) and the antiparallel state (AP state) of the MTJ element 10 changes.

This can control an increase/decrease in a magnetization switching current (magnetization switching threshold value) Ic of the MTJ element 10 by the spin hall effect.

As described above, an in-plane magnetization film is used in the MTJ element 10. In the in-plane magnetization film, the directions of magnetization of the storage layer 11 and the reference layer 12 are parallel to the layer surfaces (film surfaces) of the magnetic layers 11 and 12.

In the MTJ element 10 using the in-plane magnetization film, the voltage VCNT is applied to the MTJ element 10 such that the perpendicular magnetic anisotropy energy of the storage layer 11 increases (becomes close to a perpendicular stable state). This decreases the magnetization switching threshold value Ic of the storage layer 11.

To the contrary, when the perpendicular magnetic anisotropy energy of the storage layer 11 is decreased (the in-plane magnetization is further stabilized) by applying the voltage VCNT, the magnetization switching threshold value Ic of the storage layer 11 increases.

Note that when a perpendicular magnetization film is used in the MTJ element, the relationship between the voltage and the perpendicular magnetic anisotropy energy in the MTJ element using the perpendicular magnetization film is reverse to the relationship between the voltage and the perpendicular magnetic anisotropy energy in the MTJ element using the in-plane magnetization film.

The increase/decrease in the magnetization switching threshold value Ic caused by the application of the voltage is determined in accordance with the polarity of the voltage applied to the MTJ element.

For example, in the in-plane magnetization type MTJ element as an example, a CoFeB layer is used as the storage layer, and an MgO layer is used as the tunnel barrier layer.

As shown in (a) of FIG. 4, in a case in which a voltage of a positive voltage value is applied to the storage layer 11, and the control voltage VCNT of a negative voltage value (or 0 V) is applied to the reference layer 12 (in a case in which the potential on the reference layer side is lower than the potential on the storage layer side) in the in-plane magnetization type MTJ element 10, the in-plane magnetic anisotropy energy (magnetization) of the storage layer 11 decreases relatively along with an increase in the perpendicular magnetic anisotropy energy. As a result, the magnetization switching threshold value Ic of the storage layer 11 decreases.

As shown in (b) of FIG. 4, in a case in which a voltage of a negative voltage value (or 0 V) is applied to the storage layer 11, and the control voltage VCNT of a positive voltage value is applied to the reference layer 12 (in a case in which the potential on the reference layer side is higher than the potential on the storage layer side) in the in-plane magnetization type MTJ element 10, the in-plane magnetic anisotropy energy of the storage layer 11 increases relatively along with a decrease in the perpendicular magnetic anisotropy energy. As a result, the magnetization switching threshold value Ic of the storage layer 11 increases.

In this way, the magnitude of the magnetization switching threshold value Ic of the storage layer 11 can be controlled by the voltage effect obtained by applying a control voltage to the MTJ element.

As a result, in the magnetic device according to this embodiment, the current value of the write current is set in consideration of the change in the magnetization switching threshold value Ic of the storage layer 11 by the voltage effect, thereby controlling magnetization switching/non-switching of the MTJ element at the time of supply of the write current by applying the control voltage VCNT.

<Magnetization Switching Operation>

In the magnetic device according to this embodiment, the magnetization switching operation (write operation or switching operation) of the magnetoresistive effect element can be executed based on the phenomenon/principle explained with reference to FIGS. 2, 3, and 4 described above. FIG. 5 shows schematic views for explaining a basic example of the magnetization switching operation of a magnetic logic circuit according to this embodiment.

As shown in (a) and (b) of FIG. 5, when switching the magnetization of the storage layer 11 of the MTJ element 10, the control voltage VENT of a predetermined polarity and voltage value is applied to the MTJ element 10 such that the magnetization switching threshold value Ic of the storage layer 11 is decreased by the voltage effect.

As shown in (a) of FIG. 5, when changing the magnetization alignment of the MTJ element 10 from the P state to the AP state, the control voltage VCNT of a negative voltage value Va is applied to the reference layer 12 of the MTJ element 10 such that the potential on the side of the reference layer 12 of the MTJ element 10 becomes lower than the potential on the side of the storage layer 11.

For example, the write current Iwr1 is supplied to the interconnect 20 such that the write current Iwr1 flows from the side of the one end XA of the interconnect 20 to the side of the other end XB.

By a spin current generated in the interconnect 20 by the write current Iwr1, the direction of magnetization of the storage layer 11 is switched.

Accordingly, for the MTJ element 10 on the interconnect 20, the magnetization alignment of the MTJ element 10 is set in the AP state.

Note that even when the write current Iwr1 is supplied to the MTJ element 10 having the magnetization alignment in the AP state, the MTJ element 10 maintains the magnetization alignment in the AP state.

As shown in (b) of FIG. 5, when changing the magnetization alignment of the MTJ element 10 from the AP state to the P state, the control voltage VCNT of the negative voltage value Va is applied to the reference layer 12 of the MTJ element 10 such that the potential on the side of the reference layer 12 of the MTJ element 10 becomes lower than the potential on the side of the storage layer 11.

For example, the write current Iwr0 is supplied to the interconnect 20 such that the write current Iwr0 flows from the side of the other end XB of the interconnect 20 to the side of the one end XA.

By a spin current generated in the interconnect 20 by the write current Iwr0, the direction of magnetization of the storage layer 11 is switched.

Accordingly, for the MTJ element 10 on the interconnect 20, the magnetization alignment of the MTJ element 10 is set in the P state.

Note that even when the write current Iwr0 is supplied to the MTJ element 10 having the magnetization alignment in the P state, the MTJ element 10 maintains the magnetization alignment in the P state.

As shown in (c) of FIG. 5, in a case in which the write current Iwr is supplied to the interconnect 20, the magnetization switching of the storage layer 11 in the MTJ element 10 can be prevented by applying the control voltage VCNT to the MTJ element 10.

The control voltage VCNT of a predetermined polarity and voltage value is applied to the MTJ element 10 such that the magnetization switching threshold value Ic of the storage layer 11 is increased by the voltage effect.

When inhibiting switching of the direction of magnetization of the storage layer 11 of the MTJ element 10 at the time of supply of the write current Iwr, the control voltage VCNT of a positive voltage value Vd (or 0 V) is applied to the reference layer 12 of the MTJ element 10 such that the potential on the side of the reference layer 12 of the MTJ element 10 becomes higher than the potential on the side of the storage layer 11.

Accordingly, even if a spin current derived from the write current Iwr is generated in the interconnect 20, magnetization switching of the storage layer 11 does not occur in the MTJ element 10.

In this way, the change of the magnetization alignment (data write) of the MTJ element is controlled by the direction to flow the write current and application of the control voltage.

For example, when the magnetization alignment of the MTJ element 10 is the AP state, it is defined that the MTJ element 10 is in the "1" data holding state. When the magnetization alignment of the MTJ element is the P state, it is defined that the MTJ element 10 is in the "0" data holding state.

The write current used to set the MTJ element 10 in the "1" data holding state will be referred to as a "1" program current hereinafter. The write current used to set the MTJ element 10 in the "0" data holding state will be referred to as a "0" program current.

A control voltage having a voltage value to cause the magnetization switching of the MTJ element at the time of supply of the write current will be referred to as a selection voltage. A control voltage having a voltage value to suppress the magnetization switching of the MTJ element at the time of supply of the write current will be referred to as a nonselection voltage.

A result of the magnetization switching operation of the MTJ element will also be referred to as a program result hereinafter.

(3) Logic Element

A logic element using the magnetoresistive effect element (MTJ element) in the magnetic device according to this embodiment will be described with reference to FIGS. 6 and 7.

The MTJ element 10 on the interconnect 20 functions as a 2-input logic element.

Concerning the 2-input logic element, data (to be referred to as held data hereinafter) held by the MTJ element before supply of the write current is regarded as one input signal, and the control voltage VCNT is regarded as the other input signal.

Figure 6:
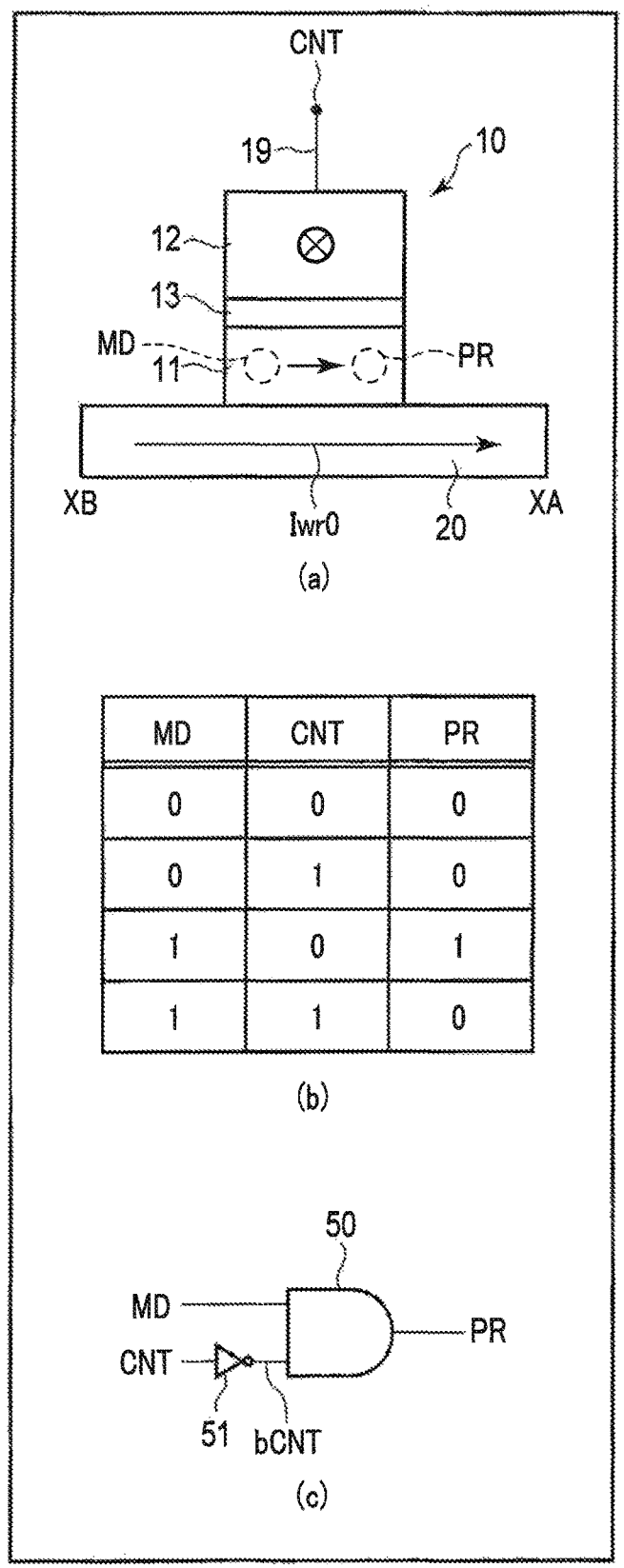
Figure 7:
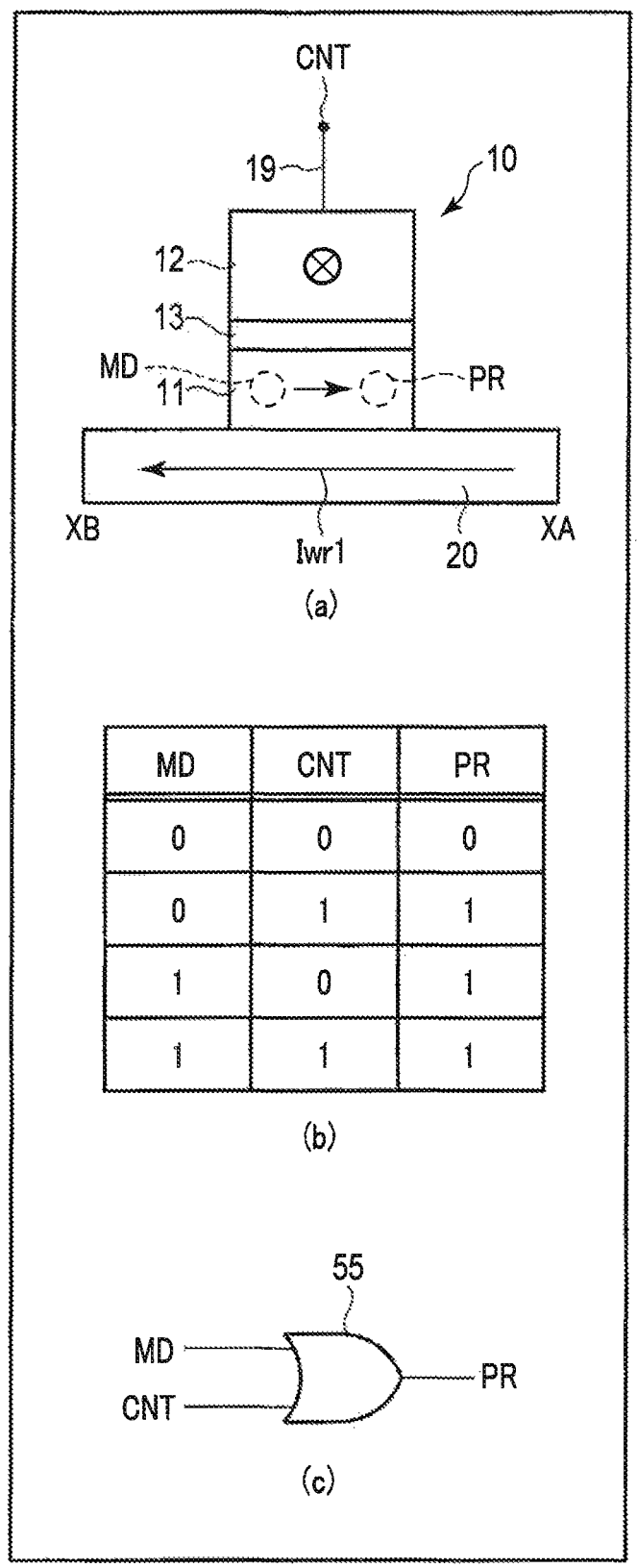

In FIGS. 6 and 7, the held data as one input signal is expressed as "MD", and the voltage value of the control voltage VCNT as the other input signal is expressed as "CNT".

In this embodiment, the negative voltage value (selection voltage) Va of the control voltage VCNT corresponds to the signal CNT of "1", and the positive voltage value or 0 V (nonselection voltage) Vd of the control voltage VCNT corresponds to the signal CNT of "0". In the voltage value of the control voltage VCNT, the voltage value Va and the voltage value Vd have a relationship complementary to each other.

FIG. 6 shows views for explaining the operation (logic operation) of the logic element using the MTJ element in the magnetic device according to this embodiment.

In FIG. 6, (a) is a schematic view for explaining a plurality of signals in the logic element.

As shown in (a) of FIG. 6, in the MTJ element 10 holding the certain data MD, the voltage value CNT of the control voltage VCNT is controlled, and a write current Iwr0 is supplied into the interconnect 20.

The write current Iwr0 is a "0" program current. The "0" program current flows in the direction from the terminal XB of the interconnect 20 to the terminal XA. In a case in which the "0" program current Iwr0 is supplied to the interconnect 20, the direction of magnetization of the storage layer 11 according to the control voltage VCNT and the held data MD is a program result PR.

In FIG. 6, (b) shows the relationship between the two signals MD and CNT and the program result PR in a case in which the "0" program current Iwr0 is supplied to the MTJ element 10.

As shown in (b) of FIG. 6, in a case in which the held data MD is "0" (P state), and the voltage value CNT of the control voltage VCNT is "0" (nonselection voltage Vd) in the MTJ element 10 to which the "0" program current Iwr0 is supplied, the program result PR is "0".

In a case in which the held data MD is "0", and the voltage value CNT of the control voltage VCNT is "1" (selection voltage Va), the program result PR is "0". In a case in which the held data MD is "1" (AP state), and the voltage value of the control voltage VCNT is "0", the program result PR is "1".

In a case in which the held data MD is "1", and the voltage value of the control voltage VCNT is "1", the program result PR is "0".

In FIG. 6, (c) is an equivalent circuit diagram showing an example of a logic circuit capable of obtaining a program result (truth table) for two inputs shown in (b) of FIG. 6.

In a case in which the "0" program current Iwr0 is supplied, the program result PR shown in (b) of FIG. 6 corresponds to the calculation result of the logical conjunction (AND operation) between the held data MD and an inverted potential bCNT of the voltage value CNT of the control voltage VCNT.

As shown in (c) of FIG. 6, the held data MD is regarded as a signal supplied to one input terminal of an AND gate 50. The voltage value (signal) CNT of the control voltage VCNT is regarded as a signal supplied to the other input terminal of the AND gate 50 via an inverter 51.

The AND gate 50 executes an AND operation using the held data MD and the signal bCNT.

The AND gate 50 outputs the signal (program result) PR representing the calculation result for the two signals MD and bCNT.

In this way, the logic circuit shown in (c) of FIG. 6 can obtain substantially the same calculation result as the result PR of the magnetization switching operation shown in (a) and (b) of FIG. 6.

Hence, the AND operation can be executed by supplying the "0" program current Iwr0 to a cell LC including the MTJ element 10 on the interconnect 20.

In FIG. 7, (a) is a schematic view for explaining a plurality of signals in the logic element.

As shown in (a) of FIG. 7, in the MTJ element 10 holding the certain data MD, the voltage value CNT of the control voltage VCNT is controlled, and the write current Iwr1 is supplied into the interconnect 20.

The write current Iwr1 is a "1" program current. The "1" program current flows in the direction from the terminal XA of the interconnect 20 to the terminal XB.

In a case in which the "0" program current Iwr0 is supplied to the interconnect 20, the direction of magnetization of the storage layer 11 according to the control voltage VCNT and the held data MD is the program result PR.

In FIG. 7, (b) shows the relationship between the two signals MD and CNT and the program result PR in a case in which the "1" program current Iwr1 is supplied to the MTJ element 10.

As shown in (b) of FIG. 7, in a case in which the held data MD is "0" (P state), and the voltage value CNT of the control voltage is "0" (nonselection voltage Vd), the program result PR is "0".

In a case in which the held data MD is "0", and the control voltage VCNT is "1" (selection voltage Va), the program result PR is "1".

In a case in which the held data MD is "1" (AP state), and the control voltage VCNT is "0", the program result PR is "1".

In a case in which the held data MD is "1", and the control voltage VCNT is "1", the program result PR is "1".

In FIG. 7, (c) is an equivalent circuit diagram, showing an example of a logic circuit capable of obtaining a program result (truth table) for two inputs shown in (b) of FIG. 7.

In a case in which the "1" program current Iwr1 is supplied to the interconnect 20, the program result PR shown in (b) of FIG. 7 corresponds to the calculation result of the logical disjunction (OR operation) between the held data MD and the voltage value (signal) CNT of the control voltage VCNT.

As shown in of FIG. 7, the held data MD is supplied to one input terminal of an OR gate 55. The potential CNT of the control voltage VCNT is supplied to the other input terminal of the OR gate 55.

The OR gate 55 executes an OR operation using the held data MD and the signal CNT.

Accordingly, the OR gate 55 outputs the signal PR representing the calculation result for the two signals MD and CNT.

In this way, the logic circuit shown in (c) of FIG. 7 can execute the calculation processing shown in (b) of FIG. 7.

Hence, the OR operation can be executed by supplying the "1" program current Iwr1 to the cell including the MTJ element 10 on the interconnect 20.

As shown in FIGS. 6 and 7, in this embodiment, a logic circuit can be formed using the magnetoresistive effect element (MTJ element).

(4) Effect

In the magnetic device according to this embodiment, the magnetization switching operation of the MTJ element on the interconnect is executed by supplying a spin current derived from the spin hall effect in the interconnect to the storage layer in a state in which the control voltage for the voltage effect is applied to the reference layer.

By applying such an operation principle, the MTJ element 10 can implement the function as a logic element together with the function as a memory element.

As a result, the magnetic device according to this embodiment can speed up the logic operation of the system.

(5) Application Examples

Application examples of the magnetic device (spintronics device) according to this embodiment will be described with reference to FIGS. 8 to 44.

(a) Configuration Example

A Configuration example of the magnetic device according to this embodiment will be described with reference to FIGS. 8 and 9.

Figure 8:
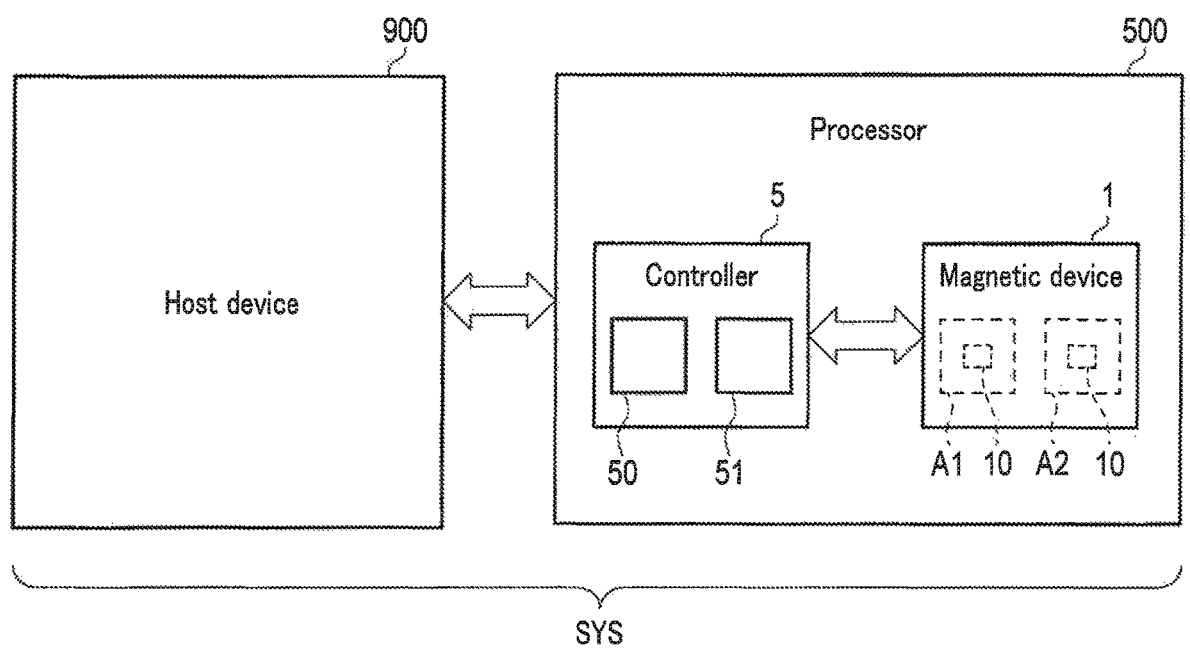

FIG. 8 is a block diagram showing an example of a system including the magnetic device according to this embodiment.

As shown in FIG. 8, a system SYS includes, for example, a magnetic device 1 according to this embodiment, a controller 5, and a host device 900. For example, the system SYS is a computer system.

The magnetic device 1 according to this embodiment includes a plurality of magnetoresistive effect elements (MTJ elements) 10. The magnetic device 1 according to this embodiment includes a circuit (or its functional unit) A1 that executes calculation processing using data, and a circuit (or its functional unit) A2 that stores data and/or a result of calculation processing for the data. The MTJ element 10 is provided in each of the circuit A1 and the circuit A2.

The magnetic device 1 according to this embodiment is a magnetic logic operation circuit having a memory function or a magnetic memory having a logic operation function.

The magnetic device 1 according to this embodiment is directly or indirectly connected to the controller 5. The controller 5 is directly or indirectly coupled to the host device 900 via a connection terminal, a connector, a cable, or wireless communication.

The host device 900 can request, via the controller 5, the magnetic device 1 to do various kinds of operations such as writing (storing) of data, reading of data, and calculation processing of data.

The controller 5 can control the operation of the magnetic device 1. The controller 5 includes a processing circuit, a built-in memory, an ECC circuit, and the like.

The controller 5 generates a command based on the request from the host device 900. The controller 5 transmits the generated command to the magnetic device 1.

The magnetic device 1 executes an operation corresponding to the command from the controller 5.

For example, when the request from the host device 900 is writing of data, the controller 5 transmits a write command to the magnetic device.

Together with the write command, the controller 5 transmits an address (the address of a memory cell) to write data, data to be written, and a control signal. The magnetic device 1 writes the data to be written to the selected address in the circuit A2 based on the write command and a control signal.

For example, when the request from the host device 900 is reading of data, the controller 5 transmits a read command to the magnetic device 1. Together with the read command, the controller 5 transmits an address to read data and a control signal. The magnetic device 1 reads data from the selected address in the circuit A2 based on the read command and the control signal. The magnetic device 1 transmits the read data to the controller 5. The controller 5 receives the data from the magnetic device 1. The controller 5 transmits the data from the magnetic device 1 to the host device 900.

For example, when the request from the host device 900 is calculation processing, the controller 5 transmits a calculation command to the magnetic device 1. Together with the calculation command, the controller 5 transmits data to be calculated, an address at which the calculation target data is stored in the circuit A2, and a control signal. The magnetic device 1 executes calculation processing for the data using the circuit A1 based on the calculation command and the control signal. The magnetic device 1 stores the calculation result (data) and/or transmits the calculation result to the controller 5. The controller 5 receives the calculation result. The controller 5 transmits the calculation result from the magnetic device 1 to the host device 900.

In this way, the magnetic device 1 executes a predetermined operation based on the request and the command from the other devices 900 and 5 in the computer system SYS.

For example, the magnetic device 1 and the controller 5 are provided in a processor 500. The processor 500 is electrically coupled to the host device 900. A plurality of magnetic devices 1 may be provided in the processor 500. At least one of the controller 5 and the host device 900 will be referred to as an external device hereinafter.

For example, the host device 900 is at least one device selected from the group consisting of a portable terminal, a smartphone, a game machine, a processor, a server, a personal computer, and the like.

Note that the magnetic device 1 according to this embodiment may be a device in the controller 5 or in the host device 900. In this case, the magnetic device 1 is controlled by a CPU in the controller 5 or by a CPU in the host device 900. The controller 5 may be provided in the host device 900. The processor 500 may be provided in the host device 900.

Figure 9:
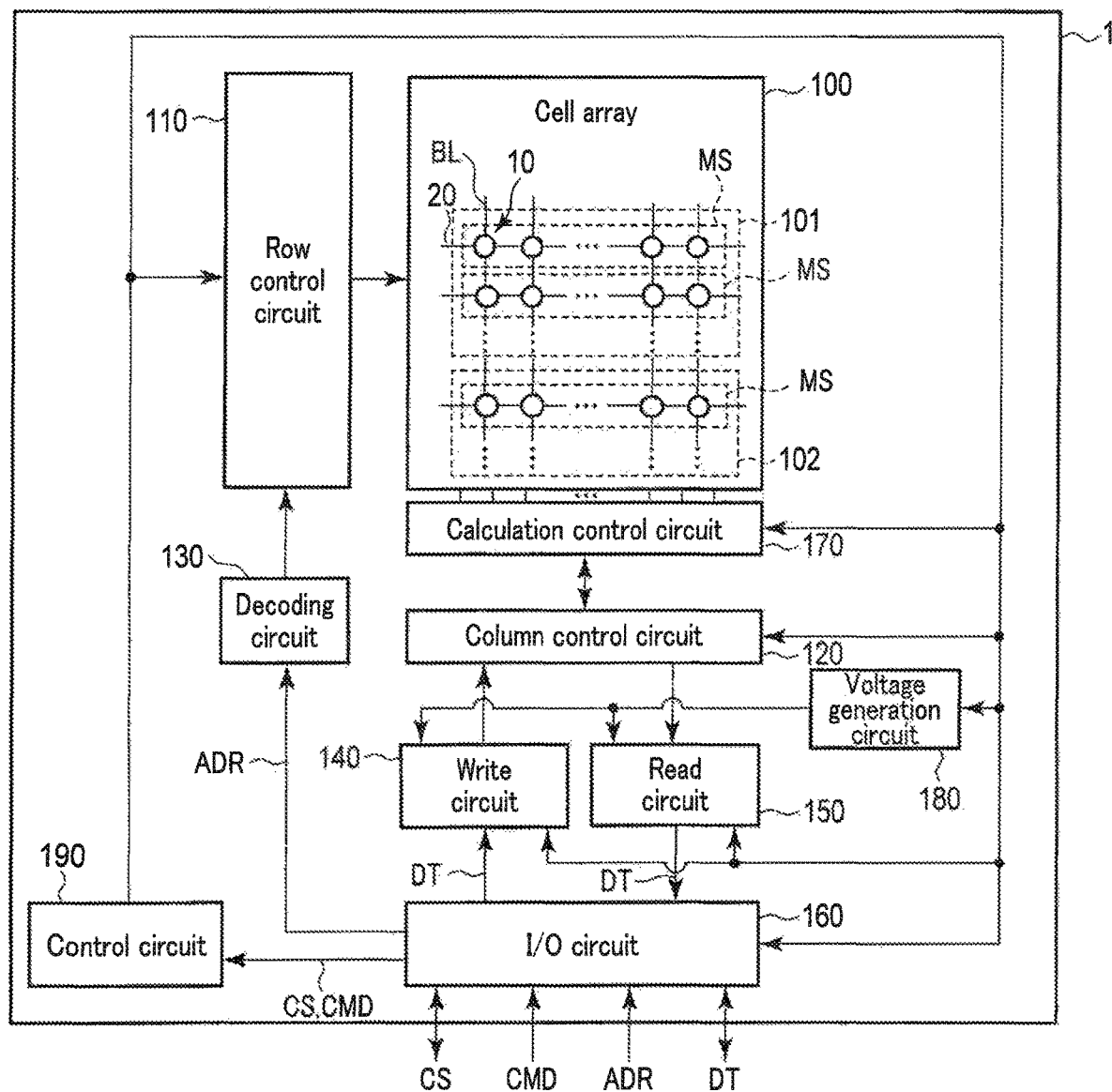

FIG. 9 is a block diagram showing the internal arrangement of the magnetic device according to this embodiment.

As shown in FIG. 9, the magnetic device 1 according to this embodiment includes a cell array 100, a row control circuit 110, a column control circuit 120, a decoding circuit 130, a write circuit 140, a read circuit 150, an I/O circuit 160, a calculation control circuit 170, a voltage generation circuit 180, a control circuit 190, and the like.

In this embodiment, the cell array 100 includes a memory area 101 and a calculation processing area 102.

A plurality of cell strings MS (a plurality of control units) are arranged in each of the areas 101 and 102 of the cell array 100.

Each cell string MS includes a plurality of MTJ elements 10. In the cell string MS, the plurality of MTJ elements 10 are connected to the common interconnect 20. In the cell string MS, the plurality of MTJ elements 10 are connected to, for example, the bit lines BL different from each other.

Details of the configuration of the cell string MS will be described later.

The MTJ elements 10 in the memory area 101 are used to store data.

The MTJ elements 10 in the calculation processing area (or also called a register area) 102 are used as logic elements. The MTJ elements 10 serving as the logic elements are used for calculation processing of at least one of data in the memory area 101 and data from the outside.

The row control circuit 110 controls a plurality of rows of the cell array 100. The decoding result of the row address of an address ADR from the decoding circuit 130 is supplied to the row control circuit 110. The row control circuit 110 sets a row (for example, the interconnect 20) based on the decoding result of the row address in a selected state. The row set in the selected state will be referred to as a selected row hereinafter. Rows other than the selected row will be referred to as unselected rows hereinafter.

The column control circuit 120 controls a plurality of columns of the cell array 100. The decoding result of the column address of the address ADR from the decoding circuit 130 is supplied to the column control circuit 120. The column control circuit 120 sets a column (for example, the bit line BL) based on the decoding result of the column address in the selected state. The column set in the selected state will be referred to as a selected column hereinafter. Columns other than the selected column will be referred to as unselected columns.

The decoding circuit 130 decodes the address ADR from the I/O circuit 160. The decoding circuit 130 supplies, the decoding result of the address ADR to the row control circuit 110 and the column control circuit 120. The address ADR includes a row address to be selected and a column address to be selected.

The write circuit (to be also referred to as a write control circuit or a write driver) 140 performs various kinds of control for a write operation (writing of data). The write circuit 140 supplies a write current (program current) to the cell string MS at the time of the write operation. At the time of the write operation, the write circuit 140 controls the potential of the bit line BL (the voltage value of the control voltage VCNT). Accordingly, the write circuit 140 writes data to the MTJ element 10 in the area 101.

At the time of a calculation operation, the write circuit 140 controls the potential of the bit line BL and supplies a current for the calculation operation to the cell string MS in the area 102, substantially as in the write operation.

For example, the write circuit 140 includes a voltage source (or a current source), a latch circuit, and the like.

The read circuit (to be also referred to as a read control circuit or a read driver) 150 performs various kinds of control for a read operation (reading of data). The read circuit 150 controls the potential or current of the bit line BL at the time of the read operation. Accordingly, the read circuit 150 reads data from the MTJ, element 10 in the area 101.

At the time of a calculation operation, the read circuit 150 controls the potential or the current of the bit line BL, thereby reading data from the cell strings ME in the areas 101 and 102, substantially as in the read operation.

For example, the read circuit 150 includes a voltage source (or a current source), a latch circuit, a sense amplifier circuit, and the like.

Note that the write circuit 140 and the read circuit 150 are not limited to circuits independent of each other.

For example, the write circuit 140 and the read circuit 150 may include common constituent elements that are usable by each other and may be provided as one integrated circuit.

The I/O circuit (input/output circuit) 160 is an interface circuit used to transmit and receive various kinds of signals in the magnetic device 1.

At the time of the write operation, the I/O circuit 160 transfers write data DT from the external device (for example, the controller 5) to the write circuit 140. At the time of the read operation, the I/O circuit 160 transfers the data DT output from the cell array 100 to the read circuit 150 to the external device as read data. At the time of the calculation processing operation, the I/O circuit 160 transfers the data DT for calculation processing to the calculation control circuit 170. The I/O circuit 160 transfers the data DT of the calculation result to the external device.

The I/O circuit 160 transfers the address ADR from the external device to the decoding circuit 130. The I/O circuit 160 transfers a command CMD from the external device to the control circuit 190. The I/O circuit 160 transmits and receives various control signals CS between the control circuit 190 and the external device.

The calculation control circuit 170 includes various circuits used to execute calculation processing. The calculation control circuit 170 includes an inverter circuit, a sense amplifier circuit, a bit shift circuit (shift register), and the like. For example, the magnetic device 1 according to this embodiment can execute addition processing, subtraction processing, multiplication processing, division processing, and the like under the control of the calculation control circuit 170, as will be described later.

The voltage generation circuit 180 generates voltages for various kinds of operations of the cell array 100 using a power supply voltage supplied from the external device.

At the time of the write operation/read operation/calculation operation, the voltage generation circuit 180 outputs the various generated voltages to the write circuit 140, the read circuit 150, and the calculation control circuit 170.

The control circuit (to be also referred to as a state machine, a sequencer, or an internal controller) 190 controls the operation of each circuit in the magnetic device 1 based on the control signal CS and the command CMD.

For example, the command CMD is a signal representing an operation to be executed by the magnetic device 1. For example, the control signal CS is a signal used to control an operation timing between the external device and the magnetic device 1 and an operation timing in the magnetic device 1.

For example, the memory area 101 corresponds to the circuit A1. The calculation processing area 102 and the calculation control circuit 170 correspond to the circuit A2.

Configuration Example of Cell String

The internal configuration of the cell string of the magnetic device according to this embodiment will be described with reference to FIGS. 10 and 11.

Figure 10:
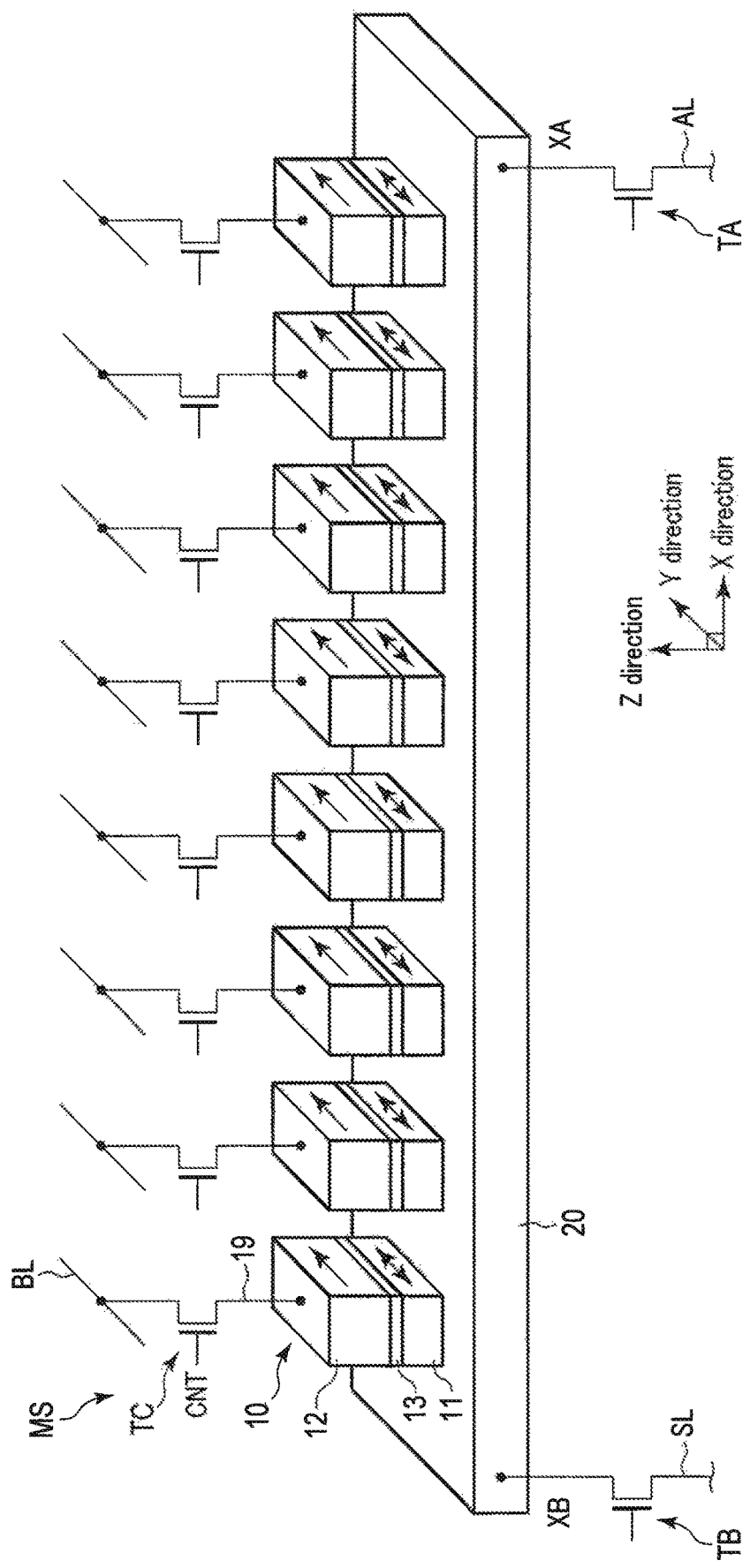

FIG. 10 is a bird's-eye view for explaining the basic configuration of the cell string of the magnetic device according to this embodiment.

As shown in FIG. 10, in the cell string MS, a plurality of MTJ elements 10 are arranged in the X direction on the common interconnect 20. The interconnect 20 extends in the X direction. The plurality of MTJ elements 10 are electrically connected to the common interconnect 20. The interconnect 20 will also be referred to as a common interconnect 20 hereinafter.

The terminal XA is provided at one end of the interconnect 20 in the X direction, and the terminal XB is provided at the other end of the interconnect 20 in the X direction.

To control the operation of the cell string MS, a plurality of transistors TA, TB, and TC are connected to the cell string MS.

For example, one terminal (one of the source/drains) of the current path of the transistor TA is connected to the terminal XA of the interconnect 20.

One terminal of the current path of the transistor TB is connected to the terminal XB of the interconnect 20.

The plurality of transistors TC are provided to correspond to the plurality of MTJ elements 10 on a one-to-one basis. One terminal of the current path of one transistor TC is connected to the reference layer 12 of a corresponding one of the MTJ elements 10. The other terminal (the other of the source and the drain) of the current path of one transistor TC is connected to a corresponding one of the bit lines BL.

A gate voltage (control signal) of a certain voltage value is applied to the gate of each transistor TA to ON/OFF-control the transistor TA.

A gate voltage of a certain voltage value is applied to the gate of each transistor TB to ON/OFF-control the transistor TB.

A gate voltage of a certain voltage value is applied to the gate of each transistor TC to ON/OFF-control the transistor TC.

The transistors TA, TB, and TC function as elements configured to activate (select) the cell string MS and the MTJ element (memory cell) 10.

The cell strings MS in the calculation processing area 102 have substantially the same configuration as the cell strings MS in the memory area 101.

Figure 11:
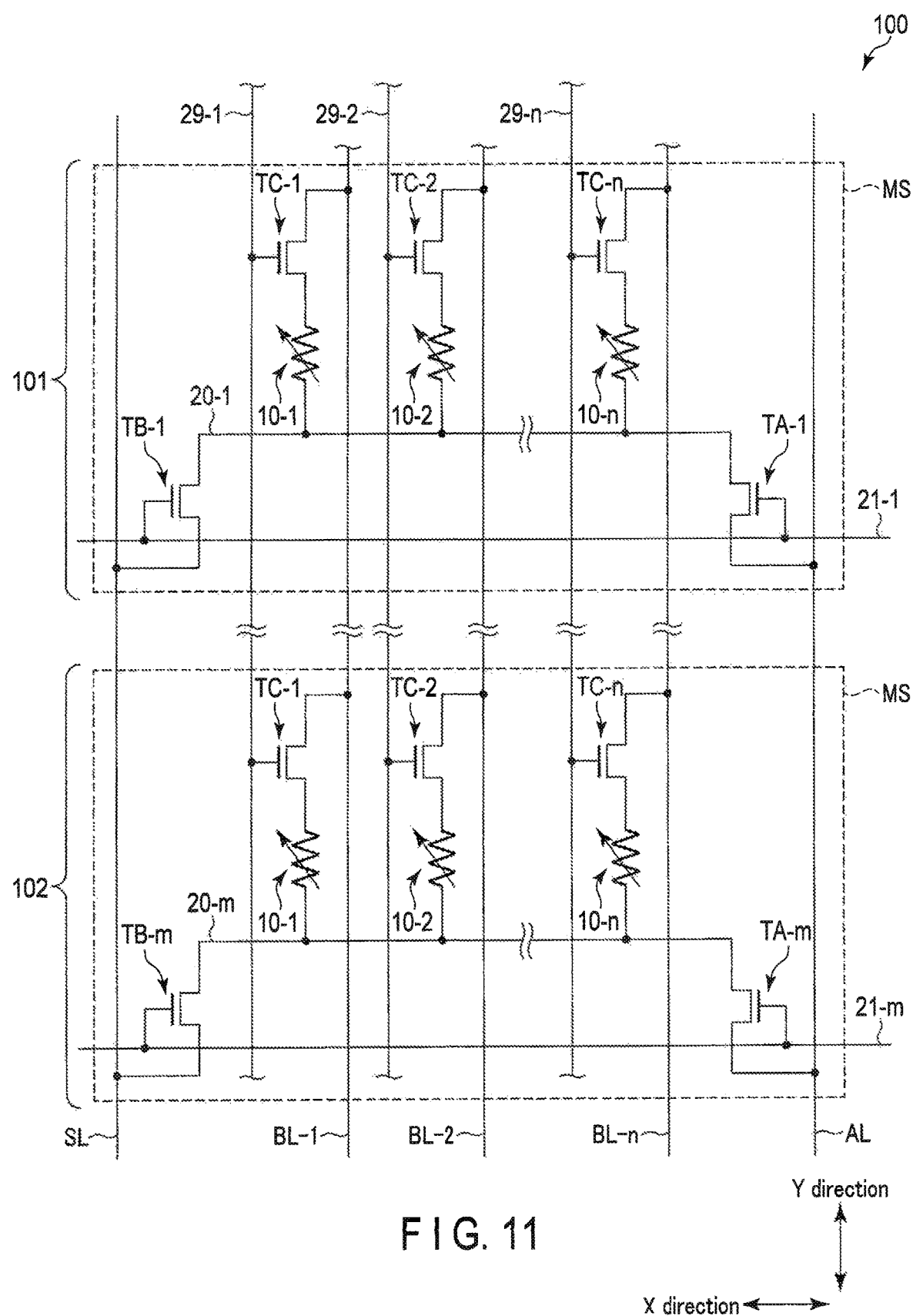

FIG. 11 is an equivalent circuit diagram showing an example of the cell array including the cell strings of the magnetic device according to this embodiment.

As shown in FIG. 11, a plurality of cell strings MS are provided in the memory area 101 and the calculation processing area 102 of the cell array 100. The plurality of cell strings MS are arranged in the Y direction.

A plurality of interconnects 20 (20-1, . . . , 20-m) are arranged in the cell array 100. The plurality of interconnects 20 are separated for each cell string MS.

A plurality of interconnects BL (BL-1, BL-2, . . . , BL-n) and 29 (29-1, 29-2, . . . , 29-n) are arranged in the cell array 100. The interconnects BL and 29 are commonly connected to the plurality of cell strings MS arrayed in the Y direction in the memory area 101 and the calculation processing area 102. A plurality of transistors TC (TC-1, TC-2, . . . , TC-n) are arranged in the cell array 100 in correspondence with the plurality of MTJ elements 10. n is an integer of 1 or more.

The plurality of MTJ elements 10 are arrayed in the X direction and the Y direction.

In each cell string MS, the plurality of MTJ elements 10 (10-1, 10-2, . . . , 10-n) arrayed in the X direction are connected to the interconnects 20 (20-1, . . . , 20-m). m is an integer of 1 or more.

One terminal of the MTJ element 10 is connected to the interconnect 20. The other terminal 19 of the MTJ element 10 is connected to a corresponding one of the plurality of interconnects (bit lines) BL via the current path of the corresponding transistor TC. The gate of the transistor TC is connected to a corresponding one of the plurality of interconnects (control lines) 29.

The plurality of MTJ elements 10 arrayed in the Y direction are commonly connected to the bit line BL.

The interconnects SL and AL are arranged in the cell array 100. A plurality of transistors TA (TA-1, . . . , TA-m) are arranged in the cell array 100 in correspondence with the plurality of cell strings MS. The cell array 100 includes a plurality of transistors TB (TB-1, . . . , TB-m) in correspondence with the plurality of cell strings MS.

The interconnects SL and AL are commonly connected to the plurality of cell strings MS in the memory area 101 and the calculation processing area 102. The interconnect (source line) SL is connected to the terminal XB of the interconnect 20 via the current path of the transistor TB. The interconnect (access line) AL is connected to the terminal XA of the interconnect 20 via the current path of the transistor TA.

A plurality of interconnects 21 (21-1, . . . , 21-m) are arranged in the cell array 100. The interconnect 21 is provided for each cell string MS. The interconnect 21 is connected to the gates of the transistors TA and TB of the corresponding cell string MS.

The transistors TA and TB are turned on or off by controlling the potential (the voltage value of the gate voltage) of the interconnect 21. Accordingly, at least one (for example, at least one row) of the plurality of cell strings MS is selected.

The transistor TC is turned on or off by controlling the potential of the interconnect 29. Accordingly, a column (one or a plurality of columns) of the cell array 100 is selected.

At the time of the write operation, the potentials (the source/sink of a current) of the interconnects SL and AL are controlled, thereby controlling supply of a current (or a voltage) to the interconnect 20. For example, according to the direction of the current to the supplied to the interconnect 20, one interconnect of the two interconnects SL and AL is set to a high potential (for example, a positive potential or current source side), and the other interconnect is set to a low potential (for example, a ground voltage or current sink side). At the time of the read operation, the interconnects SL and AL are set in a 0 V application state or in a floating state.

At the time of the write operation, the potential of the interconnect BL is controlled, thereby applying a voltage having a predetermined polarity and voltage value to the reference layer 12 of the MTJ element 10. At the time of the read operation, the current flowing to the selected interconnect BL or the potential of the selected interconnect BL is sensed, thereby discriminating the data in the MTJ element 10.

The interconnects BL, SL, AL, 20, 21, and 29 are controlled by the row control circuit 110, the column control circuit 120, the write circuit 140, the read circuit 150, and the calculation control circuit 170 in accordance with the operation to be executed.

Note that the circuit configuration of the cell array 100 using the cell strings MS is not limited to the example shown in FIG. 11.

In the structure shown in FIGS. 10 and 11 in which the plurality of MTJ elements 10 are arranged on one interconnect 20, the write operation and the calculation operation can be executed at once for the plurality of MTJ elements 10 by the spin hall effect by the write current Iwr supplied to the interconnect 20.

In the cell string shown in FIG. 10, when the write current Iwr is supplied into the interconnect 20, an element (selected element) to switch the magnetization of the storage layer 11 and an element (unselected element) not to switch the magnetization of the storage layer 11 may exist among the plurality of MTJ elements 10 on the interconnect 20 in the memory area 101.

In the magnetic device 1 according to this embodiment, switching/non-switching of the magnetization of the storage layer 11 is controlled by a change in the magnetization switching threshold value of the storage layer 11 upon application of the control voltage VCNT (voltage effect), as in FIG. 5 described above. In the plurality of MTJ elements 10 arrayed on the same interconnect 20, the magnetization switching threshold value Ic of the storage layer 11 of a selected element is set to a value equal to or less than the current value of the write current Iwr by the potential state shown in (a) of FIG. 5, and the magnetization switching threshold value Ic of the storage layer 11 of an unselected element is set to a value larger than the current value of the write current Iwr by the potential state shown in (b) of FIG. 5.

When the current value of the write current Iwr is set in consideration of the variation in the magnetization switching threshold value of the storage layer 11 by the voltage effect, the magnetic device according to this embodiment can selectively switch the magnetization of the storage layer 11 for the plurality of MTJ elements 10 arrayed on the same interconnect 20.

This can implement reduction of energy consumption (for example, power consumption) per bit and reduction of the cell size in the magnetic device 1 according to this embodiment.

In the magnetic device (spintronics device) using the spin hall effect and the voltage effect as in this embodiment, the magnetic memory (spin memory) is called a Voltage Control Spintronics Memory (VoCSM). Additionally, in this embodiment, the magnetic logic circuit using the spin hall effect and the voltage effect is called a Voltage Control Spintronics Logic (VoCSL).

Configuration Example of Calculation Control Circuit

Figure 12:
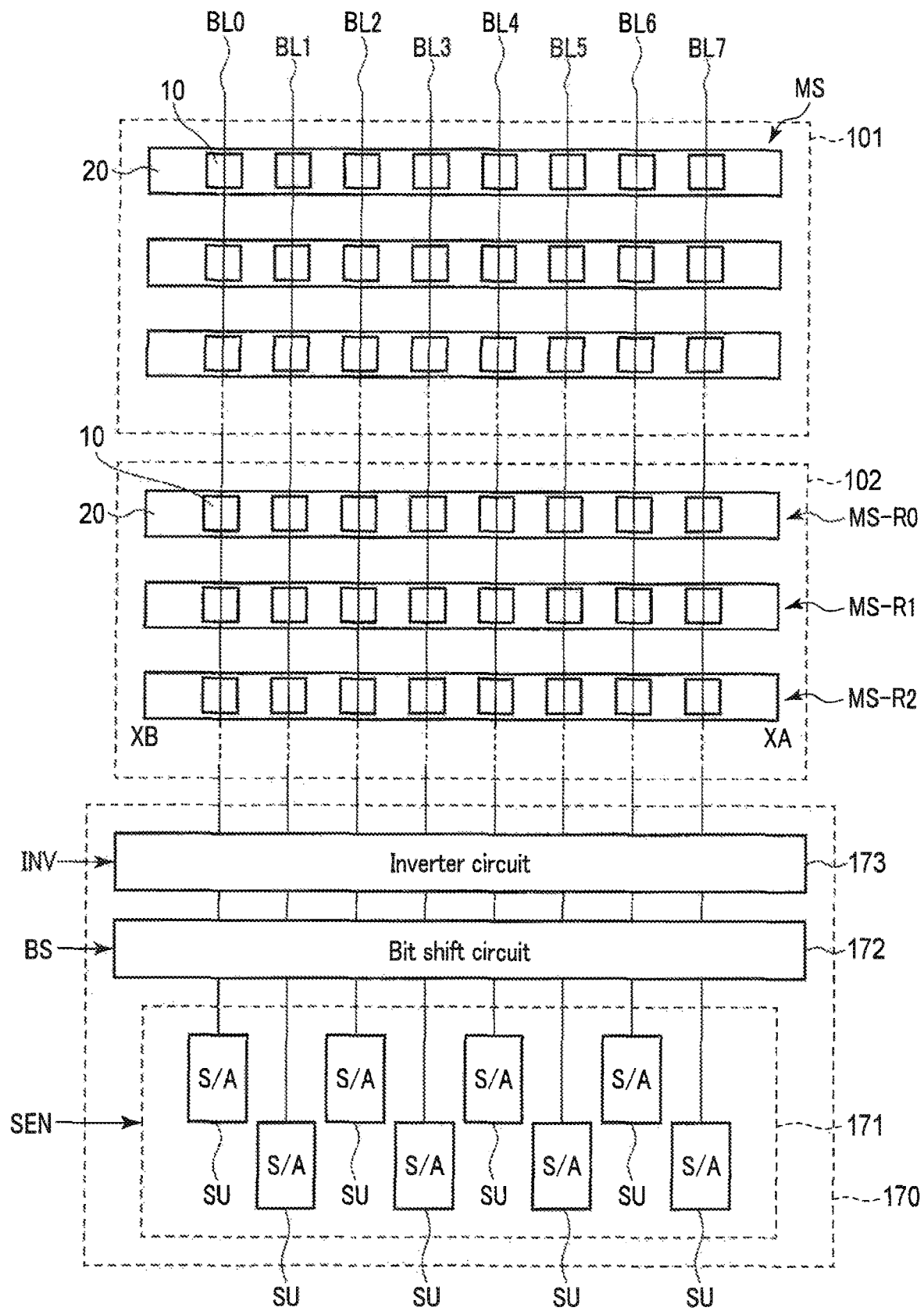

FIG. 12 is an equivalent circuit diagram showing an example of the calculation control circuit in the magnetic device according to this embodiment.

As shown in FIG. 12, the calculation control circuit 170 includes a sense amplifier circuit 171, a bit shift circuit 172, and an inverter circuit 173.

The circuits 171, 172, and 173 are commonly connected to the cell strings MS in the memory area 101 and the cell strings MS-R in the calculation processing area 102 via the bit lines BL.

For example, the calculation control circuit 170 may be configured such that a switch circuit (not shown) connects one of the plurality of circuits 171, 172, and 173 to the bit lines BL in accordance with the operation to be executed for the cell strings. In addition, the calculation control circuit 170 may be connected to the cell array 100 via the column control circuit 120.

The sense amplifier circuit 171 includes a plurality of sense amplifier units SU.

The sense amplifier units SU correspond to the bit lines BL on a one-to-one basis. One sense amplifier unit SU is connected to one bit line BL.

The sense amplifier unit SU can sense the potential of the bit line BL and/or a current generated in the bit line BL. The sense amplifier unit SU can amplify the sensed signal. The sense amplifier unit SU can charge and discharge the bit line BL.

The operation of the sense amplifier circuit 171 is controlled by a control signal SEN from the control circuit 190.

Note that the sense amplifier circuit 171 may be shared by the calculation control circuit 170 and the read circuit 150.

The bit shift circuit 172 shifts a signal received from each bit line BL to the left side (the XB side of the interconnect 20) or right side (the XA side of the interconnect 20). The bit shift circuit 172 outputs the shifted signals to the bit lines BL. In bit shift of data of a binary number, the bit shift circuit 172 can increase the value of the data to $2^k$ times by performing shift (left shift) to the upper bit k times. In bit shift of data of a binary number, the bit shift circuit 172 can decrease the value of the data to $\frac{1}{2}^k$ times by performing shift (right shift) to the lower bit k times.

The operation of the bit shift circuit 172 is controlled by a control signal BS from the control circuit 190. The bit shift circuit 172 is, for example, a shift register.

The inverter circuit 173 can invert the potentials (signal levels) of the bit lines BL. The inverter circuit 173 executes an inversion (a NOT operation) for signals (data of the MTJ elements and data from the outside) output to the bit lines BL.

The operation of the inverter circuit 173 is controlled by a control signal INV from the control circuit 190.

Calculation processing for data is executed under the control of the circuits 171, 172, and 173.

Note that the calculation control circuit 170 may include a common constituent element that is also usable by the write circuit 140 and the read circuit 150, and the circuits 140, 150, and 170 may be provided as one integrated circuit.

(b) Operation Example

An operation example of the magnetic device according to this embodiment will be described with reference to FIGS. 13 to 44.

(b-1) Data Writing to Cell String

Figure 13:
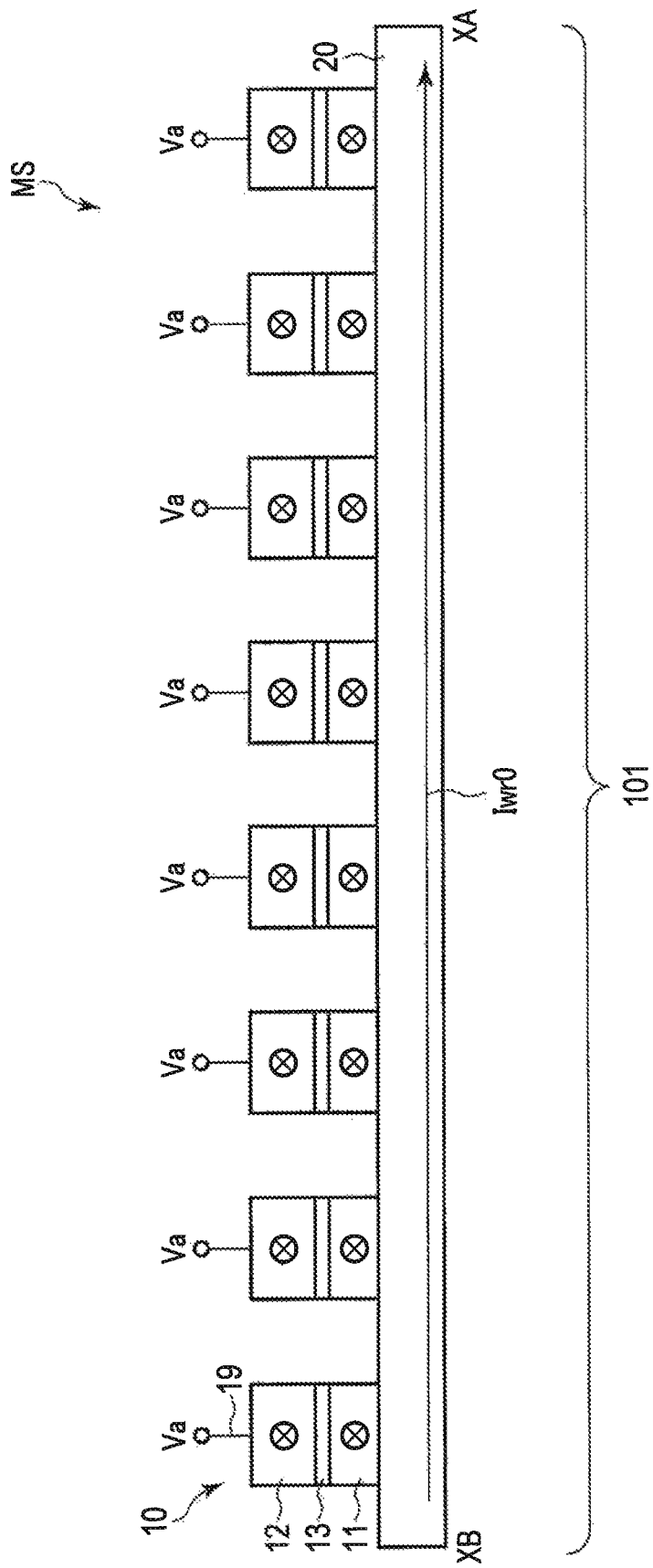
Figure 14:
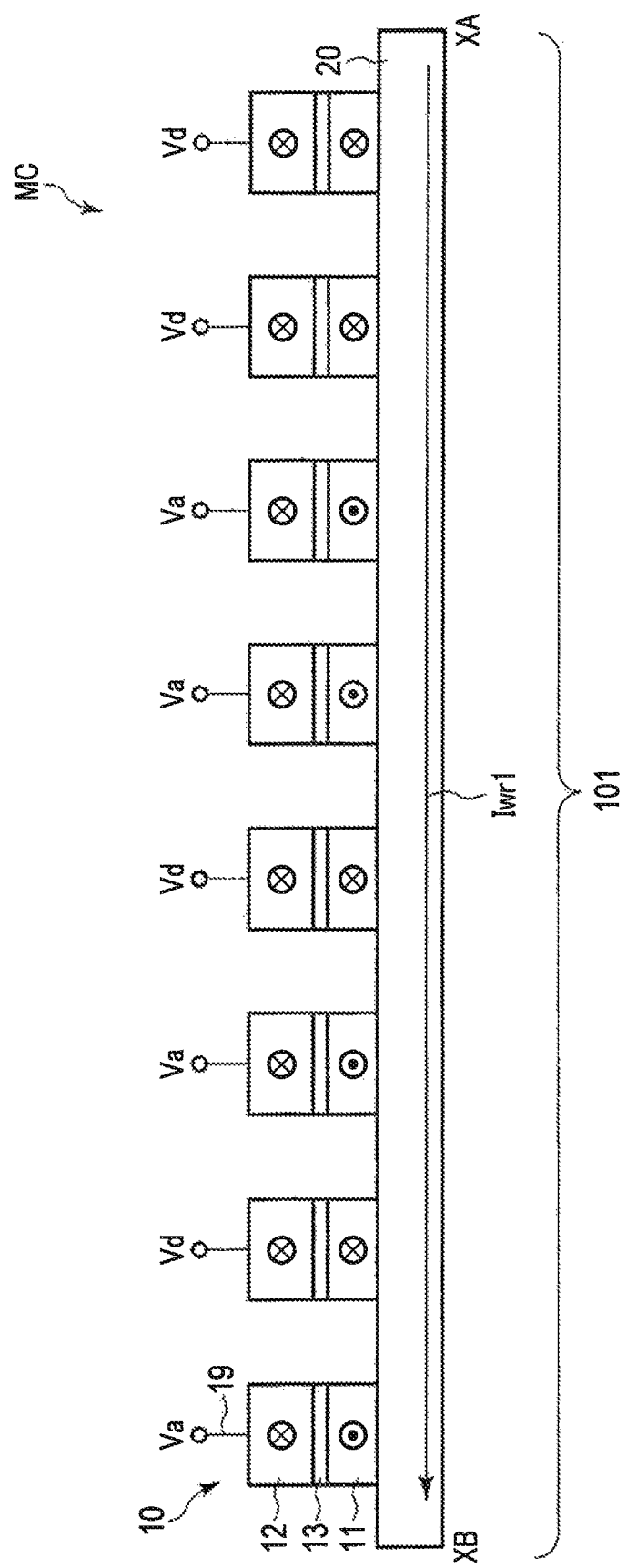

FIGS. 13 and 14 are views for explaining data writing to the memory area of the magnetic device according to this embodiment.

For example, in this embodiment, a data write operation (magnetization switching operation) to the cell string MS is executed by programs of two cycles (program steps).

In this embodiment, when writing 1-bit data ("0" data and "1" data) to each MTJ element 10 in the cell string MS, the write operation includes a first program and a second program. In the first program, writing of one of "0" and "1" data is executed. In the second program, writing of the other of "0" and "1" data is executed.

In a case in which eight (8-bit) MTJ elements 10 are arranged on one interconnect 20, as in the example shown in FIG. 13 described above, the data holding state of the cell string MS is initialized in the first program. For example, the magnetization alignment states of all the eight MTJ elements 10 are set to the P state by initializing the cell string MS in the following way.

A control voltage having a predetermined polarity and voltage value (here, the control voltage VCNT having the negative voltage value Va) is applied to the reference layers 12 of the eight MTJ elements 10 via the transistors TC in the ON state to decrease the magnetization switching threshold values Ic of the storage layers of all the MTJ elements 10 on the interconnect 20.

In a state in which all the MTJ elements 10 on the interconnect 20 are set to selected elements, the "0" program current Iwr0 is supplied to the interconnect 20 via the transistors TA and TB in the ON state.

In a state in which the magnetization switching threshold values Ic of the storage layers 11 are decreased, a spin current by the spin hall effect is supplied to the MTJ elements 10 on the interconnect 20.

Accordingly, in the first program, all the MTJ elements 10 on the interconnect 20 hold "0" data.

In the second program after the first program, 8-bit data (for example, "10101100") to be written is written to the MTJ elements 10. Data including a plurality of bits will also be referred to as a data set hereinafter.

As shown in FIG. 14, when writing of data ("0" data) corresponding to the P state is executed in the first program, the MTJ elements 10 to which data ("1" data) corresponding to the AP state should be written are set to selected elements, and the MTJ elements (MTJ elements that maintain the P state) 10 to which data corresponding to the P state should be written are set to unselected elements.

The voltage (selection voltage) VCNT having the negative voltage value Va is applied to the reference layers 12 of the MTJ elements 10 as the selected elements via the transistors TC in the ON state.

The voltage (nonselection voltage) VCNT having the positive voltage value Vd is applied to the reference layers 12 of the MTJ elements 10 as the unselected elements via the transistors TC in the ON state.

In the second program, in a state in which the selection voltage Va or the nonselection voltage Vd is applied to the MTJ elements 10, the "1" program current Iwr1 is supplied to the interconnect 20 via the transistors TA and TB in the ON state.

In this way, in the second program, in the plurality of MTJ elements 10 on the interconnect 20, the magnetization alignment of the MTJ elements 10 as the selected elements is selectively changed from the P state to the AP state, and the magnetization alignment of the MTJ elements 10 as the unselected elements is maintained in the P state by the spin hall effect and the voltage effect.

Accordingly, the MTJ elements 10 as the selected elements hold "1" data, and the MTJ elements 10 as the unselected elements hold "0" data.

As a result, in this embodiment, writing of data in all "1/0" arrangement patterns that can be formed by the plurality of MTJ elements can be implemented by the write method including two program steps.

Note that in the write operation to the cell string MS, "1" data may be written to the cell string MS in the first program, and "0" data may be written to the cell string MS in the second program.

The data is written to the cell string MS in the memory area 101 in the above-described way.

In the magnetic device 1 according to this embodiment, data can thus be stored in the memory area 101 of the cell array 100.

(b-2) Data Load to Calculation Processing Area

FIG. 15 is a schematic view for explaining data load from the memory area 101 to the calculation processing area 102 in the operation example of the magnetic device according to this embodiment.

At the time of execution of the calculation operation, data of a calculation target in the memory area 101 is loaded (copied) from the memory area 101 to the calculation processing area 102.

Before the data load, one or more cell strings MS in the calculation processing area 102 are initialized by substantially the same operation as the write operation shown in FIGS. 13 and 14 described above. To initialize the one or more cell strings MS, "0" data written to the MTJ elements (logic cells) 10 in the calculation processing area 102.

In the initialization operation of the calculation processing area 102, the selection voltage Va is applied to the reference layers 12 of all the MTJ elements 10 in the one or more selected cell strings (to be referred to as selected strings hereinafter) MS via the bit lines BL.

In a state in which the selection voltage Va is applied, the "0" program current Iwr0 is supplied into the interconnect 20.

Accordingly, in the calculation processing area 102, "0" data is written to all the MTJ elements 10 in the selected strings MS. The selected strings MS in the calculation processing area 102 are thus set in the initial state.

As shown in FIG. 15, the data MD (for example, "10101100" data) of a calculation target is read from the MTJ elements 10 in the memory area 101 to the bit lines BL. For example, the data MD is "10101100" data.

For data reading, the cell string MS holding the data MD of the calculation target is selected. The sense amplifier circuit 171 sets the potentials of the bit lines BL to "H" level.

The source line SL and the access line AL are electrically connected to the interconnect 20 via the transistors TA and TB in the ON state.

The transistor TC is set in the ON state, and the bit lines BL of "H" level are electrically connected to the MTJ elements 10. The potentials of the bit lines BL vary in accordance with the held data (resistance states) of the MTJ elements 10.

Accordingly, the held data MD of the MTJ elements 10 is reflected on the potentials of the bit lines BL. The data MD is read based on the potential variation in the bit lines BL.

The read data MD is written to the one or more cell strings (for example, two cell strings) MS in the calculation processing area 102.

All the MTJ elements 10 in the cell strings MS hold "0" data by the initialization operation for the calculation processing area 102. For this reason, writing of "1" data is executed for the MTJ elements 10 in the cell strings MS.

The potentials of the bit lines BL are controlled based on the read data (the data of the calculation target). At the time of writing of "1" data, the selection voltage Va is applied to the selected elements 10, and the nonselection voltage Vd is applied to the unselected elements 10.

As explained with reference to FIG. 14 described above, in a state in which the selection voltage Va and the nonselection voltage Vd are applied to the MTJ elements 10, the "1" program current Iwr1 is supplied to the interconnect 20.

In the selected strings MS in the calculation processing area 102, "1" data is written to the selected MTJ elements 10. The unselected MTJ elements 10 maintain the "0" data holding state.

Accordingly, in the calculation processing area 102, the MTJ elements 10 in the cell strings MS hold the data of the MTJ elements 10 in the cell strings MS in the memory area 101. The data of the cell strings MS in the memory area 101 are copied into the cell strings MS in the calculation processing area 102.

In this way, the data MD of the cell strings MS is the memory area 101 are loaded to the cell strings MS in the calculation processing area 102.

Note that when writing the same data MD to a plurality of cell strings, the write operation for data load can be executed substantially simultaneously for the plurality of cell strings MS.

For the sake of descriptive clarity, data of a cell string (MTJ element) in the calculation processing area 102 will also be referred to as register data hereinafter.

(b-3) Logic Operation

A plurality of logic operations that the magnetic device according to this embodiment can execute will be described with reference to FIGS. 16 to 24.

<AND Operation>

FIGS. 16 to 19 are schematic views for explaining an AND operation using the MTJ elements of the magnetic device according to this embodiment.

The AND operation of the memory data MD in the cell string MS in the memory area 101 and input data ZD is executed. Here, the data (8-bit data) MD in the cell string MS is, for example, "10101011". For example, the 8-bit input data ZD from the outside is "11111111".

Figure 16:
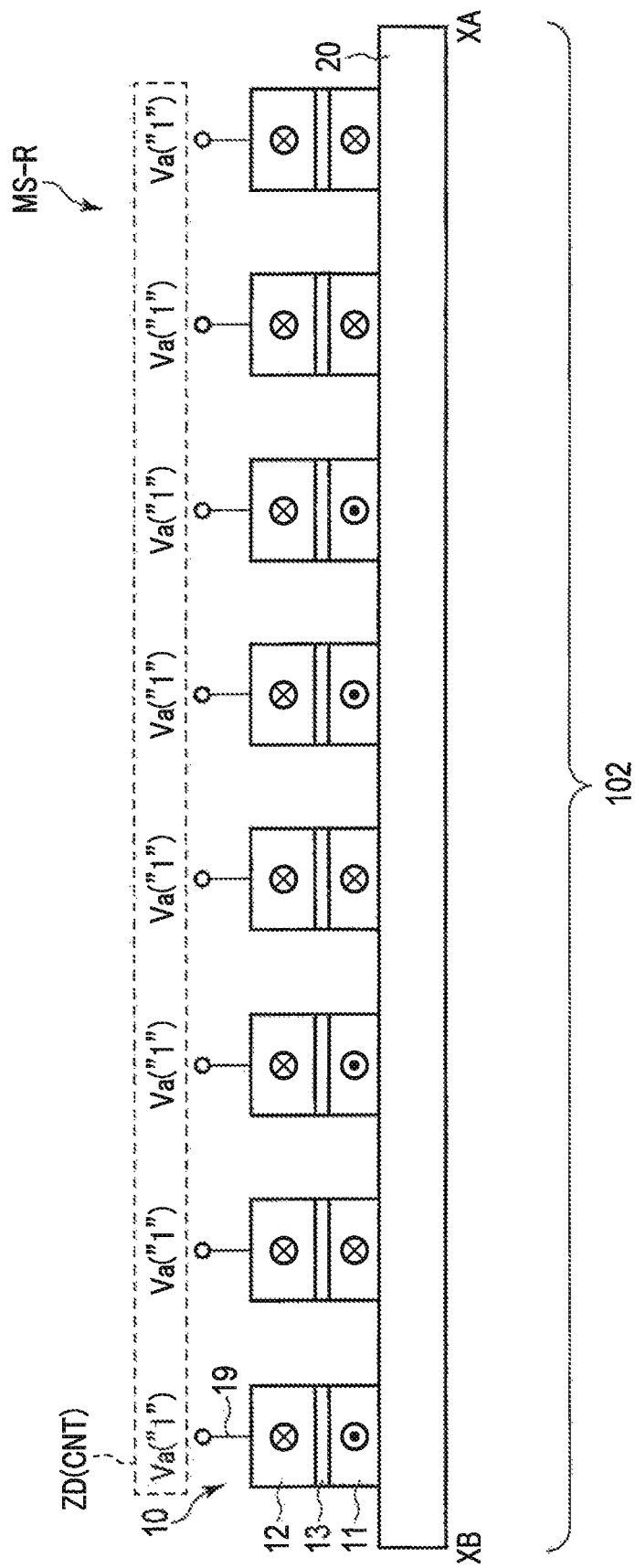

As shown in FIG. 16, the data MD in the selected cell string MS is loaded (copied) to the cell string MS-R in the calculation processing area 102, as explained with reference to FIG. 15 described above.

Accordingly, the memory data MD is written to the cell string MS-R in the calculation processing area 102.

The input data ZD is transferred to the bit lines BL. The potential of each bit line BL is set to a potential corresponding to 1-bit data. The potentials of the bit lines BL corresponding to the input data ZD are applied to the reference layers 12 of the MTJ elements 10 via the control terminals 19 of the MTJ elements 10 as the potentials CNT of the control voltages VCNT by the sense amplifier circuit 171. For example, the voltage value Va corresponds to "1" data, and the voltage value Vd corresponds to "0" data.

As in FIG. 6 described above, in the magnetic device 1 according to this embodiment, the AND operation of the data ZD and the memory data MD using the MTJ element 10 corresponds to an operation of supplying a spin current derived from the "0" program current Iwr0 to the MTJ element 10 holding the data (memory data) MD in a state in which inverted data bZD of the data ZD is applied to the MTJ element 10 as the inverted potential bCNT of the potential CNT of the control voltage VCNT.

For this reason, when performing the AND operation of the memory data MD and the input data ZD, the potential corresponding to the input data ZD on the bit line BL is inverted.

Figure 17:
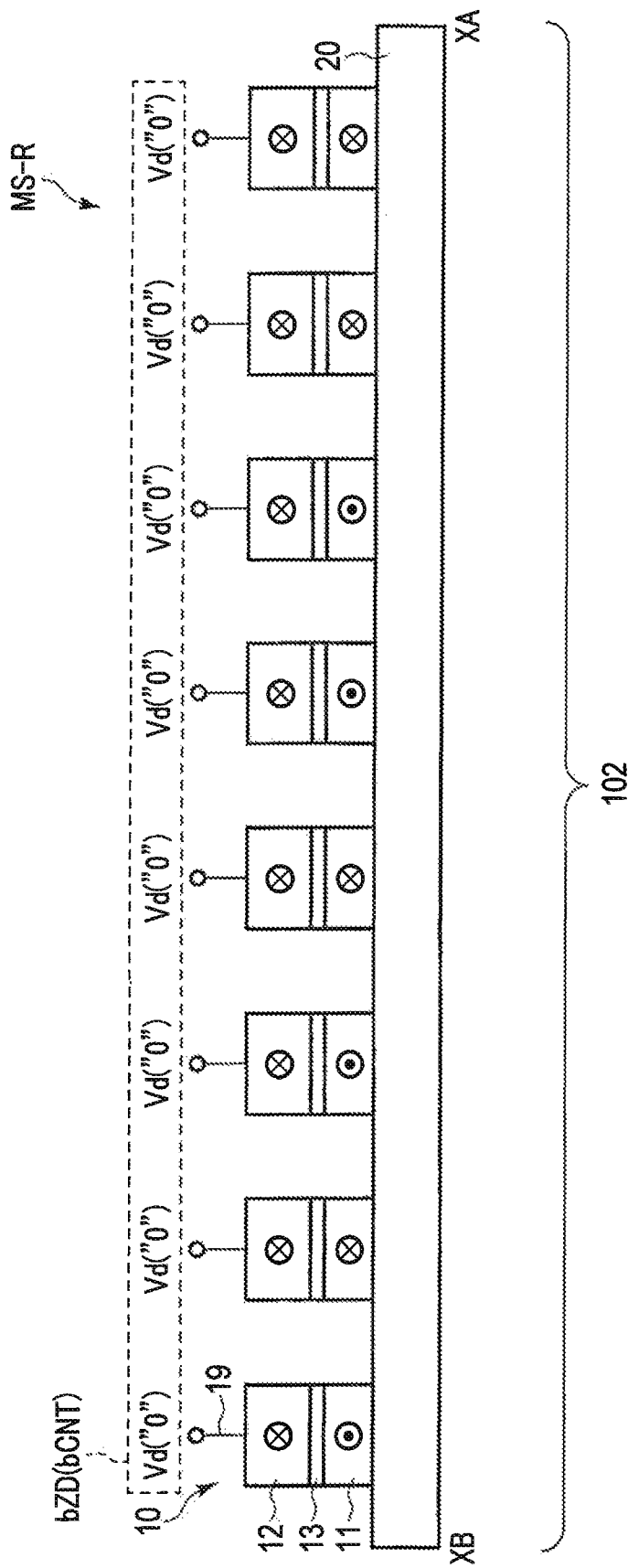

As shown in FIG. 17, when executing the AND operation, the inverter circuit 173 inverts the potential of the bit line BL. The voltage value Vd is thus applied to the MTJ element 10.

Figure 18:
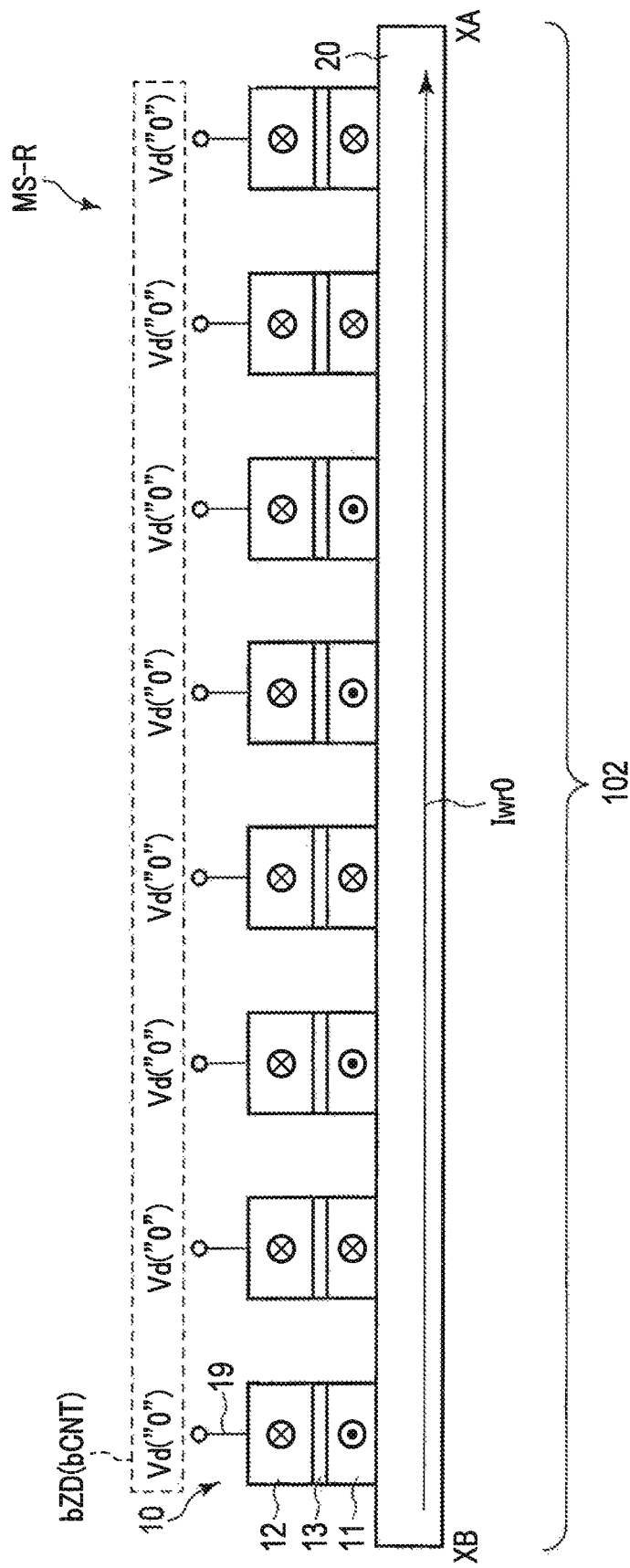

As shown in FIG. 18, the write circuit 140 supplies the "0" program current Iwr0 from the side of the terminal XB of the interconnect 20 to the side of the terminal XA.

Figure 19:
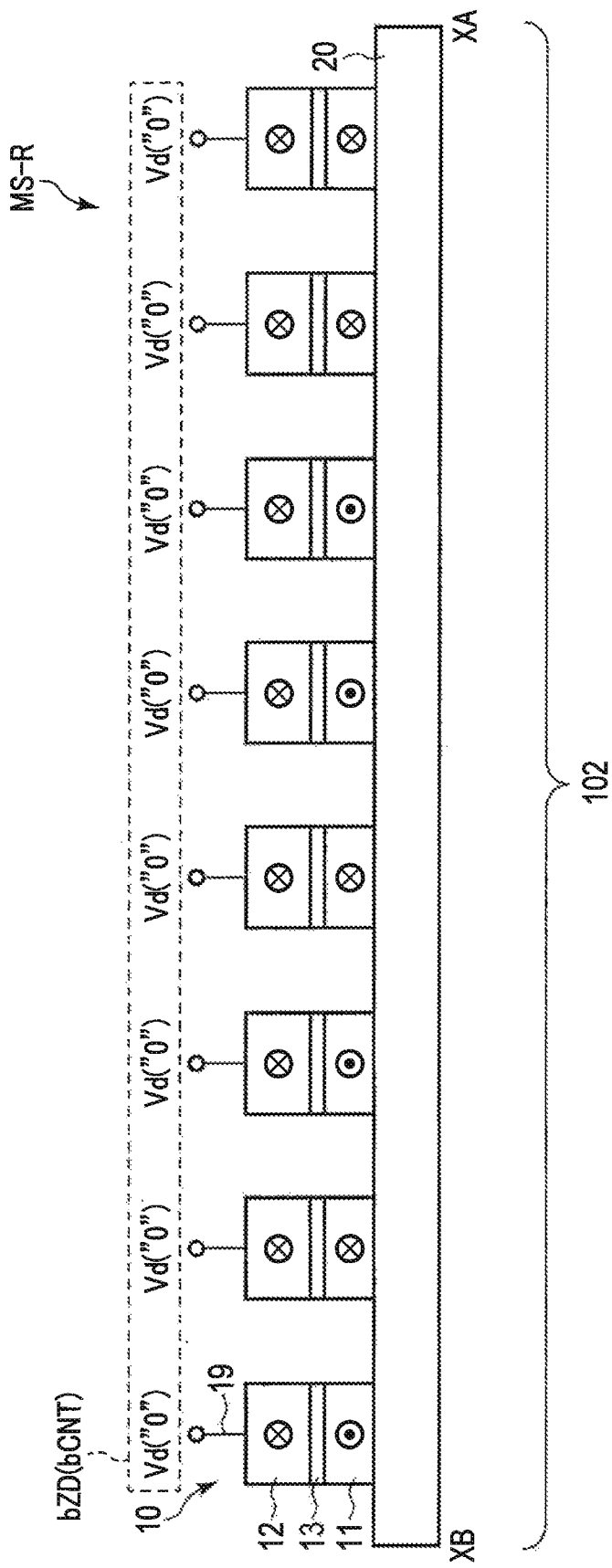

As a result, as shown in FIG. 19, when the "0" program current Iwr0 is supplied to the interconnect 20 in a state in which the nonselection voltage ("0" data) Vd is applied to the MTJ elements 10, the magnetization of the storage layer 11 of each MTJ element 10 does not switch. For this reason, the MTJ element 10 holds the same data as the data before the supply of the "0" program current Iwr0.

When the "0" program current Iwr0 is supplied to the interconnect 20 in a state in which the selection voltage ("1" data) Va is applied to the MTJ elements 10, the magnetization of the storage layer 11 of each MTJ element 10 in the "1" data holding state switches. Accordingly, the data of the MTJ element 10 changes from "1" data to "0" data.

When the "0" program current Iwr0 is supplied to the interconnect 20 in a state in which the selection voltage Va is applied to the MTJ elements 10 the magnetization of the storage layer 11 of each MTJ element 10 in the "0" data holding state does not switch. Accordingly, the data of the MTJ element 10 remains "0" data.

As described above, in the cell string MS-R in the calculation processing area 102 to which the "0" program current Iwr0 is supplied, the data holding state (the direction of magnetization of the storage layer 11) of each MTJ element 10 after the supply of the program current Iwr0 is set to a value corresponding to the potential bCNT of the bit line (gate) BL and the data MD loaded (copied) to the MTJ element 10.

Hence, a value corresponding to the result of the AND operation between the memory data MD and the input data ZD is held by each MTJ element 10 in the cell string MS.

In the magnetic device according to this embodiment, the AND operation using the MTJ elements is executed in the above-described way.

<OR Operation>

Figure 20:
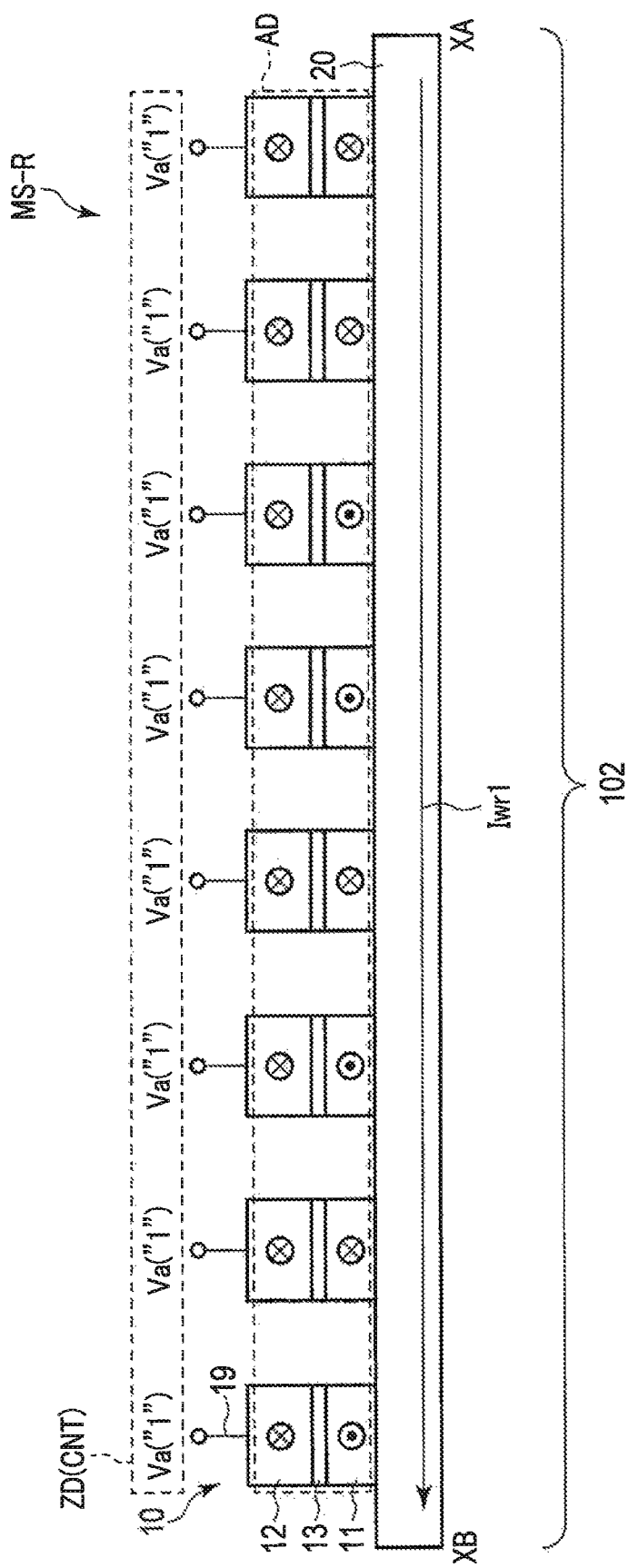
Figure 21:
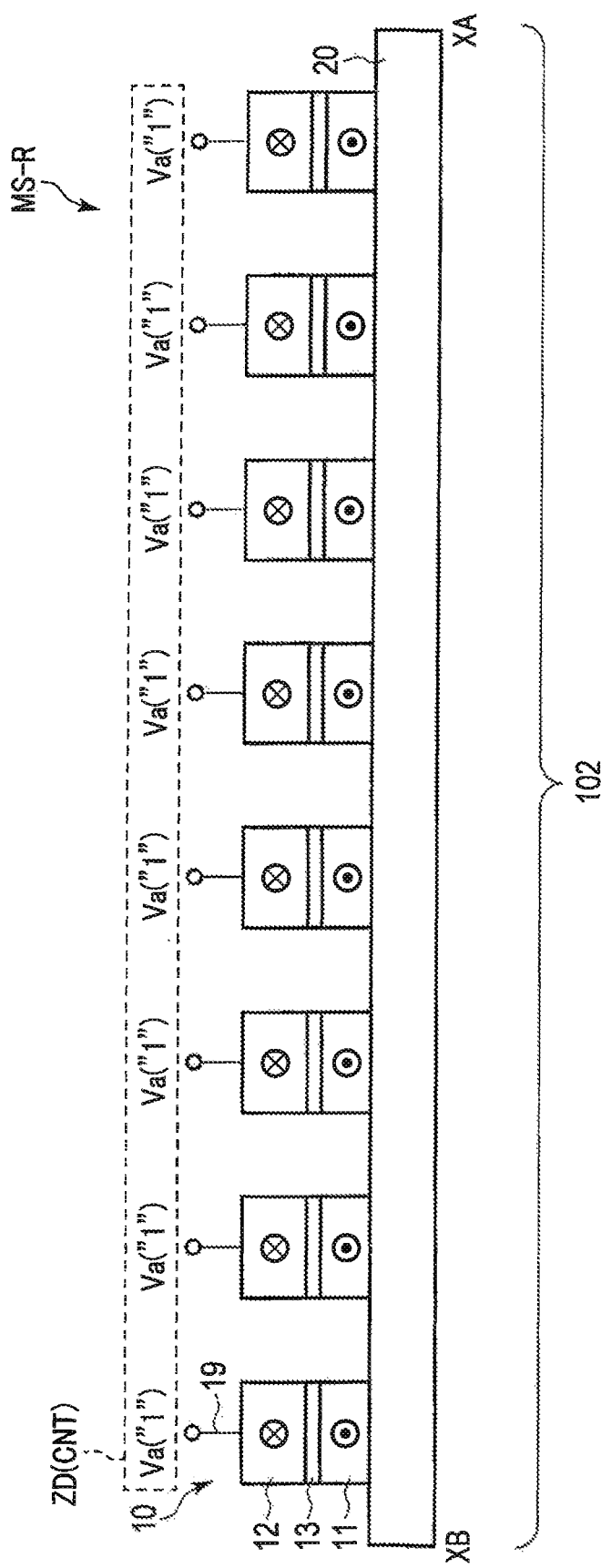

FIGS. 20 and 21 are schematic views for explaining an OR operation using the MTJ elements of the magnetic device according to this embodiment.

As shown in FIG. 20, the data MD in the selected cell string MS in the memory area 101 is loaded into the cell string MS-R in the calculation processing area 102, as in the example shown in FIG. 16 described above. Input data ZD (here, "11111111") from the outside is transferred to the bit lines BL, as in the example shown in FIG. 17 described above.

As in FIG. 7 described above, in the magnetic device 1 according to this embodiment, the OR operation of the data ZD and the memory data MD using the MTJ element 10 corresponds to an operation of supplying a spin current derived from the "1" program current Iwr1 to the MTJ element 10 holding the memory data MD in a state in which the data ZD is applied to the MTJ element 10 as the potential CNT of the control voltage VCNT.

The write circuit 140 supplies the "1" program current Iwr1 from the side of the terminal XA of the interconnect 20 to the side of the terminal XB.

As a result, as shown in FIG. 21, when the "1" program current Iwr1 is supplied to the interconnect 20 in a state in which the selection voltage ("1" data) Va is applied to the MTJ elements 10, the magnetization of the storage layer 11 of each MTJ element 10 in the "0" data holding state switches. Accordingly, the data of the MTJ element 10 changes from "0" data to "1" data.

When the "1" program current Iwr1 is supplied to the interconnect 20 in a state in which the selection voltage Va is applied to the MTJ elements 10, the magnetization of the storage layer 11 of each MTJ element 10 in the "1"-data holding state does not switch. Accordingly, the data of the MTJ element 10 remains "1" data.

When the "1" program current Iwr1 is supplied to the interconnect 20 in a state in which the nonselection voltage ("0" data) Vd is applied to the MTJ elements 10, the magnetization of the storage layer 11 of each MTJ element 10 does not switch. For this reason, the MTJ element 10 holds the same data as the data before the supply of the "1" program current Iwr1.

As described above, in the cell string MS in the calculation processing area 102 to which the "1" program current Iwr1 is supplied, the data holding state (the direction of magnetization of the storage layer) of each MTJ element 10 is set to a value corresponding to the potential CNT of the bit line (control gate) BL and the data MD loaded (copied) to the MTJ element 10.

Hence, a value corresponding to the result of the OR operation between the memory data MD and the input data ZD is held by each MTJ element 10 in the cell string MS.

In the magnetic device according to this embodiment, the OR operation using the MTJ elements is executed in the above-described way.

<XOR Operation>

Figure 23:
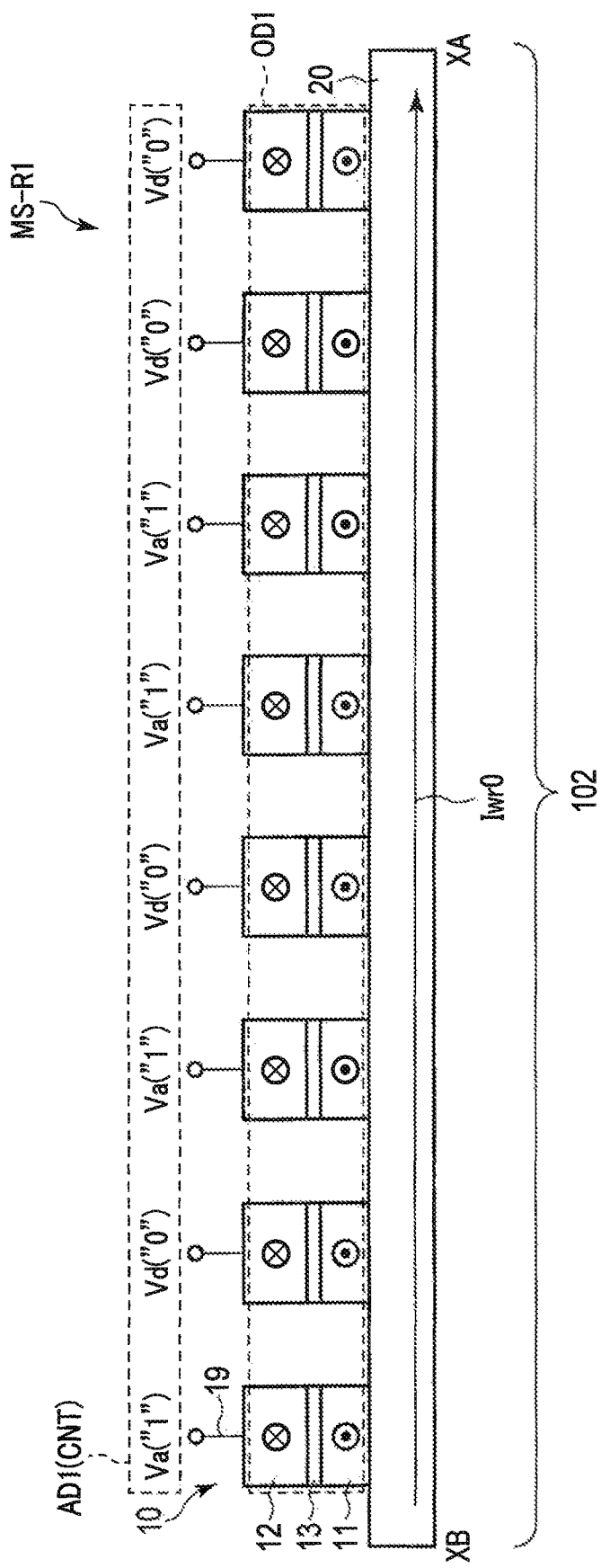

FIGS. 22 and 23 are schematic views for explaining an exclusive disjunction (XOR) operation using the MTJ elements of the magnetic device according to this embodiment.

In this embodiment, the result of the XOR operation using the MTJ elements is obtained using the result of the OR operation and the result of the AND operation.

As shown in FIG. 22, at the time of execution of the XOR operation, the data MD (here, "10101100") in the cell string MS in the memory area 101 is loaded to two cell strings MS-R1 and MS-R2 in the calculation processing area 102.

As shown in FIGS. 20 and 21 described above, the input data ZD (here, "11111111") from the outside is transferred to the bit lines BL. To execute the OR operation for the data in the cell string MS-R1, the "1" program current is supplied into the interconnect 20 of the cell string MS-R1.

Accordingly, a result OD1 of the OR operation between the data MD and the data ZD is held in the cell string MS-R1.

As shown in FIGS. 16 to 18 described above, to execute the AND operation for the data MD in the cell, string MS-R2, the potentials of the bit lines BL are inverted by the inverter circuit 173. After that, the "0" program current Iwr0 is supplied into the interconnect 20 of the cell string MS-R2.

Accordingly, a result AD1 of the AND operation between the data MD and the data ZD is held in the cell string MS-R2.

As shown in FIG. 23, the result AD1 of the AND operation is read to the bit lines BL by the sense amplifier circuit 171.

To execute the AND operation between the result OD1 of the OR operation and the negative logic of the result AD1 of the AND operation for the data MD and the data ZD, the "0" program current Iwr0 is supplied into the interconnect 20 of the cell string MS-R1 that holds the result OD1 of the OR operation in a state in which the potential CNT of each bit line BL is set to a value corresponding to the value of each bit of the result AD1 of the AND operation.

The operation shown in FIG. 23 is the AND operation between the data OD1 and the negative logic of the data AD1 (the inverted data of the data AD1). The XOR operation between the data MD and the data ZD is equivalent to the AND operation between the negative logic of the result of the AND operation for the data MD and the data ZD and the result of the OR operation for the data MD and the data ZD.

For this reason, the operation shown in FIG. 23 is equivalent to the result obtained by executing the XOR operation of the two data MD and ZD.

Figure 24:
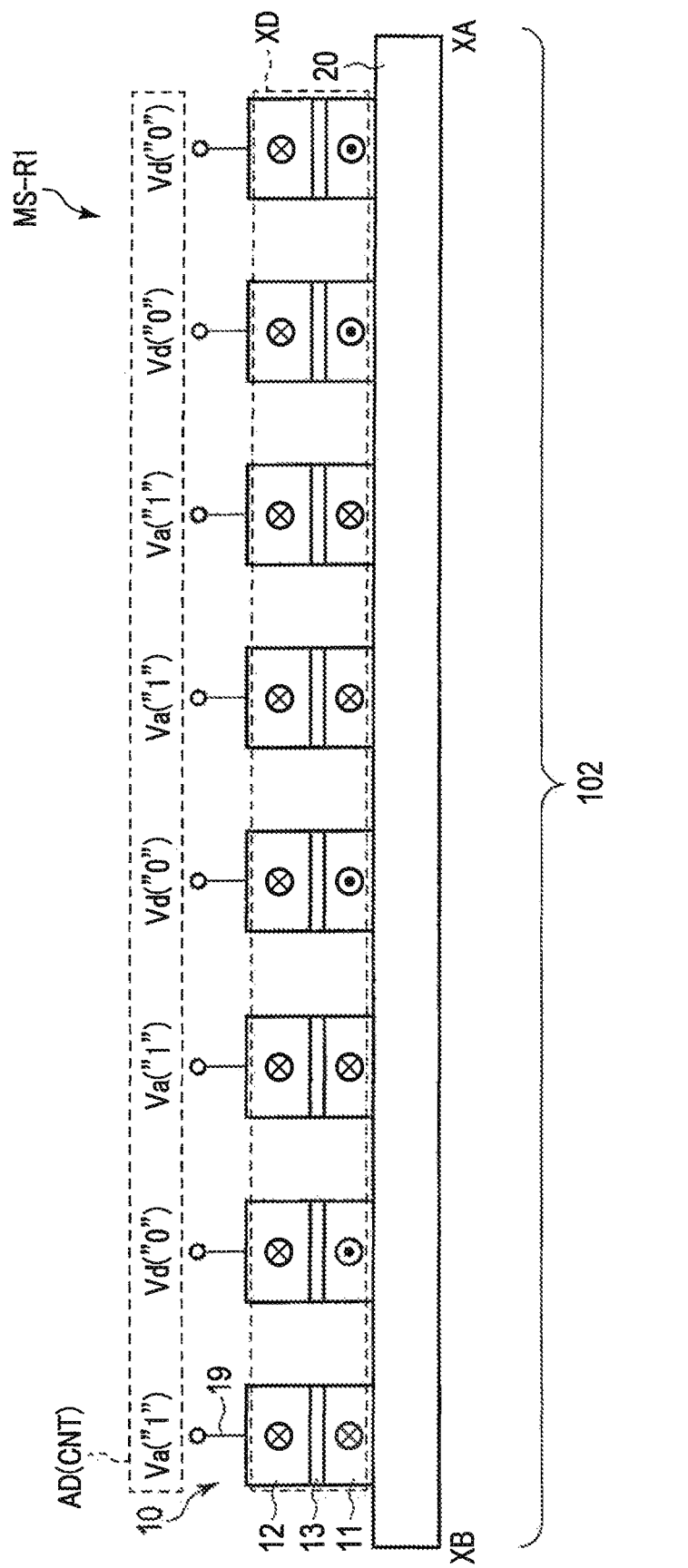

Hence, as shown in FIG. 24, held data XD of the cell string MS-R1 has a value corresponding to the XOR operation between the memory data MD and the input data ZD.

In this way, the value corresponding to the result of the XOR operation between the memory data MD and the input data ZD is held by the MTJ elements 10 in the cell string MS-R1.

In the magnetic device according to this embodiment, the XOR operation using the MTJ elements is executed in the above-described way.

(b-4) Calculation Operation

The calculation operation of the magnetic device according to this embodiment will be described with reference to FIGS. 25 to 44.

FIGS. 25 to 44 are schematic views for explaining an example of the calculation operation of the magnetic device according to this embodiment.

For example, the magnetic device according to this embodiment can implement an addition circuit by the operations shown in FIGS. 13 to 24.

The operation of the addition circuit (addition processing) using the magnetic device according to this embodiment will be described below.

In a case in which addition processing of 8-bit data is executed, the addition circuit of the magnetic device according to this embodiment executes processing in eight cycles.

<First Cycle>

Calculation processing using the input data ZD from the outside (for example, the host device 900) is executed using data loaded to the MTJ elements 10 (logic cells LS) of the cell string MS-R in the calculation processing area 102.

Figure 25:
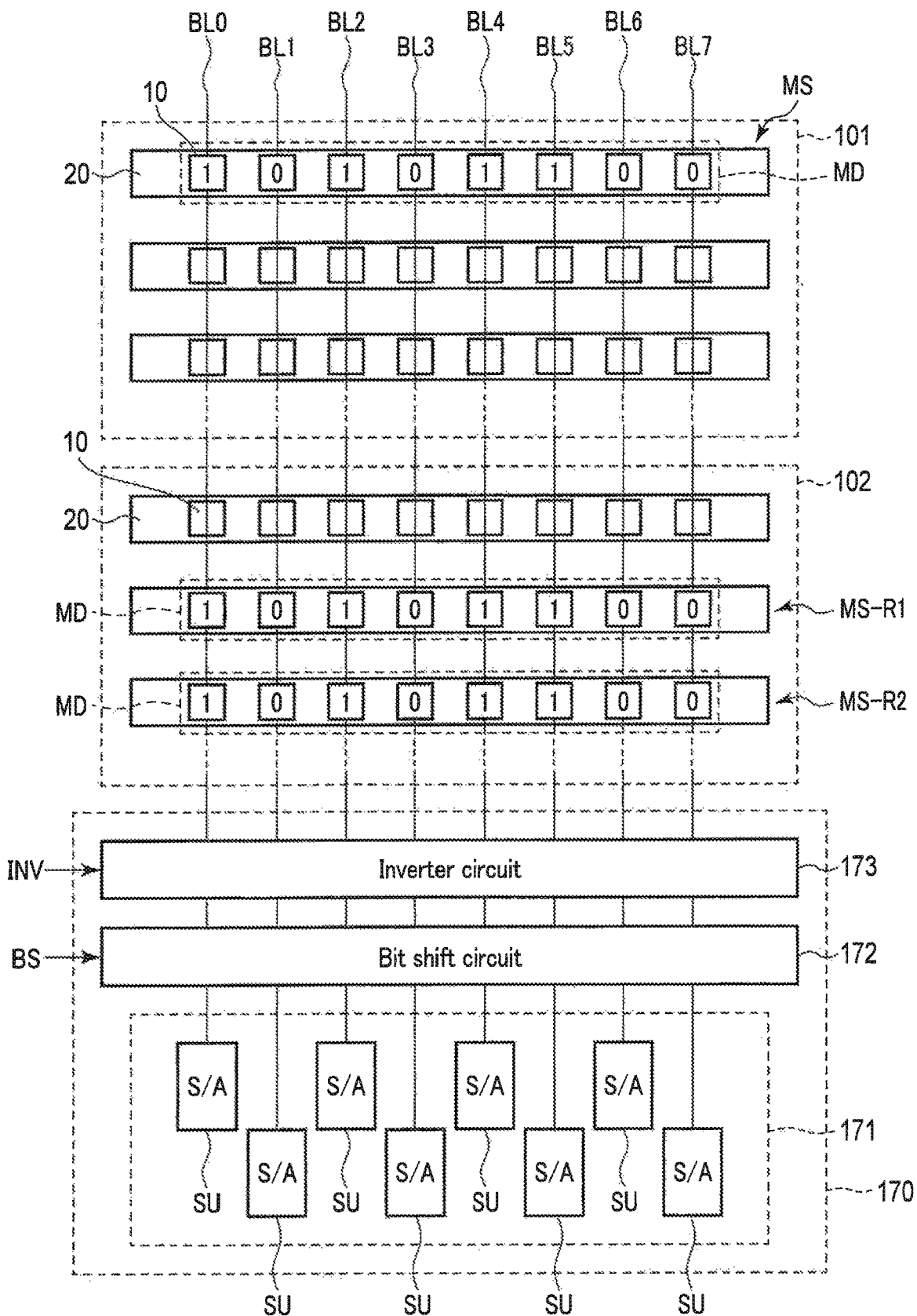

As shown in FIG. 25, the data MD in the selected cell string MS in the memory area 101 is loaded (copied) to the plurality of cell strings MS-R1 and MS-R2 in the calculation processing area 102 by the load operation described with reference to FIG. 15.

Note that the cell strings MS-R1 and MS-R2 in the calculation processing area 102 are set in an erase state before the load of the data MD.

Figure 26:
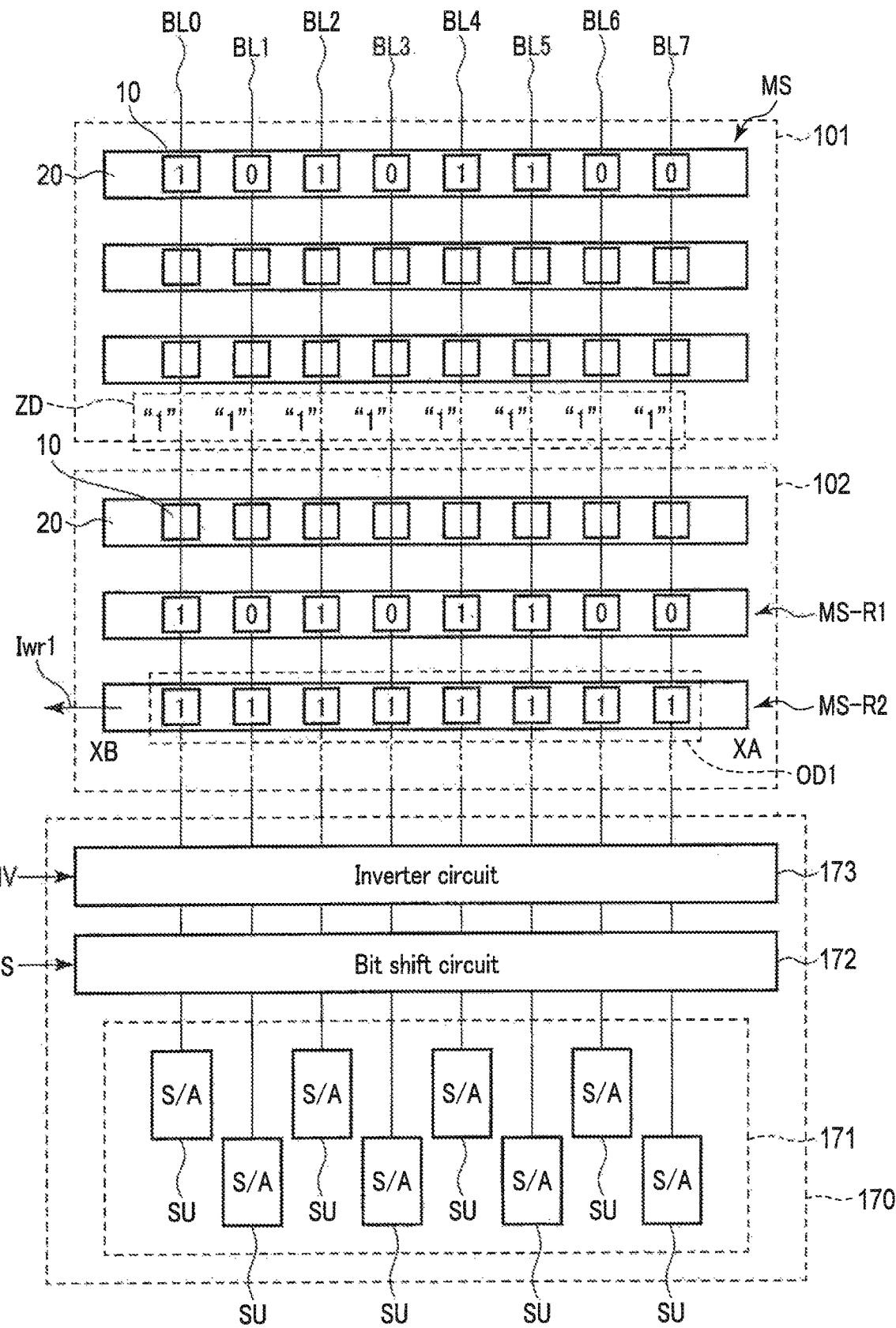

As shown in FIG. 26, the input data ZD is transferred onto the bit lines BL by the sense amplifier circuit 171. The input data ZD is reflected on the potentials of the bit lines BL as the voltage value CNT of the control voltage VCNT.

The OR operation is executed using the input data ZD and the data MD in the cell string MS-R2 by the operation described with reference to FIGS. 20 and 21.

As described above, "1" program for each MTJ element 10 corresponds to the OR operation between the voltage value CNT of the control voltage VCNT (the potential of the bit line BL) and held data. MR of the MTJ element 10.

For this reason, the potential of the bit line BL corresponding to "1" or "0" of the input data ZD is applied to the reference layer 12 of the MTJ element 10 in the cell string MS-R2 as the potential CNT of the control voltage VCNT by the sense amplifier circuit 171.

In a state in which the control voltage VCNT of the voltage value CNT according to the input data ZD is applied to the reference layer 12 of the corresponding MTJ element 10, the "1" program current Iwr1 is supplied to the interconnect 20 of the cell string MS-R2 by the write circuit 140.

Accordingly, the result OD1 of the OR operation between the input data ZD and the data MD is held by the MTJ element 10 in the cell string MS-R2. For example, in the cell string MS-R2, the data OD1 corresponding to the result of the OR operation of the data ZD and MD is "11111111".

Figure 27:
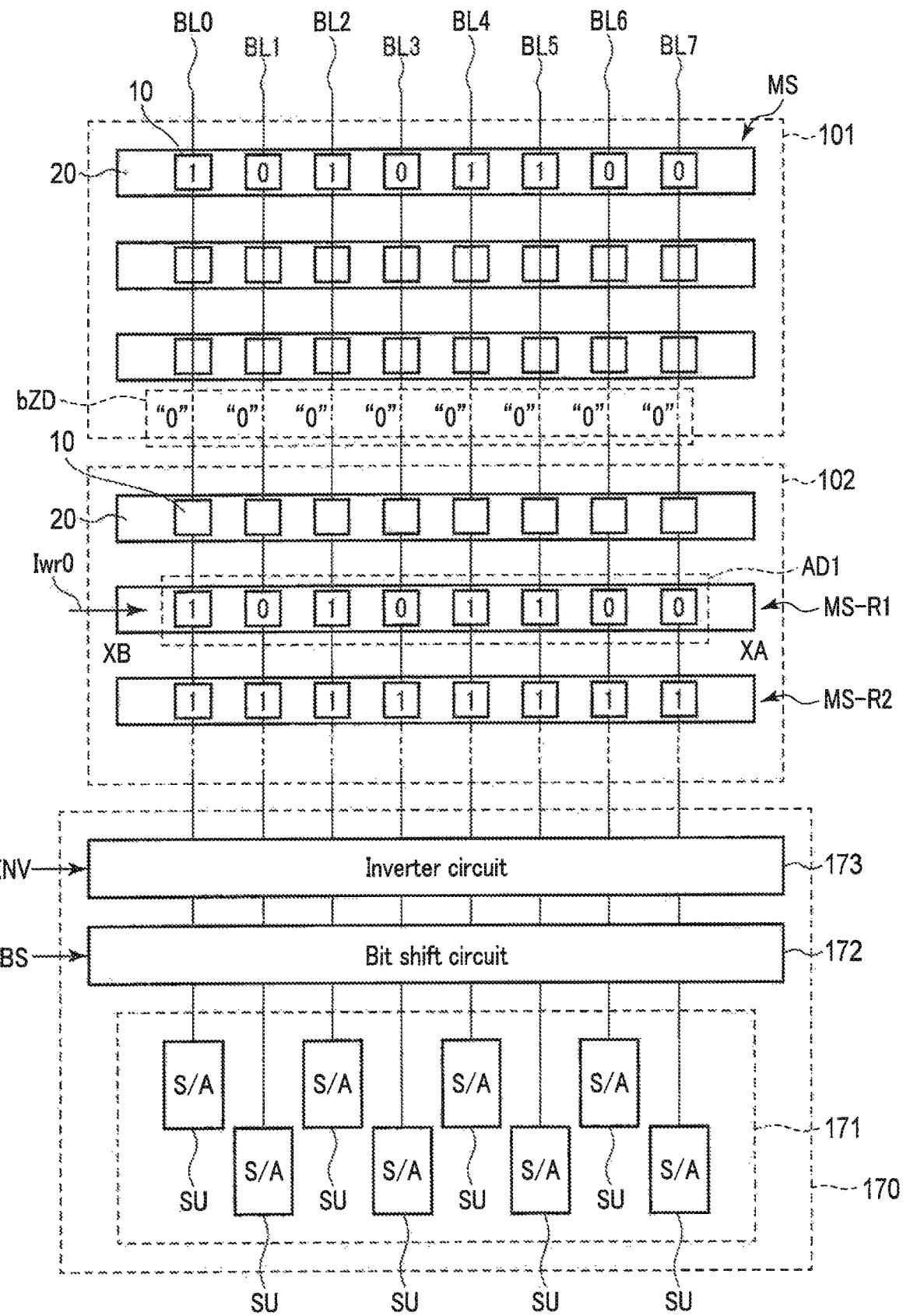

As shown in FIG. 27, the AND operation is executed using the input data ZD and the data MD of the cell string MS-R1 by the operation described with reference to FIGS. 16 to 19.

As described above, the supply of the "0" program current Iwr0 to the MTJ element 10 corresponds to the AND operation between the inverted value bCNT of the voltage value CNT of the control voltage VCNT and the held data MD of the MTJ element 10.

For this reason, the inverter circuit 173 inverts the potentials of the bit lines BL.

Accordingly, the potential of each bit line BL corresponding to the inverted data bZD of the input data ZD is applied to the reference layer 12 of the corresponding MTJ element 10 in the cell string MS-R1 as the voltage value of the control voltage VCNT. After that, the "0" program current Iwr0 is supplied to the interconnect 20 of the cell string MS-R1 by the write circuit 140.

As a result, the result AD1 of the AND operation between the input data ZD and the data MD is held by the MTJ element 10 in the cell string MS-R1. For example, in the cell string MS-R1, the data AD1 corresponding to the result of the AND operation of the data ZD and MD is "10101100".

In the above-described way, the result of the OR operation between the memory data MD and the input data ZD is stored in the cell string MS-R2 as the held data (register data) OD1. The result of the AND operation between the memory data MD and the input data ZD is stored in the cell string MS-R1 as the held data (register data) AD1.

Figure 28:
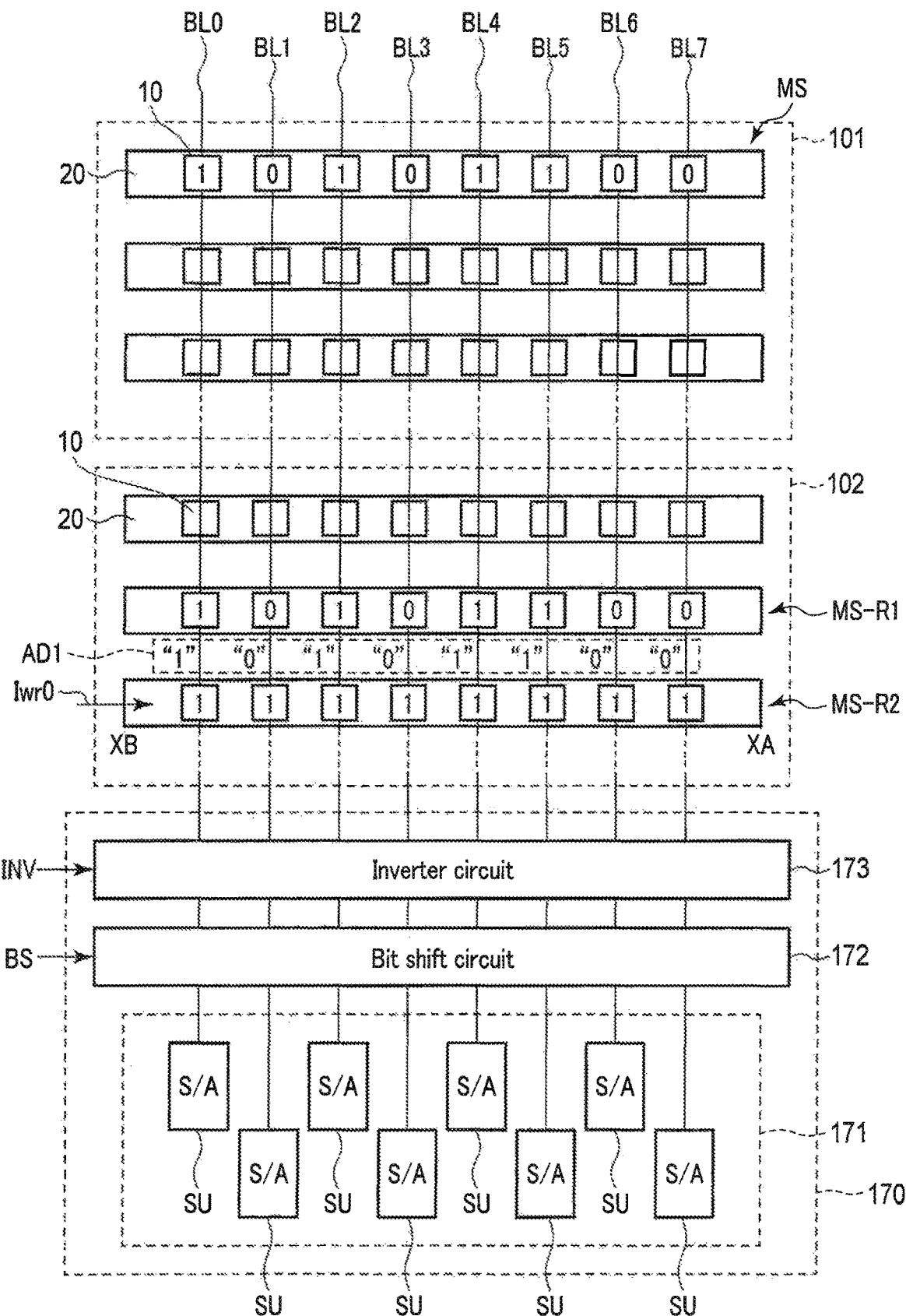

As shown in FIG. 28, the XOR operation between the memory data MD and the input data ZD is executed using the result OD1 of the OR operation and the result AD1 of the AND operation.

The result of the XOR operation between the memory data MD and the input data ZD is obtained by the operation described with reference to FIGS. 22 to 25.

The held data (the result of the AND operation) AD1 of each MTJ element 10 in the cell string MS-R1 is output to the bit line BL by reading for the cell string MS-R1 by the sense amplifier circuit 171.

In the cell string MS-R2 that holds the result OD1 of the OR operation, the write circuit 140 supplies the "0" program current Iwr0 to the interconnect 20 of the cell string MS-R2 in a state in which a potential corresponding to the result of the AND operation is held by the bit line BL.

Accordingly, the result of the AND operation between the negative logic of the data on the bit line BL (that is, the data AD1 in the cell string MS-R1) and the data OD1 in the MTJ element 10 is written to the MTJ element 10 in the cell string MS-R2.

Figure 29:
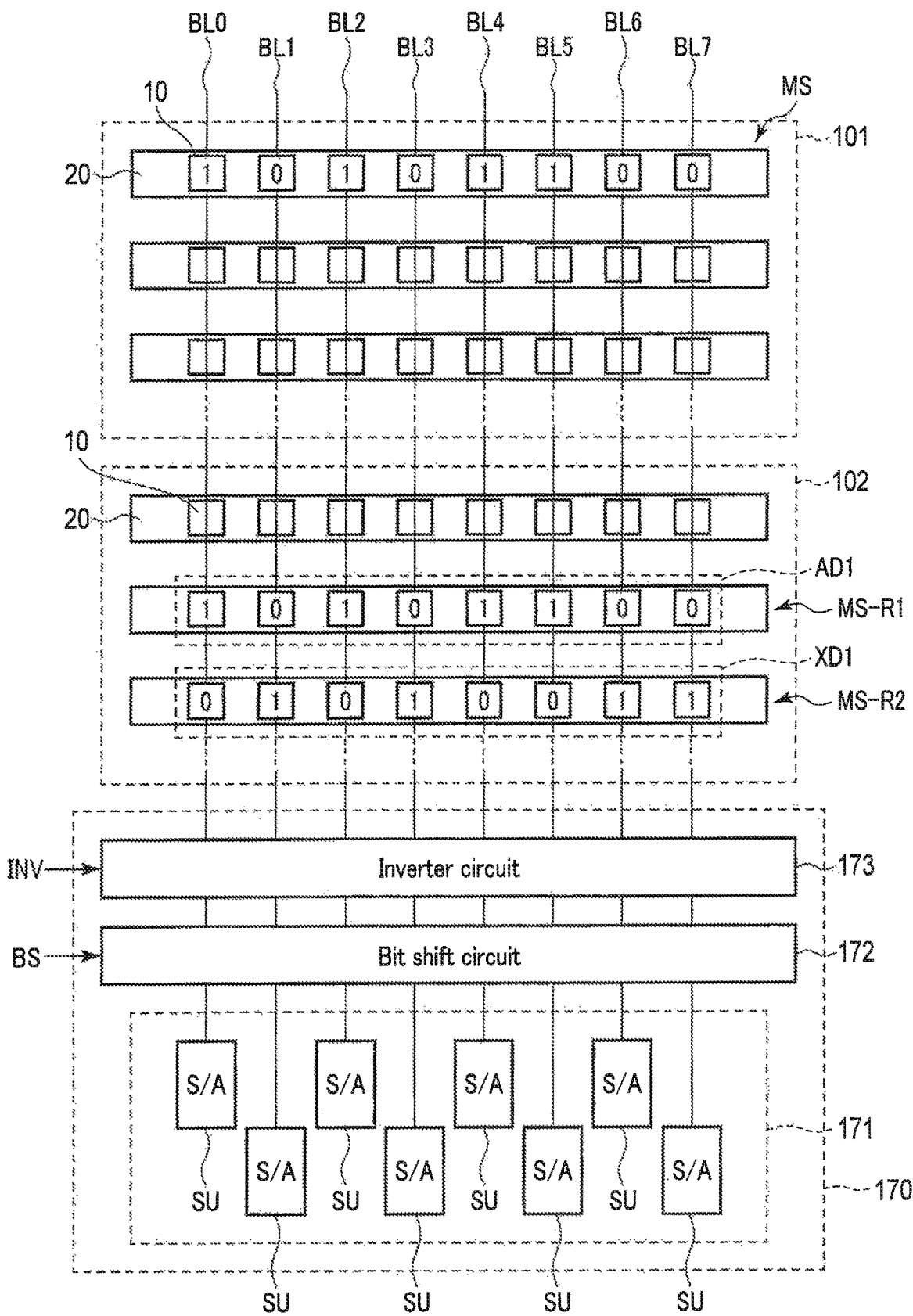

As a result, as shown in FIG. 29, the MTJ element 10 in the cell string MS-R2 holds a result XD1 of the XOR operation between the memory data MD and the input data ZD.

For example, the data XD1 corresponding to the result of the XOR operation is "01010011".

The result XD1 of the XOR operation held by the cell string MS-R2 corresponds to the result of addition in each digit of the 8-bit memory data MD and the input data ZD.

The result AD1 of the AND operation held by the cell string MS-R1 represents the presence/absence of a carry in each digit of the 8-bit memory data MD and the input data ZD. In a digit in which a carry occurs, "1" data is written to the corresponding MTJ element 10 in the cell string MS-R1. In a digit in which a carry does not occur, "0" data is written to the corresponding MTJ element 10 in the cell string MS-R1.

Figure 30:
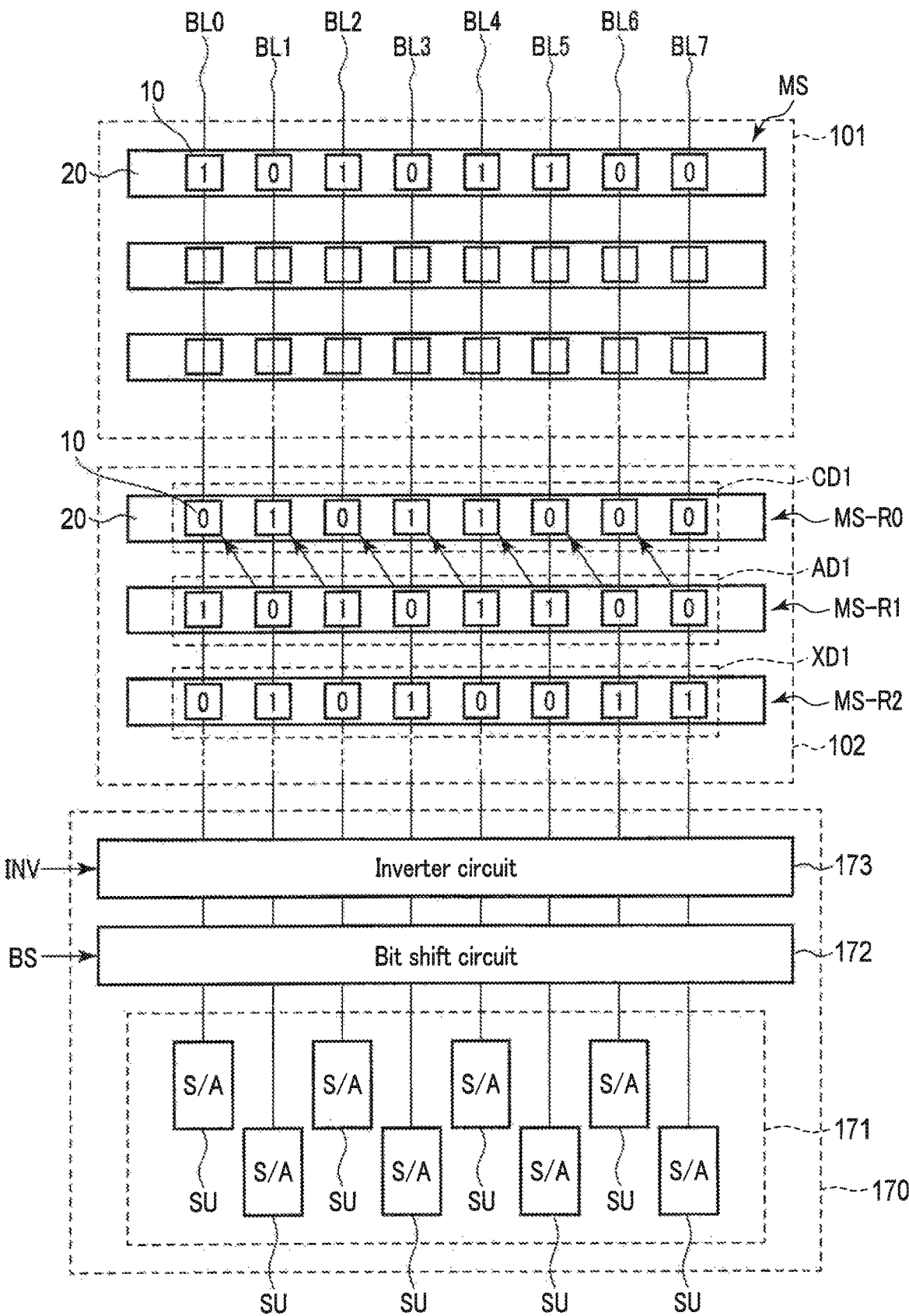

As shown in FIG. 30, data CD1 obtained by bit-shifting the data AD1 is stored in a cell string MS-R0.

For example, 8-bit data (carried data) in the cell string MS-R1 is output to the bit lines BL. The bit shift circuit 172 receives 1-bit data of each bit line BL. The bit shift circuit 172 shifts each bit (digit) of the received data to the upper side (left side in FIG. 30) by one bit. The data CD1 bit-shifted by the bit shift circuit 172 is output to the bit lines BL.

The bit-shifted data CD1 is written to the cell string MS-R0.

For example, in the cell string MS-R0 in the calculation processing area 102, the MTJ element 10 holds "0" data by the initialization operation. By "1" program current by the write circuit 140 the calculation control circuit 170), the bit-shifted data CD1 is written to the MTJ elements 10 in the cell string MS-R0.

In this way, the bit-shifted data CD1 of the result AD1 of the AND operation is stored in the cell string MS-R0.

The bit-shifted data is data representing the value of a carry. The bit-shifted data CD1 (here, the data in the cell string MS-R0) will also be referred to as carry data CD1 hereinafter.

In the first cycle of the above-described memory data MD and the input data ZD, the carry data CD1 is "01011000".

<Second Cycle>

For example, after the carry data CD1 is written to the cell string MS-R0, the data in the cell string MS-R1 is erased for the initialization operation. Accordingly, "0" data is written to all the MTJ elements 10 in the cell string MS-R1.

Figure 31:
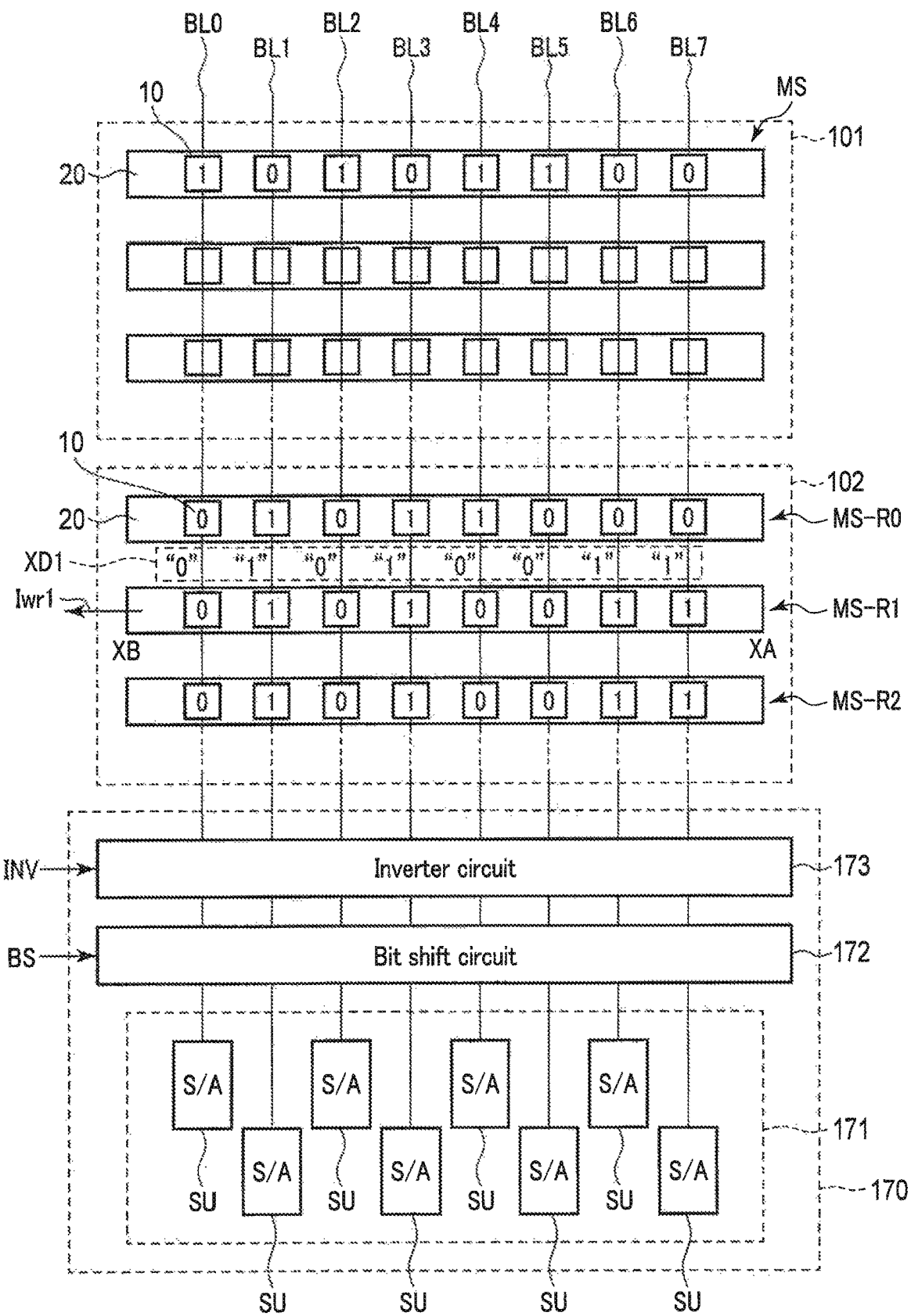

As shown in FIG. 31, the data XD1 in the cell string MS-R2 is copied to the cell string MS-R1.

The data XD1 in the cell string MS-R2 is output to the bit lines BL.

In a state in which the potentials (the voltage of the control voltage VONT) of the bit lines BL are controlled in accordance with the data XD1 in the cell string MS-R2, the "1" program current Iwr1 is supplied to the interconnect 20 of the cell string MS-R1.

Accordingly, the data XD1 of each MTJ element 10 in the cell string MS-R2 is copied to each MTJ element 10 in the cell string MS-R1. The cell string MS-R1 holds the same data as the data XD1 in the cell string MS-R2.

As shown in FIG. 32, the carry data CD1 is output to the bit lines BL. Accordingly, the potentials of the bit lines BL are controlled based on the carry data CD1.

The OR operation between the carry data CD1 and the data XD1 in the cell string MS-R2 is executed substantially as in the operation shown in FIG. 26 described above. Accordingly, data OD2 corresponding to the result of the OR operation is written to the cell string MS-R2. For example, the data OD2 is "01011011".

Figure 33:
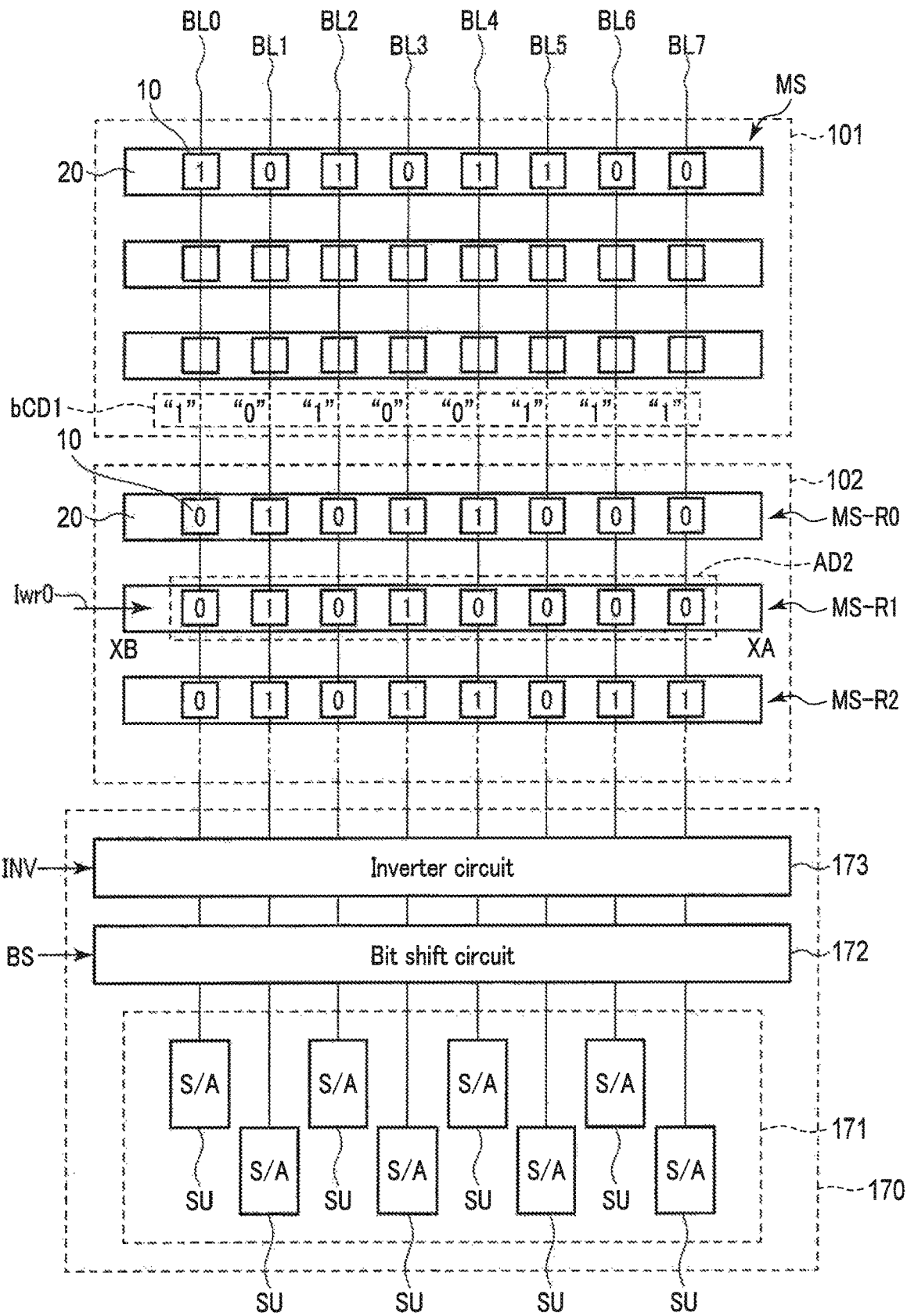

As shown in FIG. 33, the AND operation between the carry data CD1 and the data XD1 in the cell string MS-R1 is executed substantially as in the operation shown in FIG. 27. The carry data CD1 output to the bit lines BL is inverted by the inverter circuit 173.

In a state in which the potentials of the bit lines BL are set to potentials according to inverted data bCD1 of the carry data CD1, the "0" program current Iwr0 is supplied to the interconnect 20.

Accordingly, data AD2 corresponding to the result of the AND operation is written to the cell string MS-R1. For example, the data AD2 is "01010000".

Figure 34:
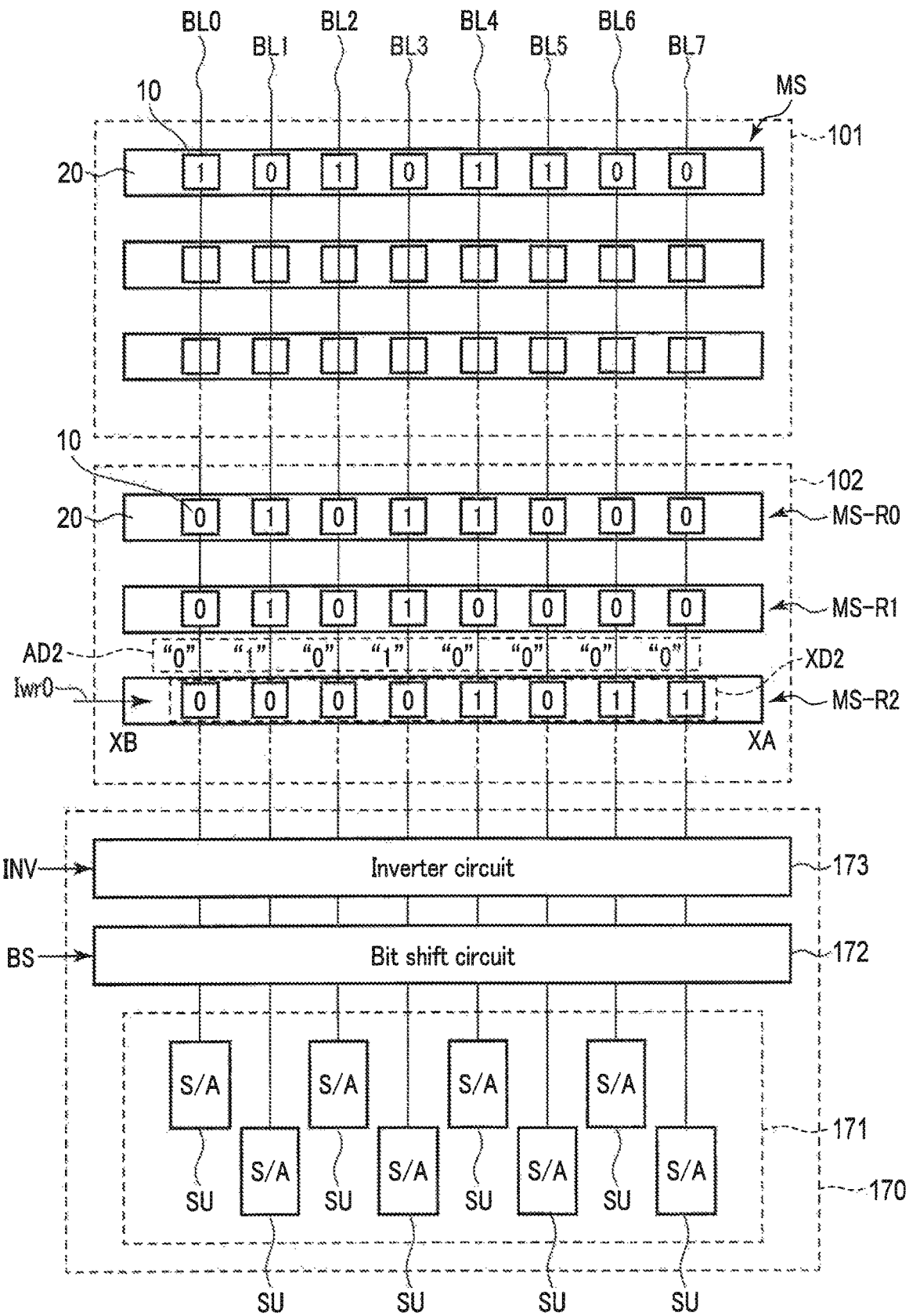

As shown in FIG. 34, the XOR operation is executed using the result (data OD2) of the OR operation and the result (data AD2) of the AND operation.

The data AD2 representing the result of the AND operation is output to the bit lines BL substantially as in the XOR operation shown in FIGS. 28 and 29 described above.

To obtain the result of the XOR operation from the data AD2 and the data (the result of the OR operation) OD2 in the cell string MS-R2, the write circuit 140 supplies the "0" program current Iwr0 to the interconnect 20 in a state in which the potentials of the bit lines BL are set to a value corresponding to the data AD2. The AND operation between the data OD2 and the negative logic (inverted data bAD2) of the data AD2 is executed.

Accordingly, a result XD2 of the XOR operation between the data XD1 and the carry data CD1 is obtained.

The cell string MS-R2 holds the result of the XOR operation as the data XD2. For example, the data XD2 is "00001011".

Figure 35:
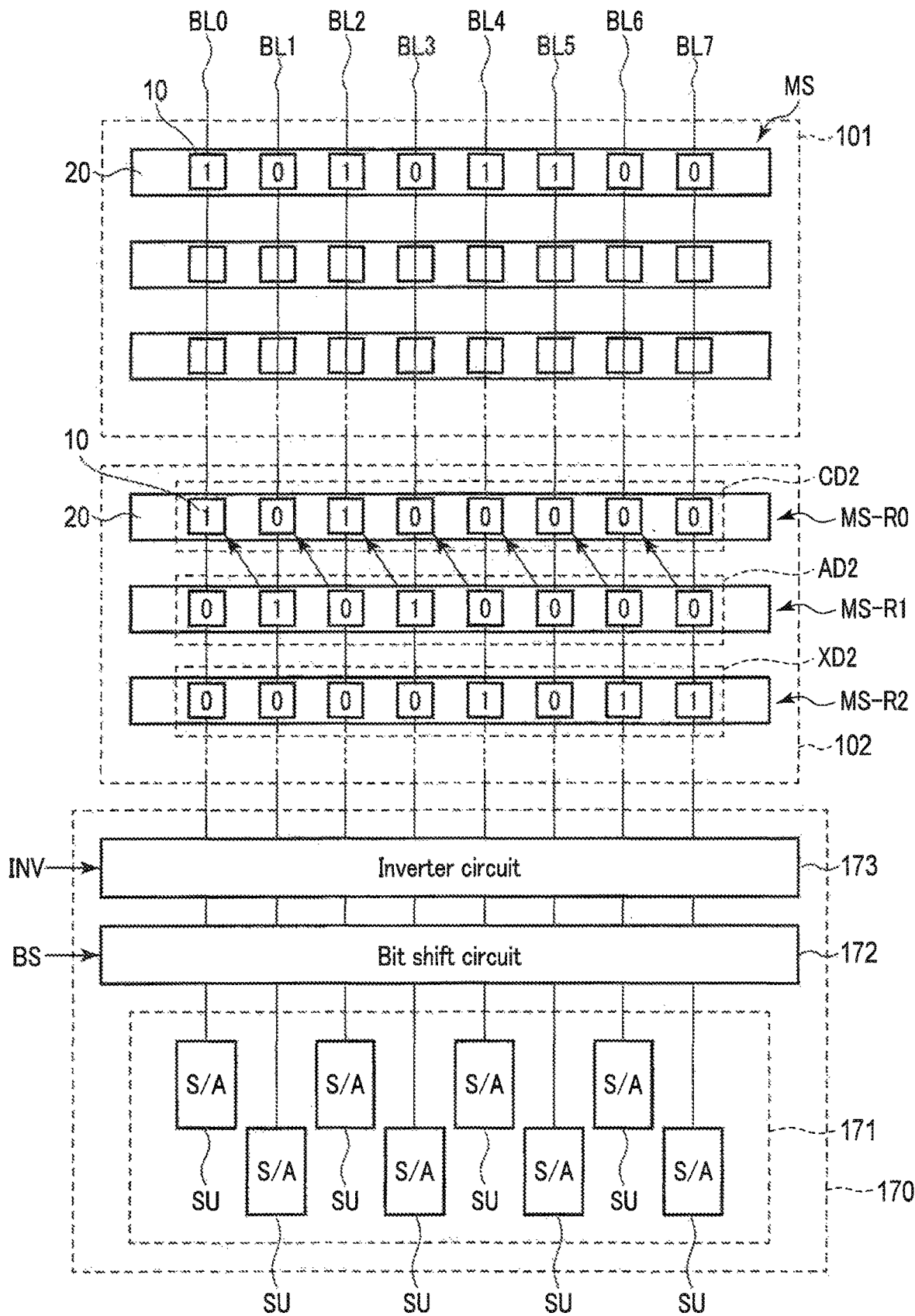

As shown in FIG. 35, in the 8-bit data AD2 held by the cell string MS-R1, each bit is bit-shifted to the upper side by one digit by the bit shift circuit 172. After the initialization operation is executed for the cell string MS-R0, the bit-shifted data (carry data) CD2 is stored in the initialized cell string MS-RG. Accordingly, the carry data in the cell string MS-R0 is updated.

The carry data CD2 is "10100000".

<Third Cycle>

Figure 36:
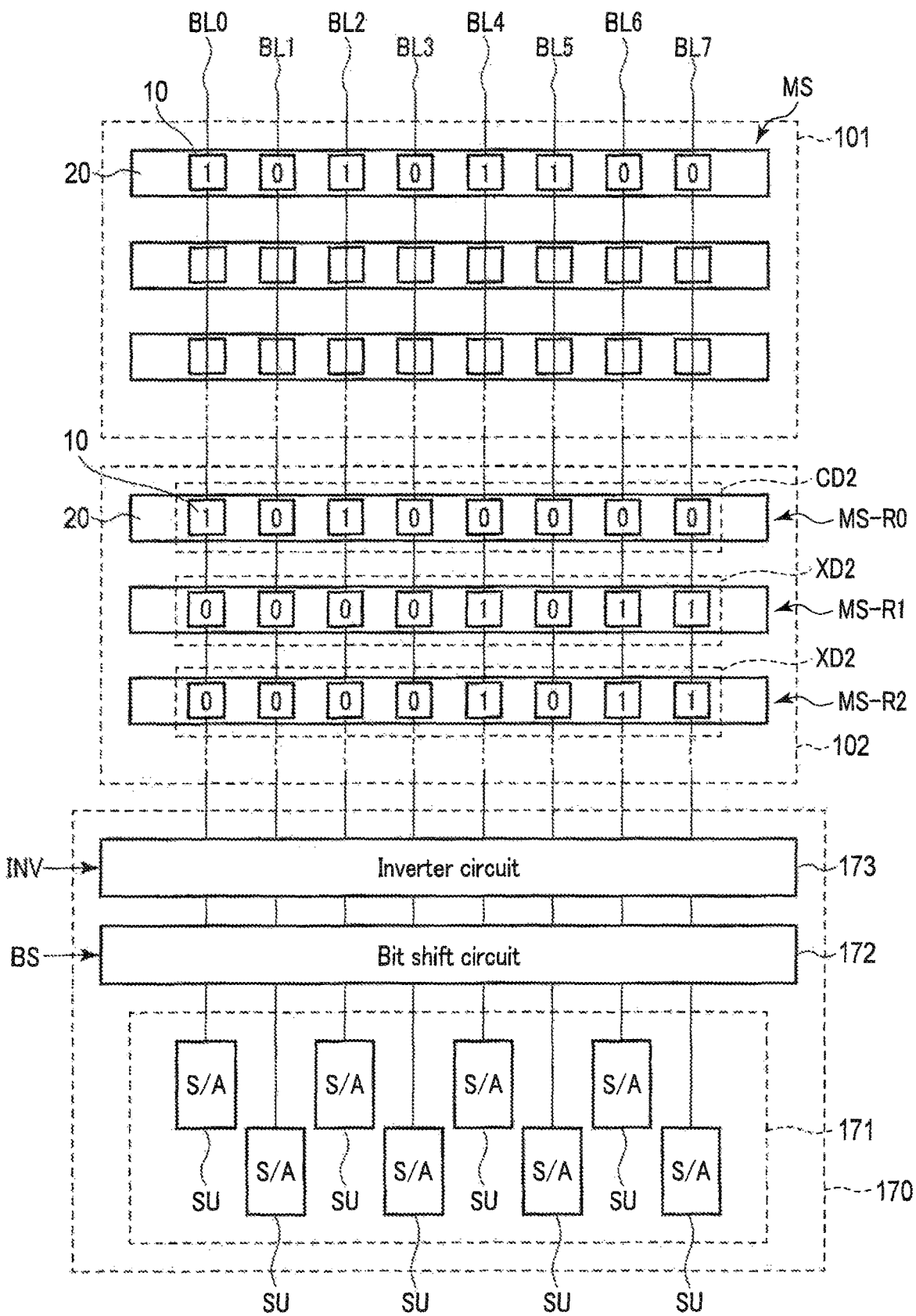

As shown in FIG. 36, after the data in the cell string MS-R1 is erased, the data XD2 in the cell string MS-R2 is copied to the cell string MS-R1.

Figure 37:
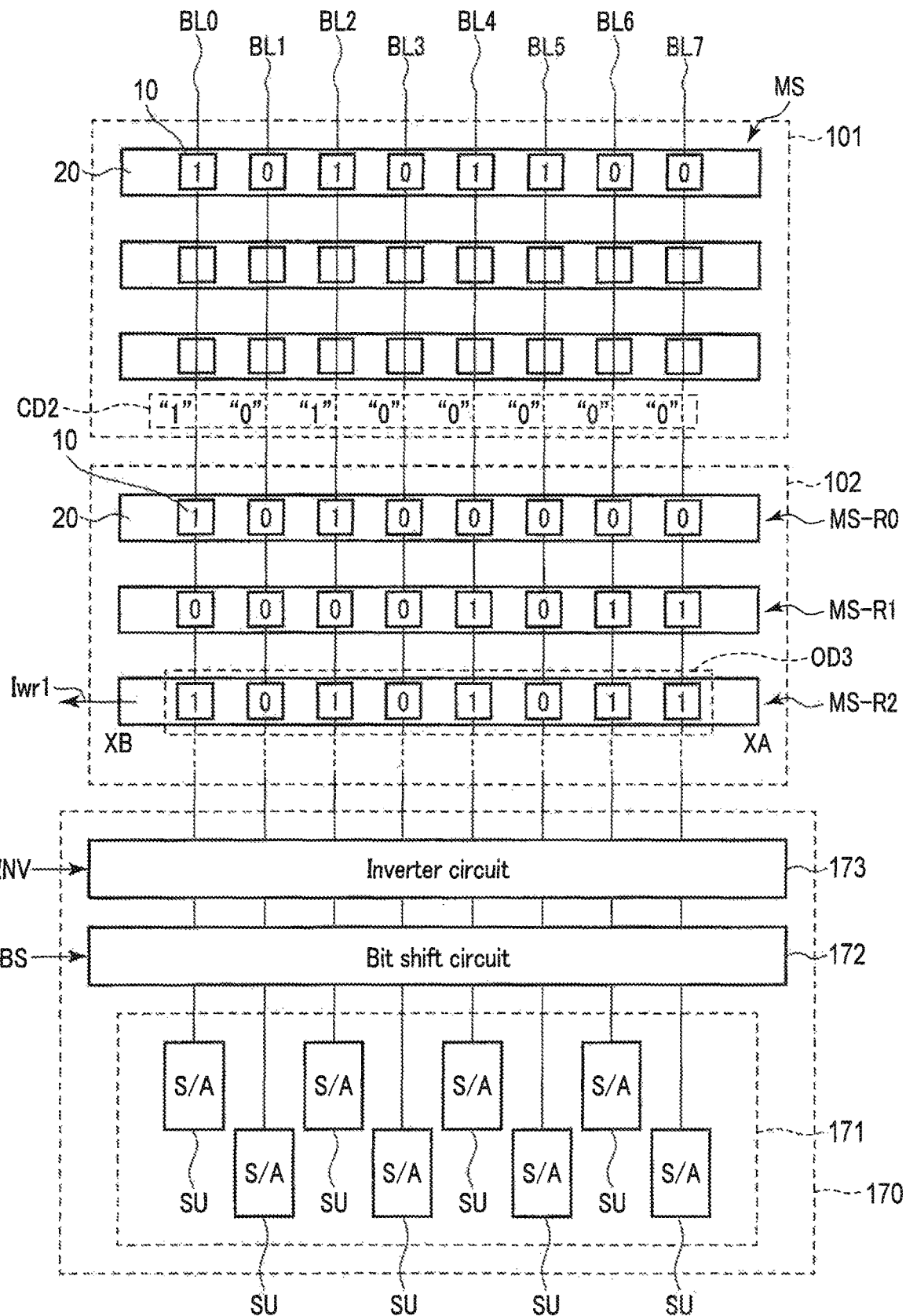

As shown in FIG. 37, for the OR operation using the carry data CD2 and the data in the cell string MS-R2, the "1" program current Iwr1 is supplied to the cell string MS-R2 in a state in which a voltage value corresponding to the carry data CD2 is applied to the bit lines BL.

Accordingly, a result (data) OD3 of the OR operation is stored in the cell string MS-R2. The data OD3 is "10101011".

Figure 38:
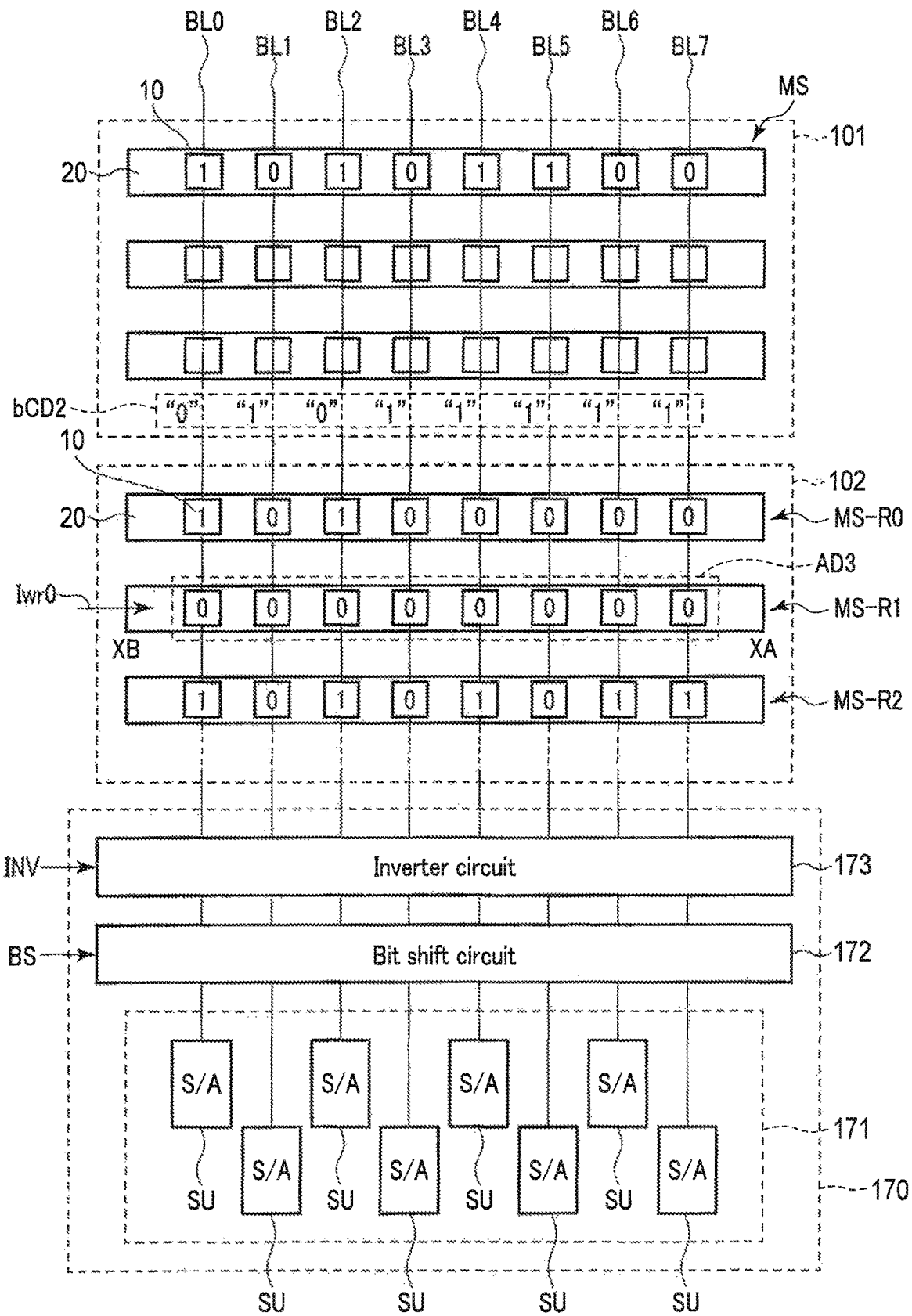

As shown in FIG. 38, for the AND operation using the carry data CD2 and the data XD2 in the cell string MS-R1, inverted data bCD2 of the carry data CD2 is generated by the inverter circuit 173. In a state in which a voltage value corresponding to the inverted data bCD2 is applied to the bit lines BL, the "0" program current Iwr0 is supplied to the cell string MS-R1.

Accordingly, a result (data) AD3 of the AND operation is stored in the cell string MS-R1. The data AD3 is "00000000".

Figure 39:
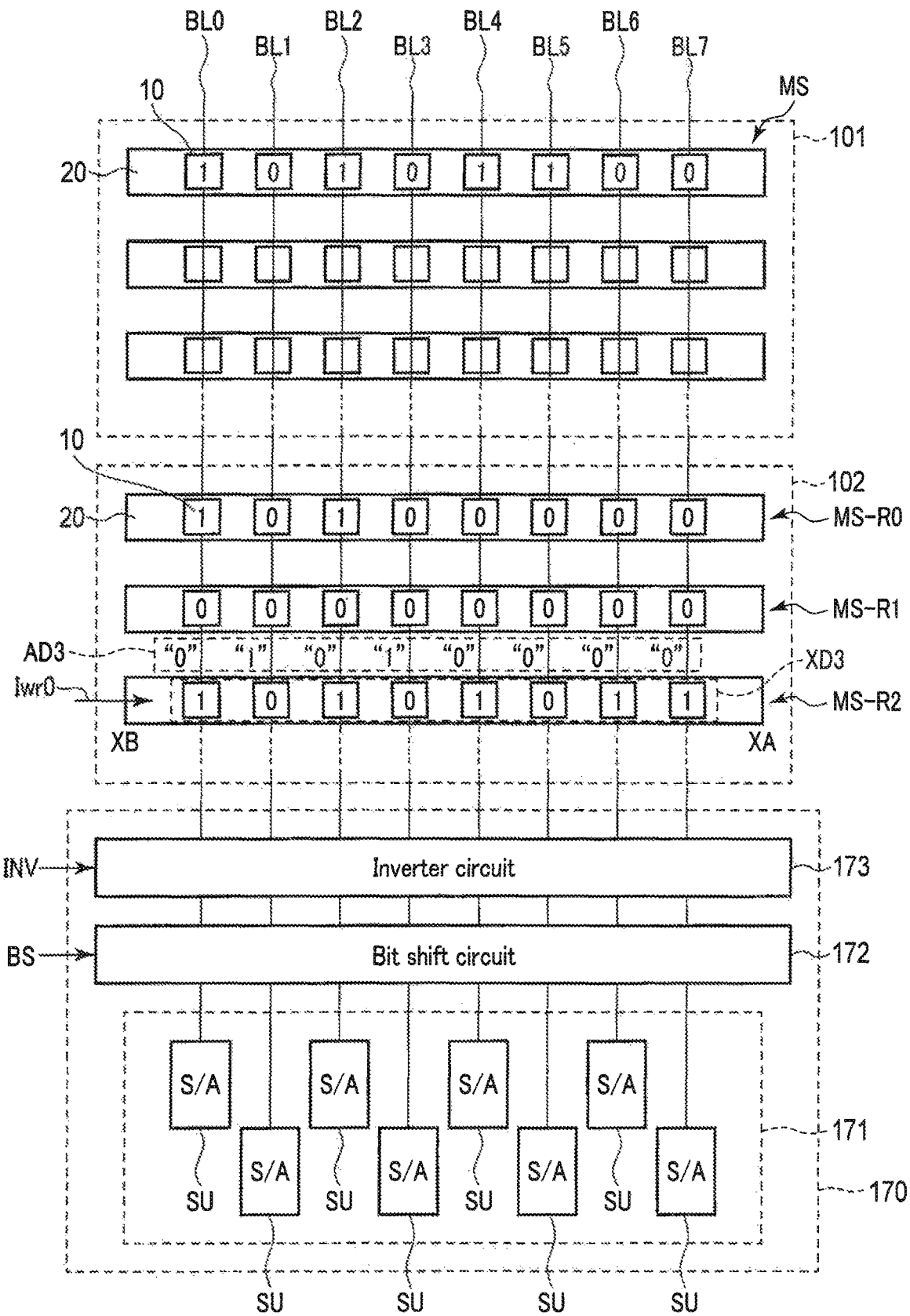

As shown in FIG. 39, the result of the XOR operation between the carry data CD2 and the data XD2 is obtained using the data AD3 and the data OD3.

As described above, the data AD3 is output to the bit lines BL.

In a state in which the potentials (the potentials of the control terminals 19 and the reference layers 12) of the bit lines BL are set to a value corresponding to the data AD3, the "0" program current Iwr0 is supplied to the cell string MS-R2.

Accordingly, the result of the XOR operation between the carry data CD2 and the data XD2 is held in the cell string MS-R2 as data XD3.

Figure 40:
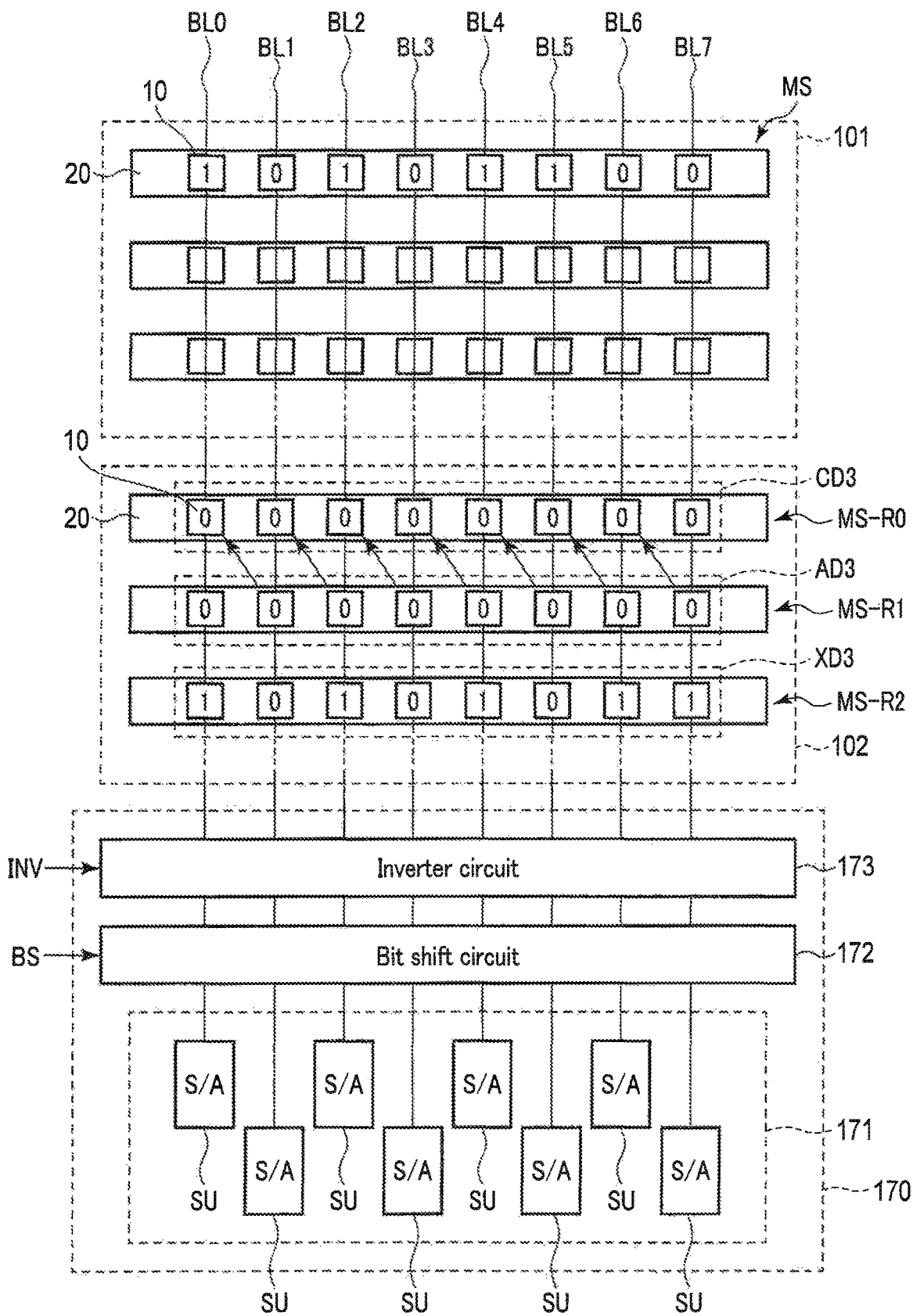

As shown in FIG. 40, each bit of the data AD3 is bit-shifted to the upper side by one digit by the bit shift circuit 172.

The bit-shifted data is stored in the cell string MS-R0 as carry data CD3.

Accordingly, the carry data in the cell string MS-R0 is updated. The carry data CD3 is "00000000".

<Fourth Cycle>

Figure 41:
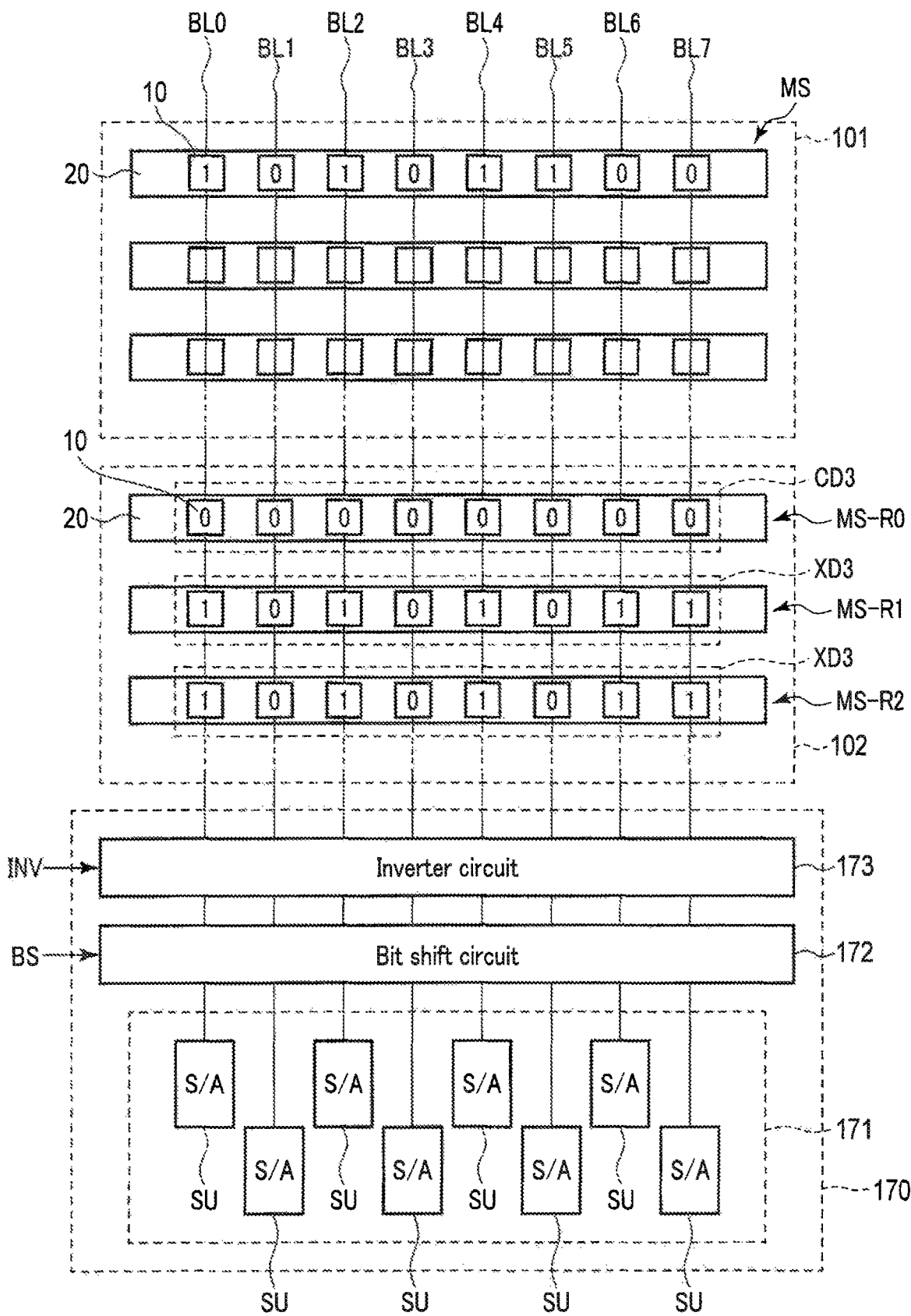

As shown in FIG. 41, after the data in the cell string MS-R1 is erased, the data XD3 in the cell string MS-R2 is copied to the cell string MS-R1.

Figure 42:
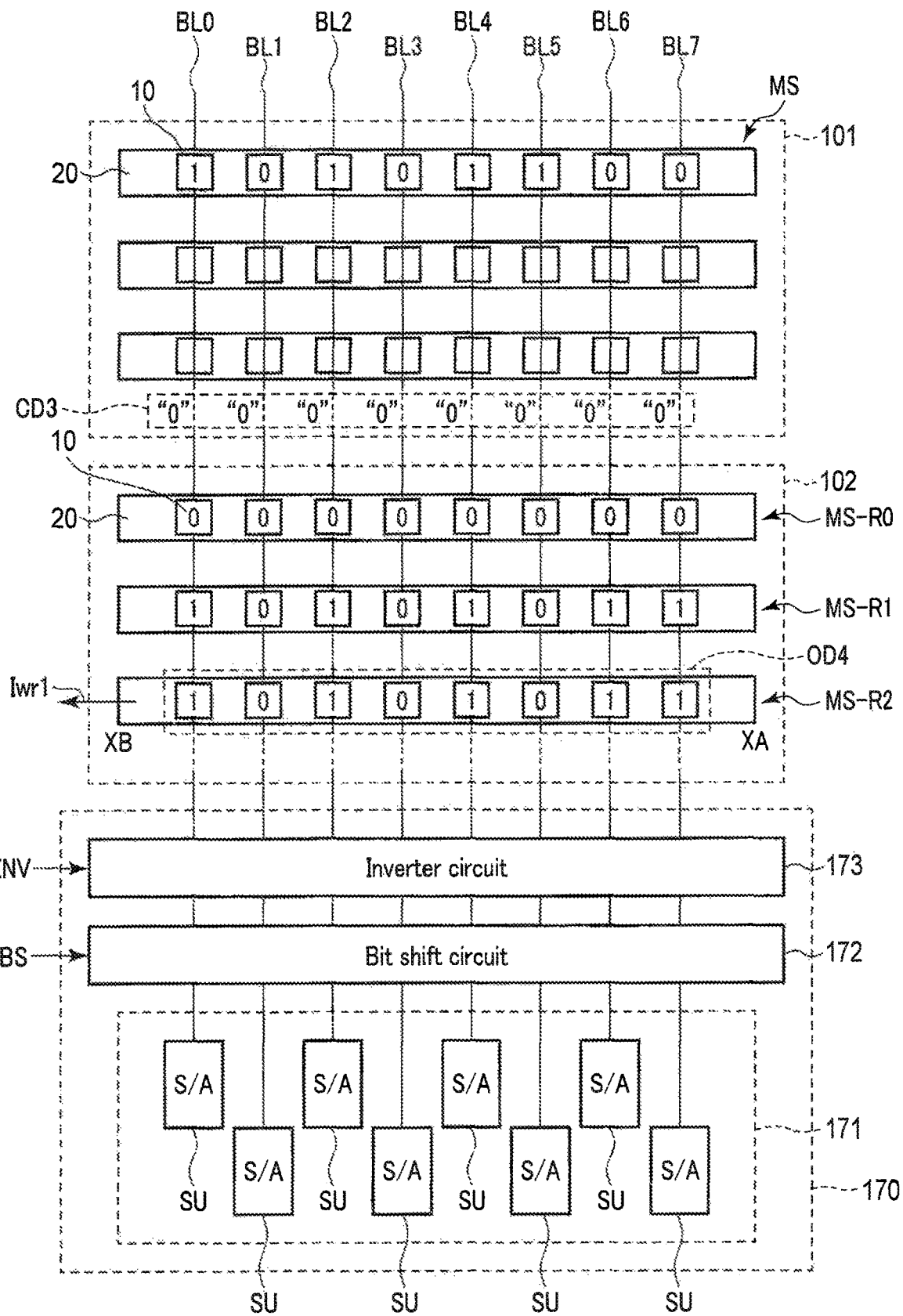

As shown in FIG. 42, the OR operation between the carry data CD3 and the data XD3 is executed. Here, since the carry data CD3 is "00000000", data OD4 corresponding to the result of the OR operation becomes "10101011" without any change in the value of each bit of the data XD3.

Figure 43:
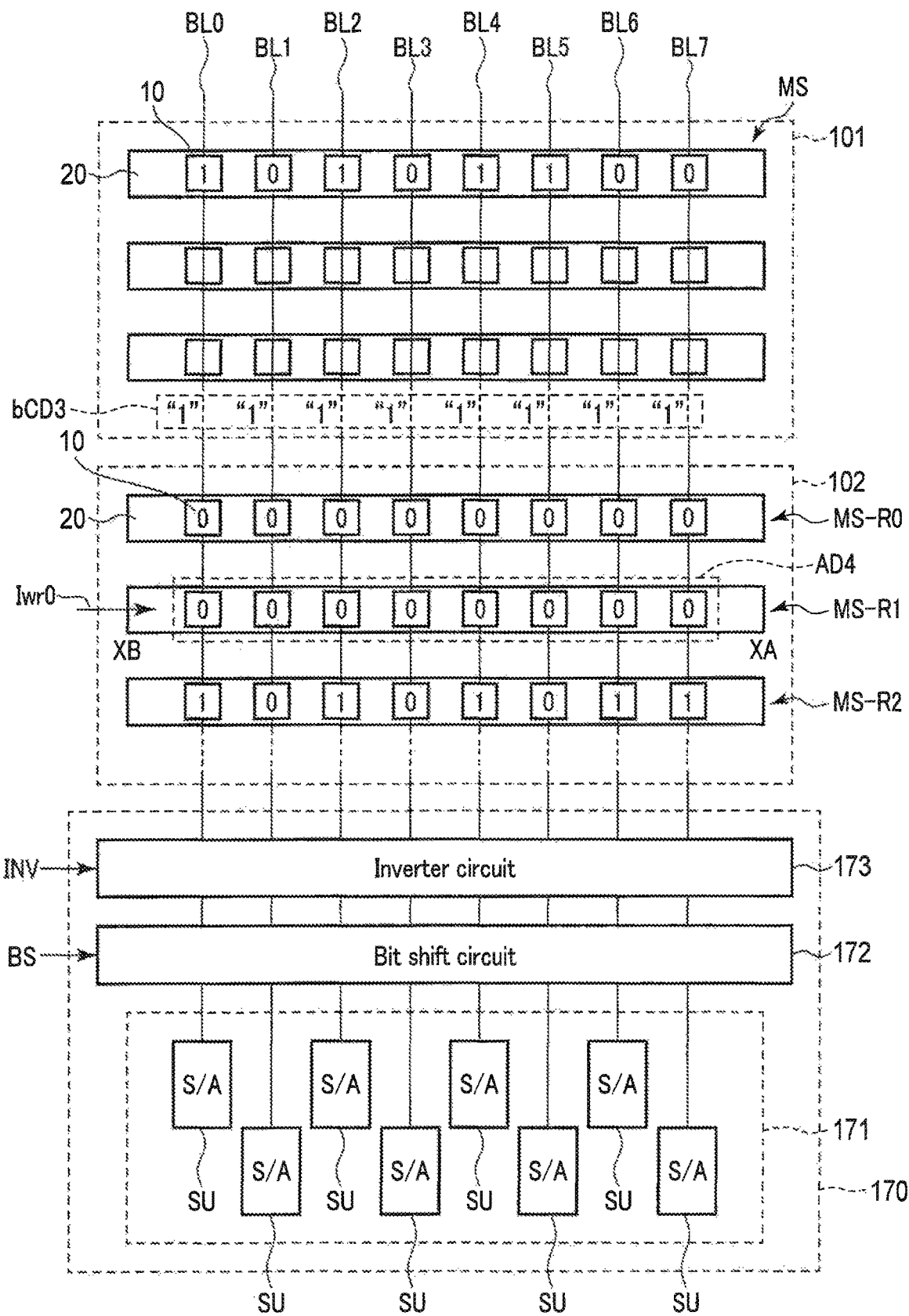

As shown in FIG. 43, the AND operation between the carry data CD3 and the data XD3 is executed. Here, since the carry data CD3 is "00000000", data AD4 corresponding to the result of the AND operation becomes "00000000".

As shown in FIG. 44, the XOR operation is executed using the data AD4 and the data OD4.

As described above, in a state in which the data AD4 of the cell string MS-R1 is output to the bit lines BL, the "0" program current Iwr0 is supplied to the cell string MS-R2.

Accordingly, the result of the XOR operation between the carry data CD3 and the data XD3 is held in the cell string MS-R2 as data XD4.

In this way, the result of the XOR operation between the carry data CD3 and the data XD3 is obtained.

The cell string MS-R2 holds the result of the XOR operation as the data XD4.

For example, the data XD4 corresponding to the result of the XOR operation remains "10101011" because the carry data CD3 is "00000000".

Each bit of the data AD4 held by the cell string MS-R1 is bit-shifted to the upper side by one digit by the bit shift circuit 172. Bit-shifted data (carry data) CD4 is stored in a cell string MS-R0.

The carry data CD4 is "00000000".

<Fifth to Eighth Cycles>

In the fifth cycle of the addition processing, an operation using the carry data CD4 "00000000" is executed, like the operation described with reference to FIGS. 41 to 44. In this case, each data of the calculation result in the fifth cycle is the same as the data of the calculation result in the fourth cycle.

Since the value of the carry data does not change, the data of each calculation result from the sixth cycle to the eighth cycle is also the same as the calculation result in the fourth and fifth cycles.

As described above, when the carry data is "00000000", the value of each digit of the 8-bit data does not change.

As the result of the above-described calculation processing in eight cycles, the result of addition processing of the "10101100" data MD and the "11111111" data ZD is 8-bit data represented by "10101011".

The control circuit 190 transmits the result of the addition processing to the controller 5. The result of the addition processing may be written to the cell string MS in the memory area 101.

Note that the data (the value of the digit of the ninth or subsequent bit) of a carry that has occurred in the most significant bit may be stored as an overflow value in a register circuit (not shown) or the cell array 100 in the magnetic device 1 independently of the data of the result of the addition processing. This can provide the data of the overflow vale to the controller 5.

As in this embodiment, in a case in which the values of all digits of the carry data CD are "0"s (here, "00000000"), the control circuit 190 (or controller 5) may detect that all the digits of the carry data are "0"s, thereby ending the addition processing.

In this case, the data XD in the cell string MS-R2 at the time when the carry data CD becomes "00000000" is determined as the result (here, 8-bit data) of the addition processing and transmitted to the controller 5.

As described above, the magnetic logic circuit as the magnetic device according to this embodiment can implement an addition circuit.

Note that the magnetic device according to this embodiment can implement a calculation circuit other than an addition circuit.

For example, the magnetic device according to this embodiment can provide a multiplication circuit. Multiplication processing can be executed by bit shift and addition processing of data.

When multiplying the memory data MD by the input data ZD, the memory data MD is multiplied by the value of "0" or "1" of each digit of the input data ZD. At this time, the memory data MD is shifted to the upper bit side in accordance with the digit of the value to be multiplied in the input data ZD. Accordingly, the multiplication result of each digit of the input data ZD and the memory data MD is obtained. The multiplication result of each digit is stored in, for example, the cell string MS in the calculation processing area 102.

Addition processing of these multiplication results (shifted data) is executed. Substantially as in the above-described addition processing, the multiplication results of the digits are added by output of data of the cell string MS to the bit lines and the supply of a current to the interconnect.

Accordingly, the multiplication result of the input data ZD and the memory data MD is stored in the cell string MS in the calculation processing area 102. The multiplication result of the input data ZD and the memory data MD is transmitted to the controller 5.

The magnetic device according to this embodiment can also implement a subtraction circuit and a division circuit, like the above-described addition circuit and multiplication circuit.

In the above-described way, the magnetic device according to this embodiment can implement a calculation circuit (logic operation circuit) that executes four arithmetic operations.

(6) CONCLUSION

The magnetic device according to this embodiment can implement a logic element and a calculation circuit using the logic element.

In a computer system using a general nonvolatile memory, at the time of execution of arithmetic processing, data in the memory device/storage device is transferred to the CPU (central processing unit) via the data bus, and the CPU performs calculation processing using the transferred data. The operation result is transferred from the CPU to the memory device and written back to the memory device/storage device.

In this case, the processing speed of the whole computer system using the general nonvolatile memory is limited not only by the access speed of the memory device/storage, device single body but also by the transfer speed of the data bus and the parallelism of the CPU.

For this reason, in the computer system using the general nonvolatile memory, when a large-scale data operation is executed, the time of calculation processing may dramatically increase. Additionally, in the computer system using the general nonvolatile memory, power consumption that occurs in the data bus may increase.

In the magnetic device according to this embodiment, the logic element and the calculation circuit can be arranged on the same semiconductor substrate (semiconductor chip) as the memory circuit. This allows the magnetic device according to this embodiment to execute, in the same chip as one memory circuit, calculation processing using the data stored in the memory circuit.

For this, reason, the magnetic device according to this embodiment can shorten the time of data transfer in the computer system as compared to a device that execute data transfer via a data bus between a calculation circuit (CPU chip) and a memory circuit (memory chip), which use semiconductor chips different from each other.

The magnetic device according to this embodiment can execute parallel processing of calculation according to the number of cell strings/cells in the calculation processing area.

This allows the magnetic device according to this embodiment to improve the calculation processing capability and calculation speed of the computer system.

As a result, the magnetic device according to this embodiment can shorten the entire time for calculation processing.

The magnetic device according to this embodiment can reduce data transfer via the data bus in the computer system. As a result, the magnetic device according to this embodiment can suppress an increase in power consumption derived from data transfer in the computer system.

As described above, the magnetic device according to this embodiment can provide a magnetic device capable of executing calculation processing using a magnetoresistive effect element in the device.

[Modifications]

Modifications of the magnetic device according to the embodiment will be described with reference to FIGS. 45, 46, 47, and 48.

(1) First Modification

An example of the modification of the magnetic device according to the embodiment will be described with reference to FIG. 45.

FIG. 45 is a schematic view for explaining the modification of the magnetic device according to the embodiment.

As shown in FIG. 45, a plurality of cell arrays 100-1 and 100-N and a plurality of calculation control circuits 170-1 and 170-N may be provided in one magnetic device 1. In this case, the magnetic device 1 includes a majority decision processing circuit 99.

For example, the plurality of calculation control circuits 170-1 and 170-N execute the same calculation processing using the calculation processing areas 102 of the corresponding cell arrays 100-1 and 100-N.

A plurality of obtained calculation results (solutions) are supplied to the majority decision processing circuit 99.

The majority decision processing circuit 99 compares the plurality of calculation results and determines the results that are larger in number.

The majority decision processing circuit 99 decides, as the solution of the executed calculation processing, the results that are the largest in number in the plurality of calculation results based on the result of the majority decision processing and outputs the results.

Note that if all the plurality of calculation results match, the majority decision processing circuit 99 outputs the calculation results that match as the solution of the executed calculation processing.

In this way, in this embodiment, the same calculation processing and majority decision processing are executed, thereby reducing errors in the calculation processing.

Additionally, the magnetic device according to this embodiment can implement multiplexing of the systems of, the calculation processing while suppressing complication of the circuits.

Note that in this embodiment, the plurality of calculation control circuits 170-1 and 170-N may commonly be connected to one cell array 100. In addition, a plurality of the magnetic device according to this embodiment may execute the same calculation processing, and the solution of the calculation processing may be decided based on the majority decision processing.

As described above, the magnetic device according to this modification can improve the reliability of calculation processing.

(2) Second Modification

Another example of the modification of the magnetic device according to the embodiment will be described with reference to FIGS. 46 and 47.

Figure 46:
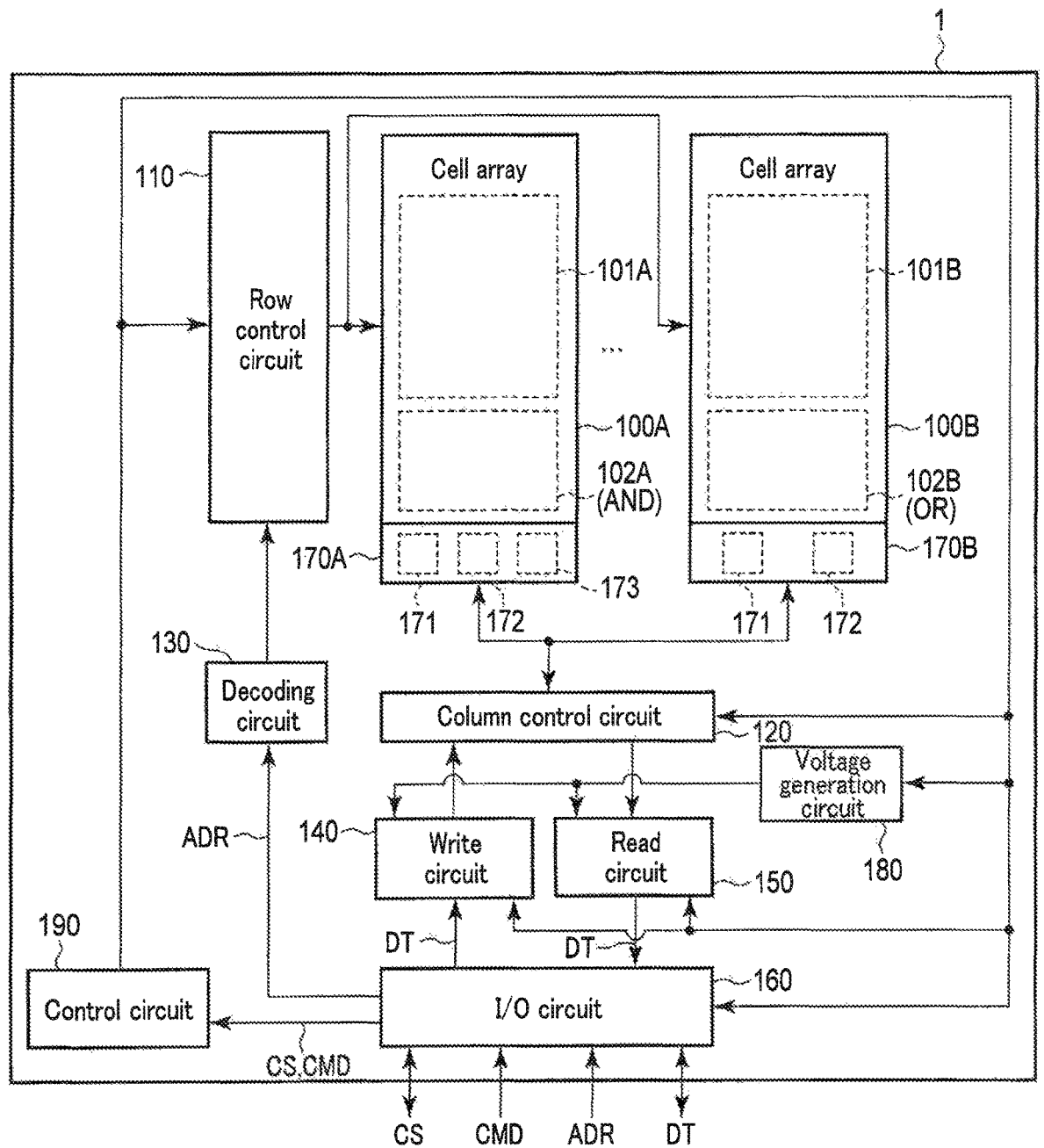

FIGS. 46 and 47 are schematic views for explaining the modification of the magnetic device according to the embodiment.

In the magnetic device according to this embodiment, the cell string (cell array) used to calculate the AND operation and the cell string (cell array) used to calculate the OR operation may be divided into different areas.

As shown in FIG. 46, a first cell array 100A includes an area 102A used to calculate an AND operation. A second cell array 100B includes an area 102B used to calculate an OR operation. For example, a memory area 101A in the cell array 100A stores the same data as in a memory area 101B in the cell array 100B. However, the data in the memory area 101A may be different from the data in the memory area 101B.

A calculation control circuit 170A executes the AND operation using one or more cell strings in the area 102A. The calculation control circuit 170A includes the inverter circuit 173.

A calculation control circuit 170B executes the OR operation using one or more cell strings in the area 102B.

The calculation control circuit 170B does not include an inverter circuit.

Each of the calculation control circuits 170A and 170B include the sense amplifier circuit 171 and the bit shift circuit 172.

As in this modification, in the magnetic device according to this embodiment, the AND operation and the OR operation using the VoCSM (MTJ element) may be executed in the different cell arrays 100A and 100B.

As shown in FIG. 47, the plurality of calculation control circuits 170A and 170B having different internal configurations may be connected to the calculation processing area 102 in one cell array 100 via a switch circuit 179.

The switch circuit 179 is arranged between the cell array 100 and the calculation control circuits 170A and 170B. A control signal SW is supplied to the switch circuit 179. Based on the control signal SW, the switch circuit 179 electrically connects one of the two calculation control circuits 170A and 170B to the cell array 100. As in the example shown in FIG. 46, the calculation control circuit 170A used to execute the AND operation includes the inverter circuit 173, and the calculation control circuit 170B used to execute the OR operation does not include an inverter circuit.

For example, the control signal SW is supplied to the column control circuit 120. Based on the control signal SW, the column control circuit 120 is electrically connected to one of the two calculation control circuits 170A and 170B.

As in this modification, in the magnetic device according to this embodiment, the AND operation and the OR operation using the VoCSM (MTJ element) may be executed using the plurality of calculation control circuits 170A and 170B for one cell array 100.

As described above, the magnetic device shown in each of the examples of FIGS. 46 and 47 includes a signal path including the inverter circuit 173 and a signal path that does not include an inverter circuit between the cell array 100 including the calculation processing area 102 (102A and 102B) and another circuit (peripheral circuit).

Note that in the magnetic device according to this embodiment, one cell array 100 may include the area 102A for the AND operation and the area 102B for the OR operation.

Additionally, in the magnetic device according to this embodiment, the cell array 100 dedicated to data storage and the cell array 100 dedicated to the logic operation may be separated from each other.

(3) Third Modification

Still another example of the modification of the magnetic device according to the embodiment will be described with reference to FIG. 48.

Figure 48:
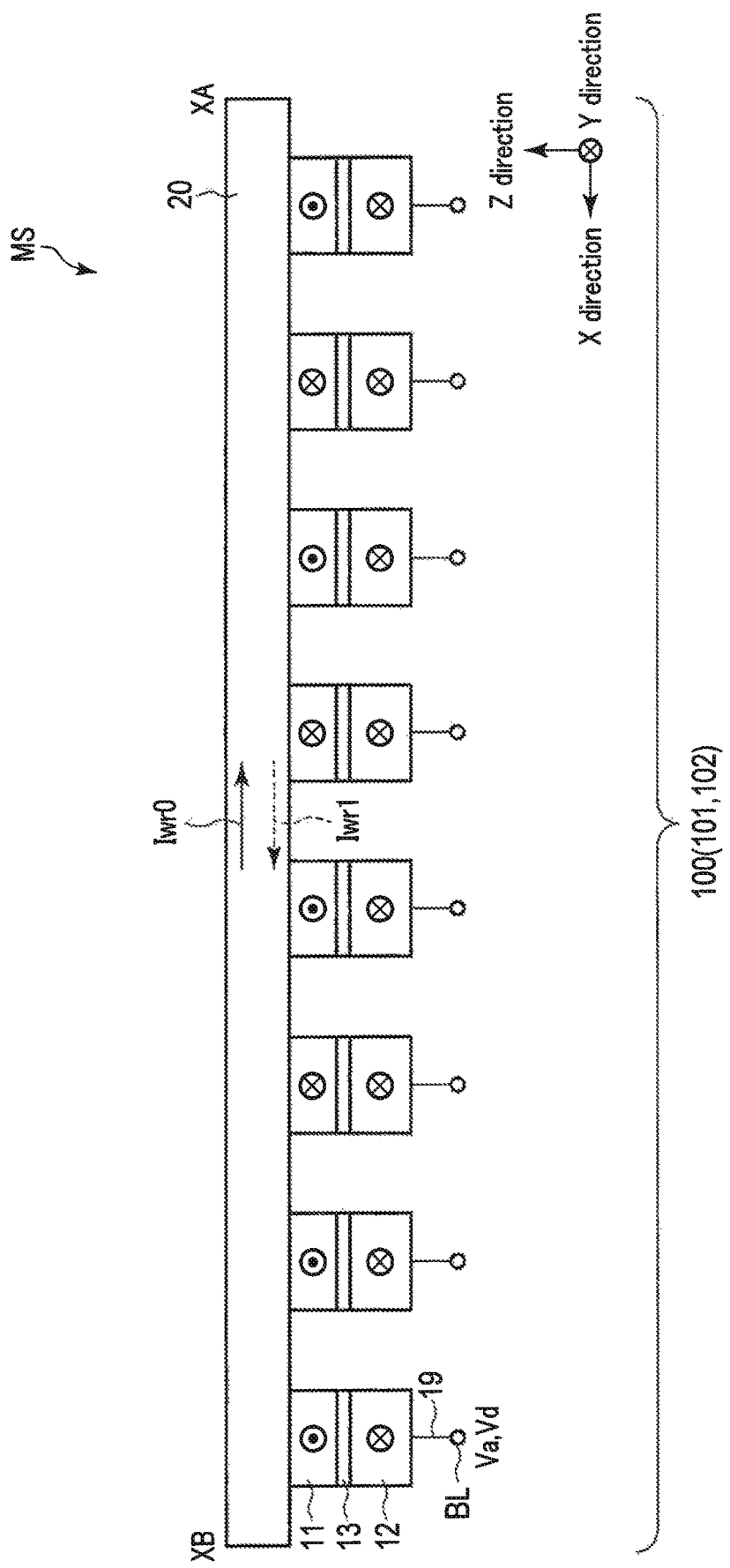

FIG. 48 is a schematic view for explaining the modification of the magnetic device according to the embodiment.

As shown in FIG. 48, the conductive layer (spin-orbit interaction layer) 20 may be arranged above the plurality of bit lines BL in the Z direction. In this case, the storage layer 11 is arranged above the reference layer 12 in the Z direction.

As in this modification, in the cell string MS, even if the MTJ elements 10 are arranged under the conductive layer 20, the magnetic device according to this embodiment can execute the above-described various kinds of calculation processing.

OTHER EMBODIMENTS

In the magnetic device according to this embodiment, an in-plane magnetization type MTJ element is used as the magnetoresistive effect element. However, a perpendicular magnetization type MTJ element may be used as the memory element of the magnetic device according to this embodiment. In the perpendicular magnetization type MTJ element, the magnetizations of the magnetic layers (the storage layer and the reference layer) face in the vertical direction with respect to the layer surfaces of the magnetic layer. In the perpendicular magnetization type MTJ element, the magnetization directions of the magnetic layers are substantially parallel to the stacking direction of the storage layer and the reference layer.

A magnetic device according to above-described embodiment includes: a first conductive layer; a second conductive layer; a first magnetoresistive effect element disposed on the first conductive layer and including a first control terminal; a second magnetoresistive effect element disposed on the second conductive layer and including a second control terminal; and a first circuit configured to supply one of a first current in a first direction and a second current in a second direction opposite to the first direction and control a potential of the first control terminal and a potential of the second control terminal, wherein the first circuit writes first data to the first magnetoresistive effect element and the second magnetoresistive effect element, the first circuit sets the potential of the first control terminal to a value corresponding to second data and supplies the first current to the first conductive layer, and the first magnetoresistive effect element holds a first value corresponding to a logical disjunction between the first data and the second data, the first circuit sets the potential of the second control terminal to a value corresponding to inverted data of the second data and supplies the second current to the second conductive layer, and the second magnetoresistive effect element holds second value corresponding to a logical conjunction between the first data and the second data, and the first circuit sets the potential of the first control terminal to the second value and supplies the second current to the first conductive layer, and the first magnetoresistive effect element holds a third value corresponding to an exclusive logical disjunction between the first data and the second data.

In the magnetic device according to above-described embodiment, wherein the third value represents an addition result between the first data and the second data.

In the magnetic device according to above-described embodiment, wherein the second value represents presence/absence of a carry in a digit of the third value in the addition result.

In the magnetic device according to above-described embodiment, the device further includes: a third conductive layer; a third magnetoresistive effect element disposed on the third conductive layer and including a third control terminal; and a first interconnect connected to the first control terminal, the second control terminal, and the third control terminal, wherein the first circuit outputs third data held by the third magnetoresistive effect element to the first interconnect, and supplies one of the first current and the second current to the first conductive layer and the second conductive layer and writes the first data corresponding to the third data to the first magnetoresistive effect element and the second magnetoresistive effect element.

In the magnetic device according to above-described embodiment, wherein the second data is data from outside of the first magnetoresistive effect element and the second magnetoresistive effect element.

In the magnetic device according to above-described embodiment, wherein the first magnetoresistive effect element includes: a first magnetic layer connected to the first control terminal and having a fixed magnetization; a second magnetic layer disposed between the first Conductive layer and the first magnetic layer and having a variable magnetization; and a nonmagnetic layer disposed between the first magnetic layer and the second magnetic layer.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic device comprising:
   a magnetoresistive effect element including a first conductive layer including a first terminal and a second terminal, a first magnetic layer having a fixed magnetization, a second magnetic layer disposed between the first conductive layer and the first magnetic layer and having a variable direction of magnetization, a nonmagnetic layer disposed between the first magnetic layer and the second magnetic layer, and a control terminal connected to the first magnetic layer;
   an inverter circuit connected to the control terminal; and
   a first circuit configured to supply a first current in a first direction into the first conductive layer and apply a control voltage to the control terminal of the magnetoresistive effect element,
   wherein in a first case in which the first current is supplied to the first conductive layer, the magnetoresistive effect element obtains a first value corresponding to a result of a logical conjunction between a second value of first data in the magnetoresistive effect element and a negative logic of a third value of the control voltage, the third value of control voltage corresponding to a negative logic of second data, the inverter outputting the negative logic of the second data to the control terminal.

2. The device of claim 1, further comprising:
   a first path including the inverter circuit;
   a second path that does not include an inverter circuit; and
   a switch circuit configured to switch between the first path and the second path.

3. The device of claim 1, wherein the first circuit supplies a second current in a second direction opposite to the first direction into the first conductive layer, and
   in a second case in which the second current is supplied to the first conductive layer, the magnetoresistive effect element obtains a fourth value corresponding to a result of a logical disjunction between the second value of the first data and a fourth value of the control voltage corresponding to the second data, the control voltage applied to the control terminal without the inverter circuit.

* * * * *